(12) United States Patent
Nakai

(10) Patent No.: US 8,878,078 B2
(45) Date of Patent: Nov. 4, 2014

(54) PRINTED WIRING BOARD

(75) Inventor: Toru Nakai, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/213,240

(22) Filed: Aug. 19, 2011

(65) Prior Publication Data

US 2012/0067628 A1    Mar. 22, 2012

Related U.S. Application Data

(60) Continuation of application No. 12/261,517, filed on Oct. 30, 2008, now Pat. No. 8,013,256, which is a division of application No. 11/200,077, filed on Aug. 10, 2005, now Pat. No. 7,449,781, which is a division of application No. 10/432,640, filed as application No. PCT/JP02/10144 on Sep. 30, 2002, now Pat. No. 7,129,158.

(30) Foreign Application Priority Data

Sep. 28, 2001 (JP) .................................. 2001/299668
Sep. 28, 2001 (JP) .................................. 2001/299669
Sep. 28, 2001 (JP) .................................. 2001/299670

(51) Int. Cl.
  *H05K 1/11*        (2006.01)
(52) U.S. Cl.
  CPC .................................... *H05K 1/115* (2013.01)
  USPC .......................................... 174/267; 29/842
(58) Field of Classification Search
  CPC ............................ H05K 1/115; H05K 1/116

USPC .............. 174/267; 29/842–845; 361/772–776
See application file for complete search history.

(56) References Cited

U.S. PATENT DOCUMENTS

| | | | |
|---|---|---|---|
| 4,458,294 A * | 7/1984 | Womack | 361/321.3 |
| 5,221,038 A | 6/1993 | Melton et al. | |
| 5,656,139 A | 8/1997 | Carey et al. | |
| 5,684,677 A * | 11/1997 | Uchida et al. | 361/770 |
| 5,841,190 A | 11/1998 | Noda et al. | |
| 5,846,606 A | 12/1998 | Wessling | |
| 6,086,946 A | 7/2000 | Ballard et al. | |
| 6,172,424 B1 | 1/2001 | Kinouchi et al. | |

(Continued)

FOREIGN PATENT DOCUMENTS

| | | |
|---|---|---|
| EP | 0 697 805 A1 | 2/1996 |
| EP | 0 993 034 A2 | 4/2000 |

(Continued)

OTHER PUBLICATIONS

Patent Abstracts of Japan, JP 05-73737, Mar. 26, 1993.

(Continued)

*Primary Examiner* — Jeremy C Norris
(74) *Attorney, Agent, or Firm* — Oblon, Spivak, McClelland, Maier & Neustadt, L.L.P.

(57) ABSTRACT

A printed wiring board including solder pads excellent in frequency characteristic is provided. To do so, each solder pad 73 is formed by providing a single tin layer 74 on a conductor circuit 158 or a via 160. Therefore, a signal propagation rate can be increased, as compared with a printed wiring board of the prior art on which two metal layers are formed. In addition, due to lack of nickel layers, manufacturing cost can be decreased and electric characteristics can be enhanced.

14 Claims, 36 Drawing Sheets

(56) References Cited

U.S. PATENT DOCUMENTS

| | | | |
|---|---|---|---|
| 6,232,650 B1 | 5/2001 | Fujisawa et al. | |
| 6,248,428 B1 | 6/2001 | Asai et al. | |
| 6,376,782 B1 * | 4/2002 | Kimura et al. | 174/267 |
| 6,411,519 B2 * | 6/2002 | Asai et al. | 361/794 |
| 6,548,765 B2 * | 4/2003 | Kondo et al. | 174/260 |
| 6,642,136 B1 | 11/2003 | Lee et al. | |
| 6,733,823 B2 | 5/2004 | Lee et al. | |
| 2004/0025333 A1 | 2/2004 | Hirose et al. | |

FOREIGN PATENT DOCUMENTS

| | | |
|---|---|---|
| EP | 1 102 523 A1 | 5/2001 |
| EP | 1 162 867 A1 | 12/2001 |
| JP | 58-112392 | 7/1983 |
| JP | 3-200343 | 9/1991 |
| JP | 7-10028 | 2/1995 |
| JP | 8-172273 | 7/1996 |
| JP | 9-130050 | 5/1997 |
| JP | 10-163357 | 6/1998 |
| JP | 11-17321 | 1/1999 |
| JP | 2000-183532 | 6/2000 |
| JP | 2000-188461 | 7/2000 |
| JP | 2000-200801 | 7/2000 |
| JP | 2000-353775 | 12/2000 |
| JP | 2001-53448 | 2/2001 |
| WO | WO 96/17974 | 6/1996 |
| WO | WO 00/03570 A1 | 1/2000 |
| WO | WO 01/31984 A1 | 5/2001 |

OTHER PUBLICATIONS

Patent Abstracts of Japan, JP 01-011980, Jan. 17, 1989.
[Online], "Properties of Platinum Group Metals", Dec. 10, 2000, URL:http://www.web.archive.org/web/20001210051900/http://www.platinum.matthey.com/application/properties.html>.
Gold Properties/Guidelines, Precious Metals Plating Company, Santa Ana, CA, Jul. 22, 2008.
"Functional Plating—Applications for 16 Deposits," pp. 28-29, Plating & Surface Finishing, Oct. 2002.
Military Specification—Gold Plating, Electrodeposited, MIL-G-45204C, Mar. 27, 1969, BNSDOCID XP 9167544A.

* cited by examiner

Fig. 4
(A)
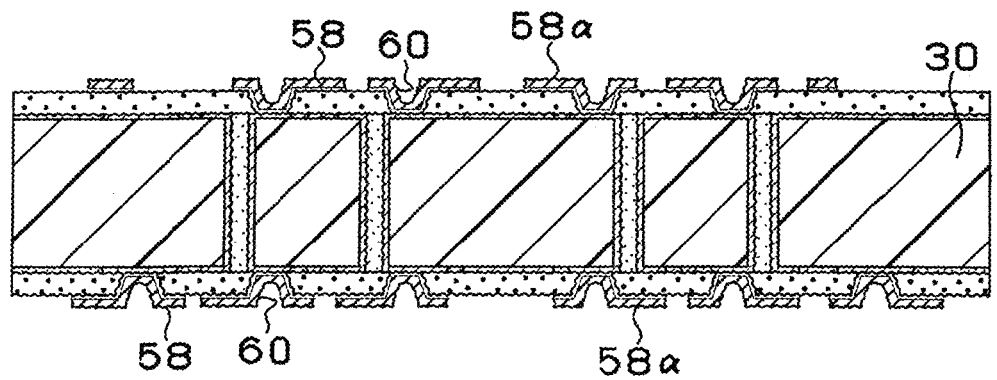
(B)
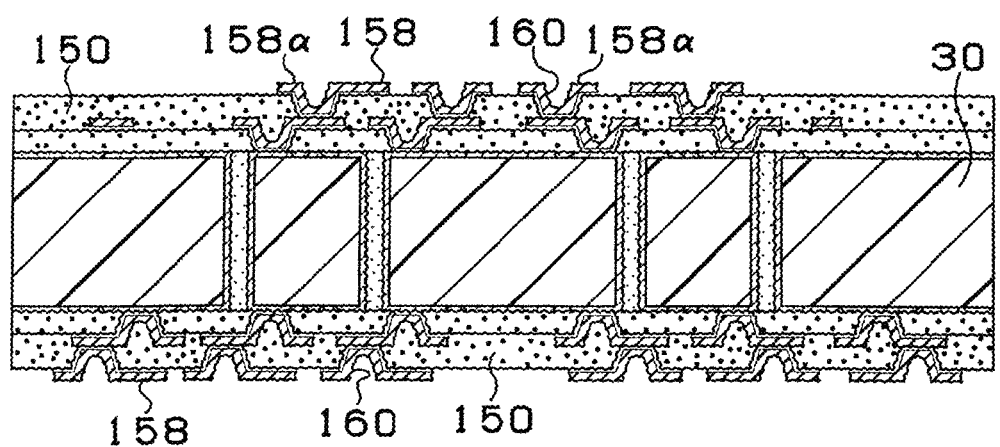
(C)
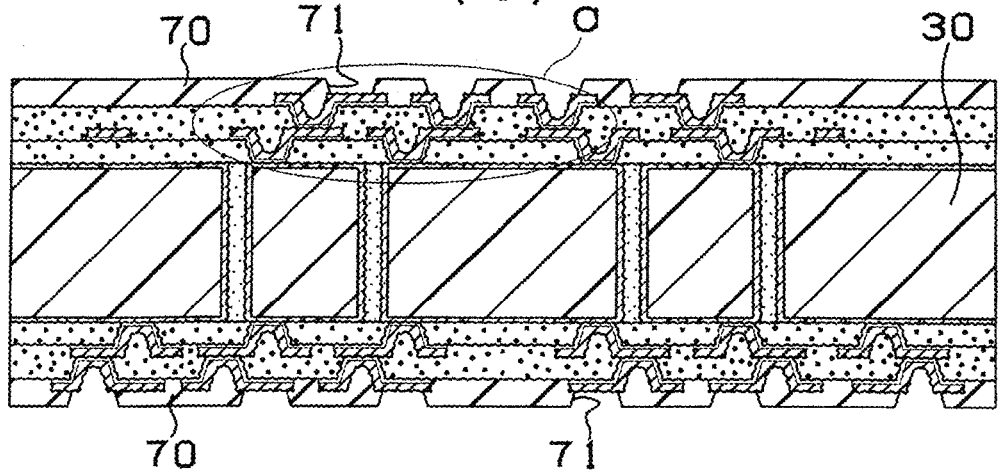

Fig.5
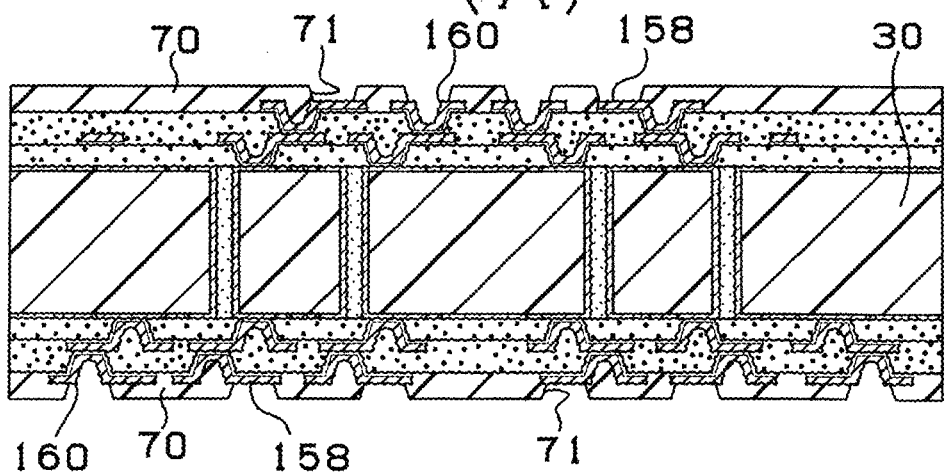
(A)
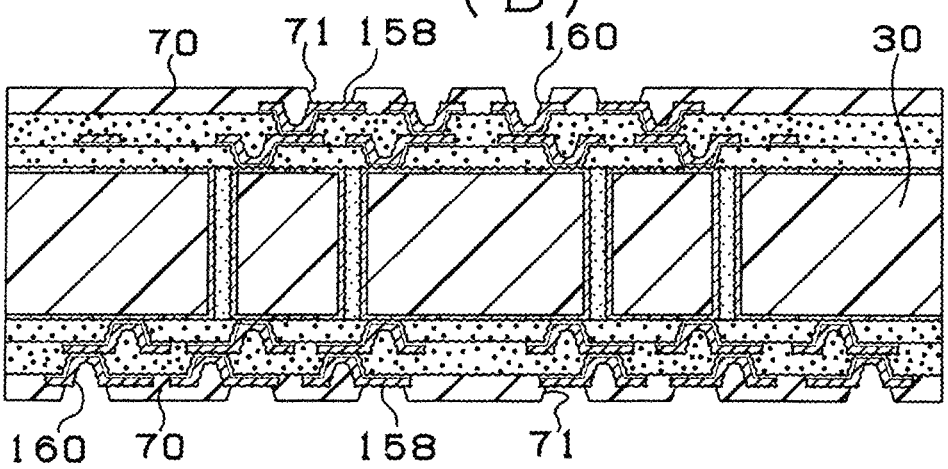
(B)
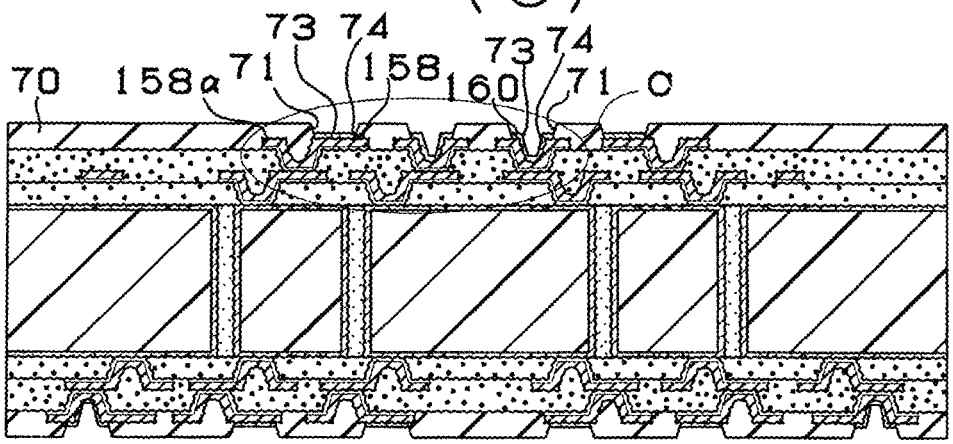
(C)

Fig. 8
(A)
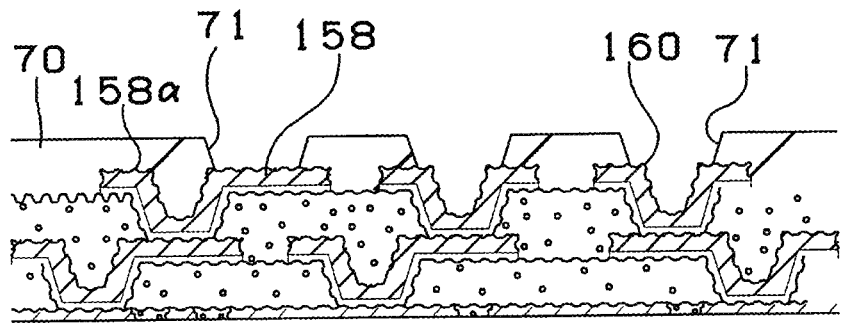
(B)
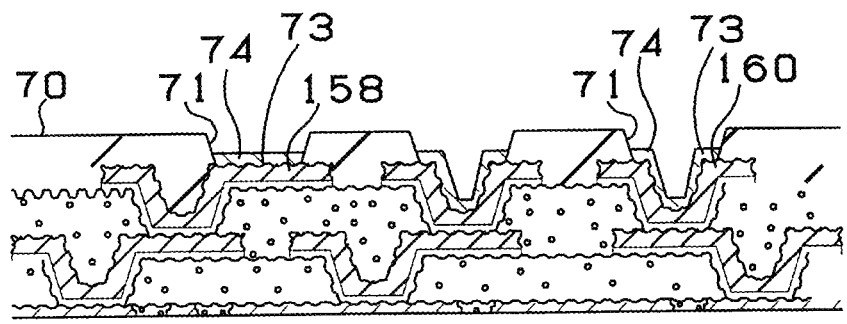
(C)
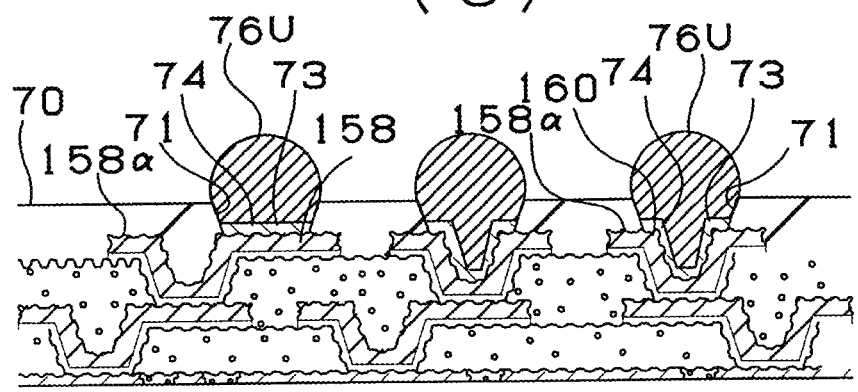

Fig.13
(A)
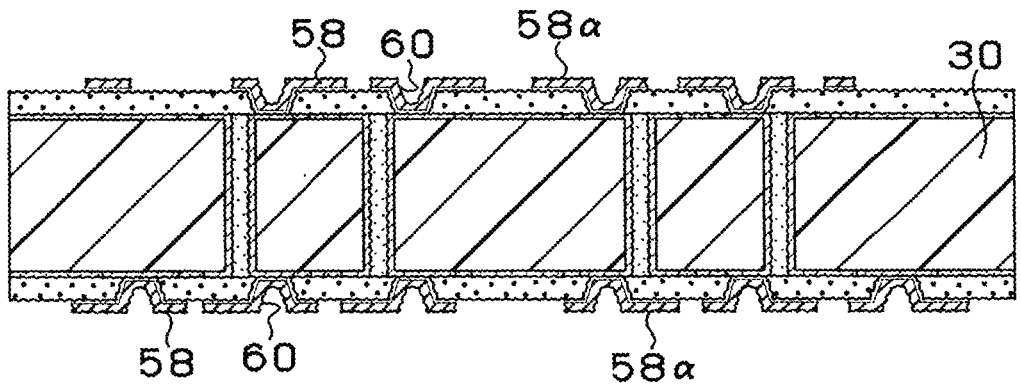
(B)
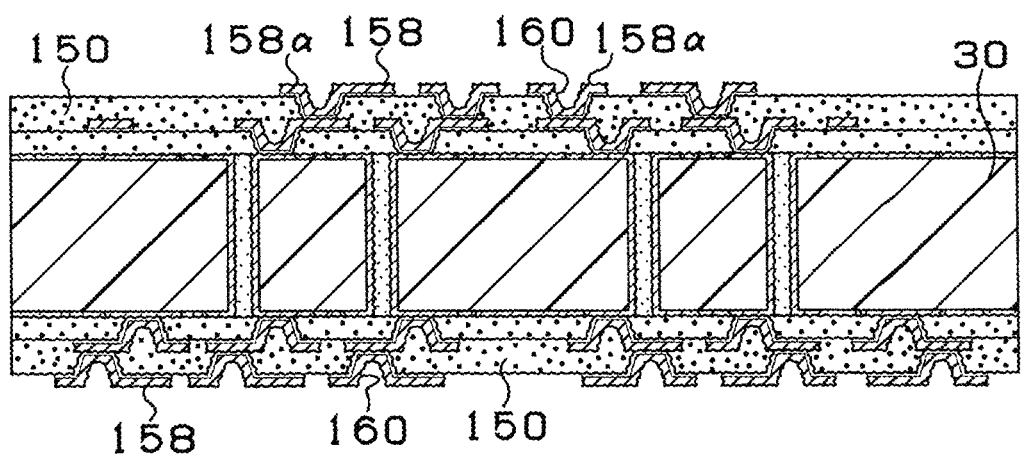
(C)
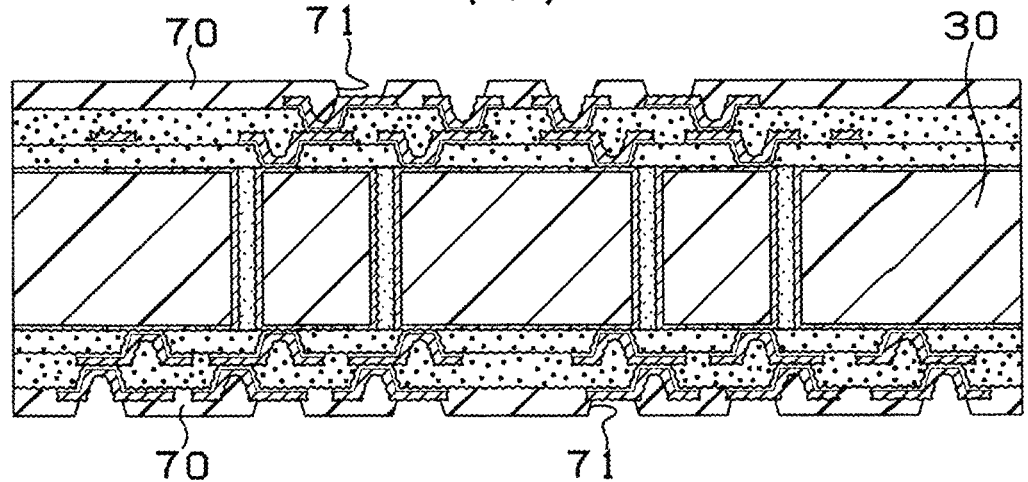

Fig.14
(A)
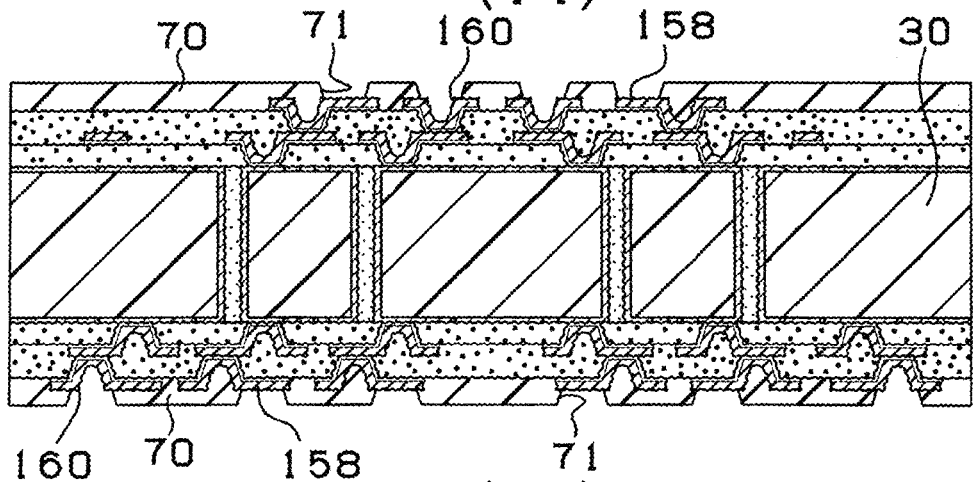
(B)
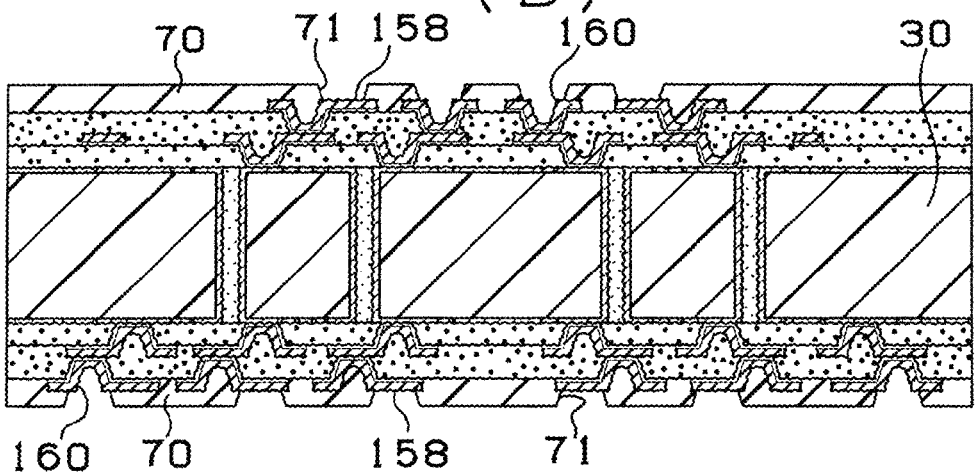
(C)
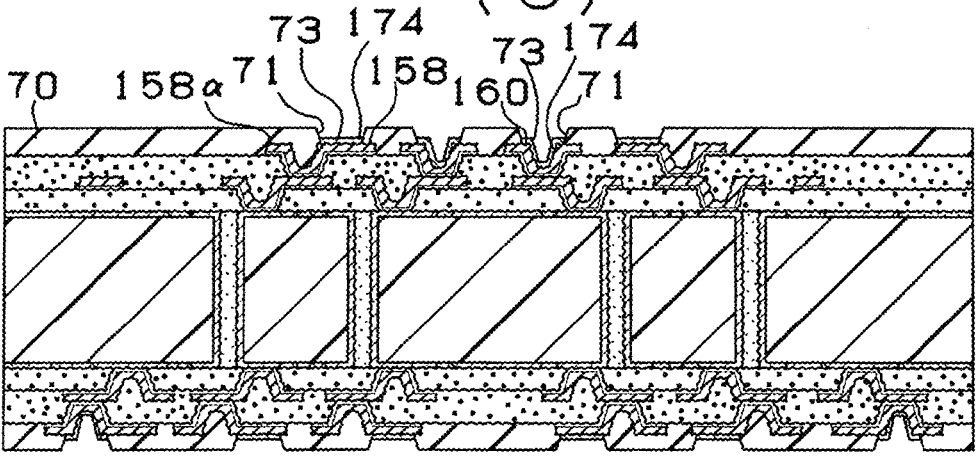

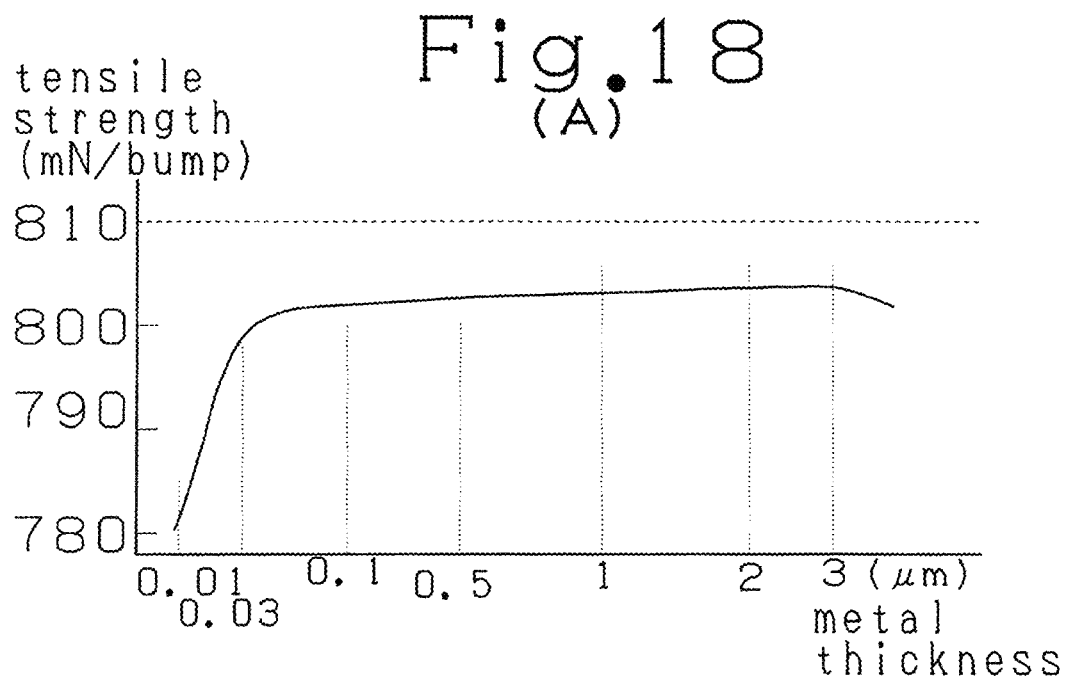
Fig.18
(A)
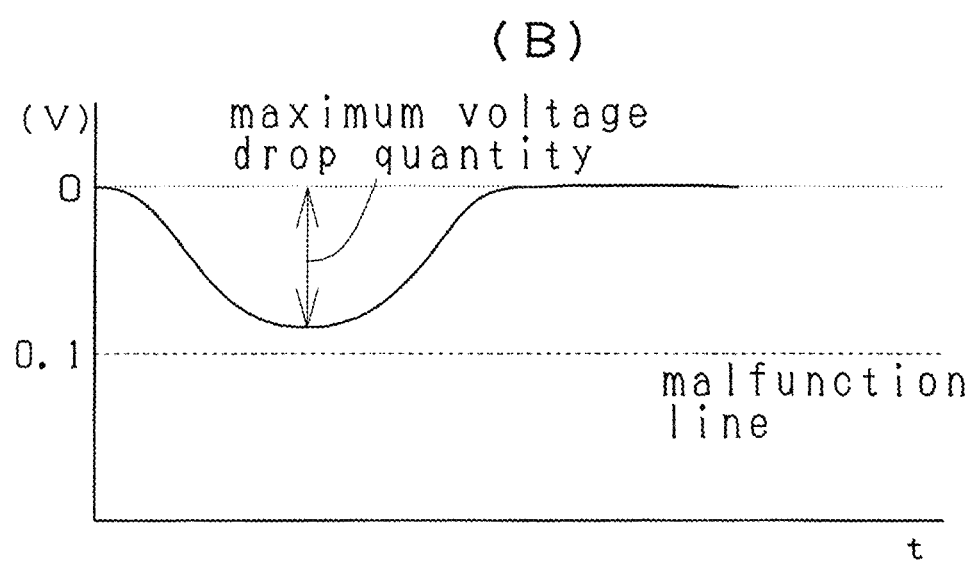
(B)

Fig.19

| Item | Metal Layer Thickness (μm) | Solder Composition | Tensile Strength[ mN/bump] | | Operation Test | Voltage Drop Quantity (V) Note 2 |
|---|---|---|---|---|---|---|
| | | | Before Reliability Test | After Reliability Test | | |
| First Embodiment | 0.04 | Sn:Pb=63:37 | 795 | 771 | ○ | 0.087 |
| | 0.03 | Sn:Sb=95:5 | 802 | 783 | ○ | 0.090 |
| | 0.05 | Sn:Ag=96.5:3.5 | 788 | 773 | ○ | 0.088 |
| | 0.03 | Sn:Ag:Cu=95.8:3.5:0.7 | 810 | 796 | ○ | 0.086 |
| | 0.05 | Sn:Cu=99.3:0.7 | 799 | 778 | ○ | 0.084 |
| First Modification | 0.03 | Sn:Pb=63:37 | 800 | 784 | ○ | 0.086 |
| | 0.04 | Sn:Sb=95:5 | 803 | 789 | ○ | 0.088 |
| | 0.05 | Sn:Ag=96.5:3.5 | 794 | 778 | ○ | 0.088 |
| | 0.03 | Sn:Ag:Cu=95.8:3.5:0.7 | 804 | 782 | ○ | 0.087 |
| | 0.04 | Sn:Cu=99.3:0.7 | 808 | 785 | ○ | 0.085 |
| Second Modification | 0.10 | Sn:Pb=63:37 | 801 | 779 | ○ | 0.089 |
| | 0.09 | Sn:Sb=95:5 | 803 | 783 | ○ | 0.090 |
| | 0.07 | Sn:Ag=96.5:3.5 | 801 | 780 | ○ | 0.089 |
| | 0.11 | Sn:Ag:Cu=95.8:3.5:0.7 | 799 | 779 | ○ | 0.089 |
| | 0.08 | Sn:Cu=99.3:0.7 | 803 | 782 | ○ | 0.086 |
| First Comparison | Ni:5 Au:0.03 | Sn:Pb=63:37 | 770 | 674 | ○ | 0.103 |
| | | Sn:Sb=95:5 | 780 | 669 | ○ | 0.110 |
| | | Sn:Ag=96.5:3.5 | 776 | 671 | ○ | 0.106 |

Note 1) Reliability test conditions: After exposing target to high humidity and high temperature (130°C/85wt%) for 1000 hr, the target is left as it is for 2 hours and the tensile strength is then measured (see Fig. 18(A)).

Note 2) A voltage drop value at initial operation is measured. Average of the values measured ten times is shown(see Fig. 18(B))

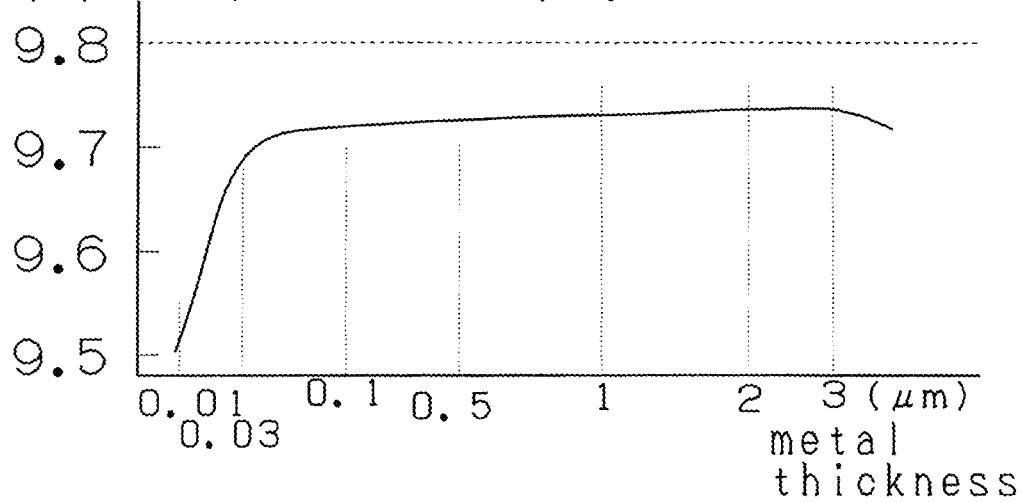
Fig. 20
(A)
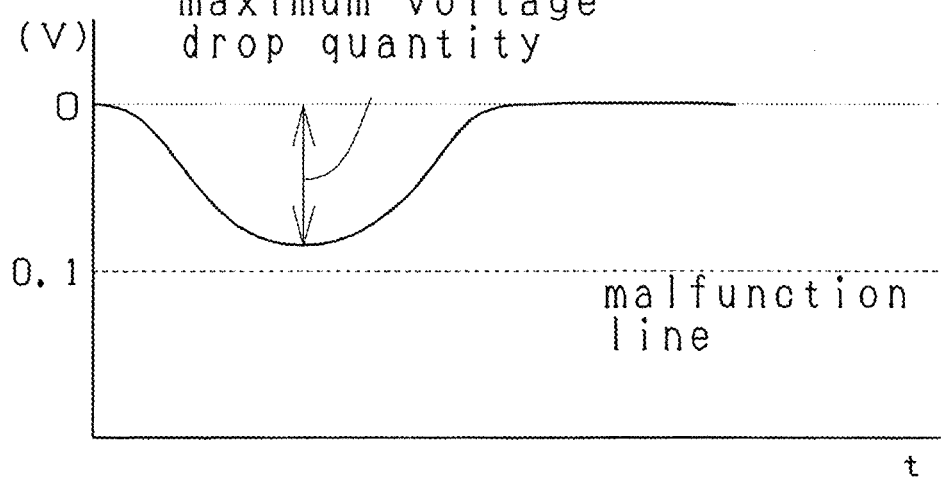
(B)

Fig.21

| Item | Metal Layer Thickness (μm) | Solder Composition | Tensile Strength [mN/bump] | | Operation Test | Voltage Drop Quantity (V) Note 2 |
|---|---|---|---|---|---|---|
| | | | Before Reliability Test | After Reliability Test | | |
| First Embodiment | 0.04 | Sn:Pb=63:37 | 9.9 | 9.6 | ○ | 0.087 |
| | 0.03 | Sn:Sb=95:5 | 9.8 | 9.5 | ○ | 0.090 |
| | 0.05 | Sn:Ag=96.5:3.5 | 9.8 | 9.6 | ○ | 0.088 |
| | 0.03 | Sn:Ag:Cu=95.8:3.5:0.7 | 9.7 | 9.5 | ○ | 0.086 |
| | 0.05 | Sn:Cu=99.3:0.7 | 9.8 | 9.6 | ○ | 0.084 |
| First Modification | 0.03 | Sn:Pb=63:37 | 9.9 | 9.6 | ○ | 0.086 |
| | 0.04 | Sn:Sb=95:5 | 9.8 | 9.6 | ○ | 0.088 |
| | 0.05 | Sn:Ag=96.5:3.5 | 10.0 | 9.7 | ○ | 0.088 |
| | 0.03 | Sn:Ag:Cu=95.8:3.5:0.7 | 9.7 | 9.5 | ○ | 0.087 |
| | 0.04 | Sn:Cu=99.3:0.7 | 9.8 | 9.6 | ○ | 0.085 |
| Second Modification | 0.10 | Sn:Pb=63:37 | 10.0 | 9.6 | ○ | 0.089 |
| | 0.09 | Sn:Sb=95:5 | 9.8 | 9.6 | ○ | 0.090 |
| | 0.07 | Sn:Ag=96.5:3.5 | 9.7 | 9.5 | ○ | 0.089 |
| | 0.11 | Sn:Ag:Cu=95.8:3.5:0.7 | 9.8 | 9.6 | ○ | 0.089 |
| | 0.08 | Sn:Cu=99.3:0.7 | 9.9 | 9.6 | ○ | 0.086 |
| First Comparison | Ni:5 Au:0.03 | Sn:Pb=63:37 | 9.4 | 8.4 | ○ | 0.103 |
| | | Sn:Sb=95:5 | 9.5 | 8.4 | ○ | 0.110 |
| | | Sn:Ag=96.5:3.5 | 9.5 | 8.3 | ○ | 0.106 |

Note 1) Reliability test conditions: After exposing target to high humidity and high temperature (130°C/85wt%) for 1000 hr, the target is left as it is for 2 hours and the tensile strength is then measured (see Fig. 18(A)).

Note 2) A voltage drop value at initial operation is measured. Average of the values measured ten times is shown (see Fig. 18(B))

Fig.22
(A)
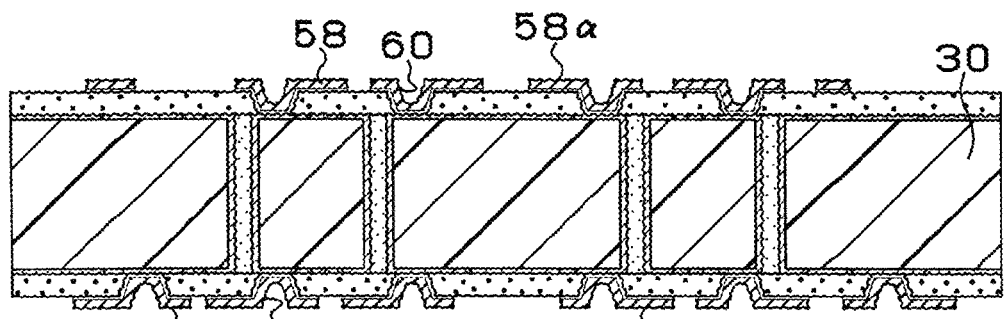
(B)
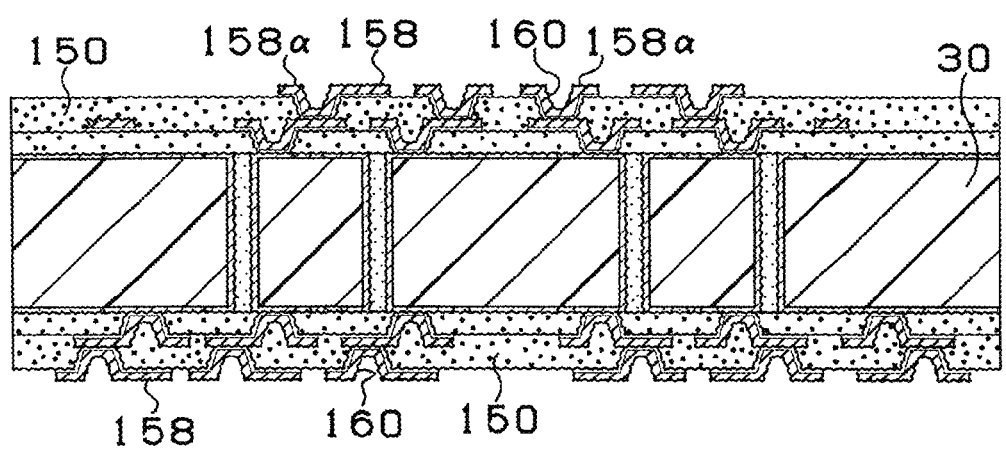
(C)
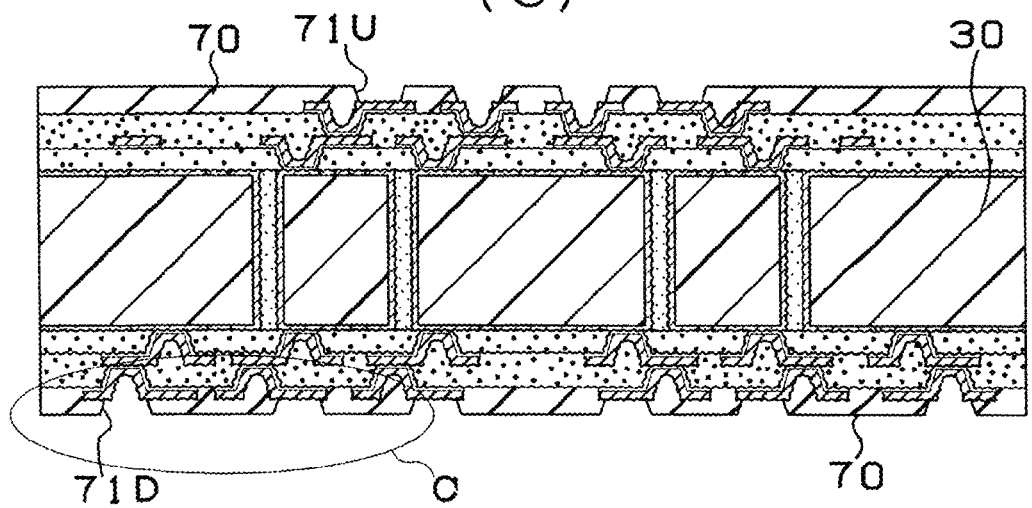

Fig.23
(A)
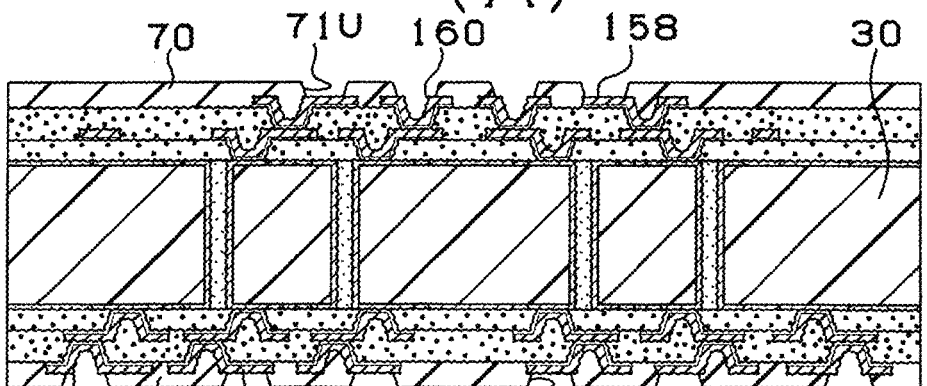
(B)
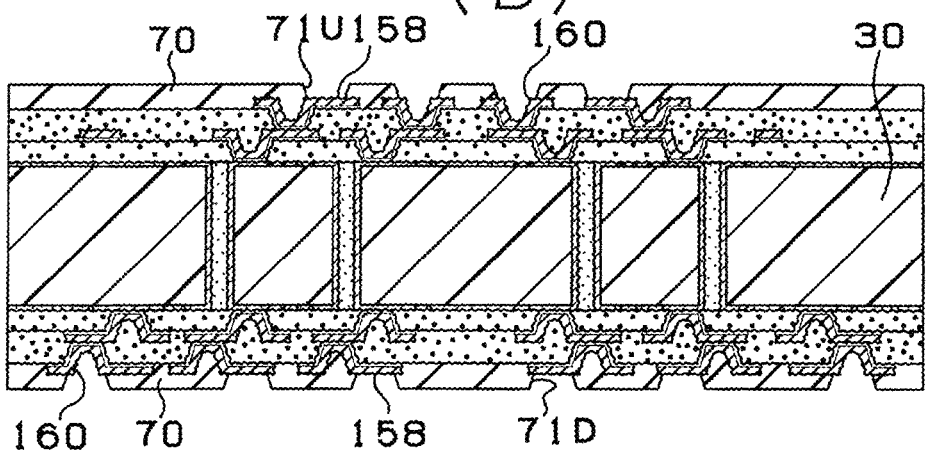
(C)
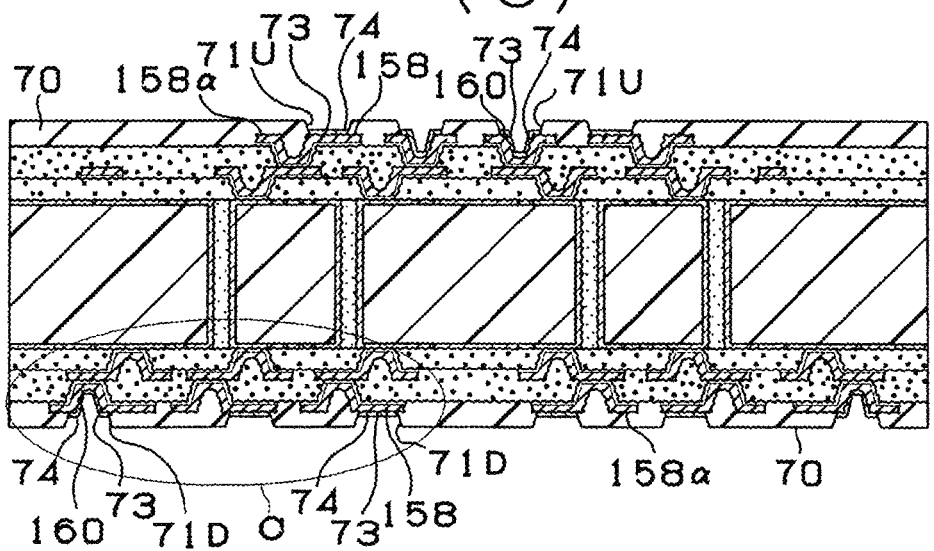

Fig. 26
(A)
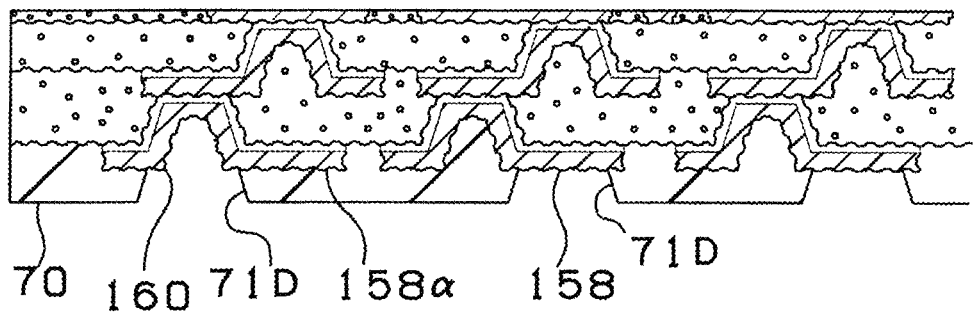
(B)
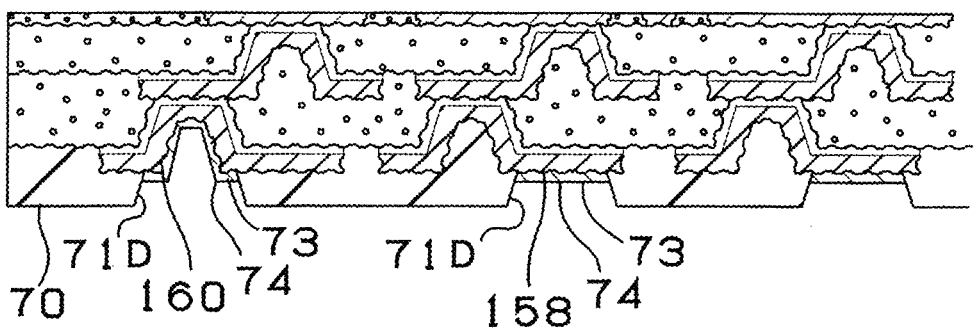
(C)
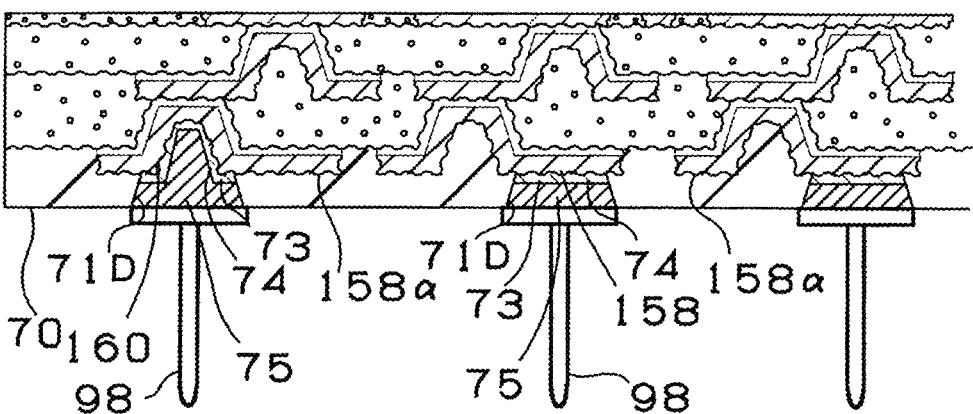

Fig.30
(A)
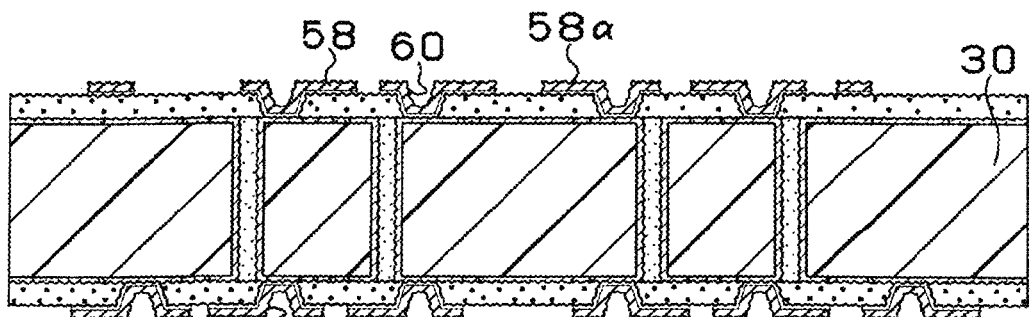
(B)
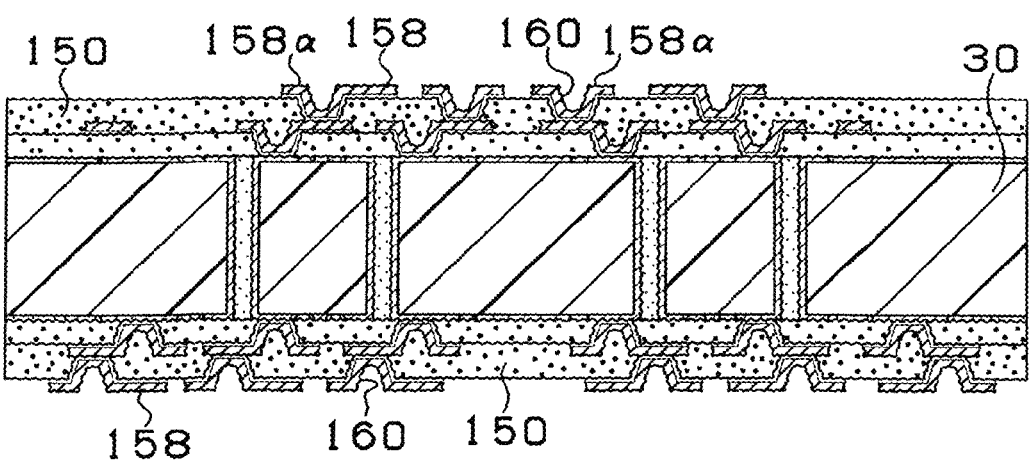
(C)
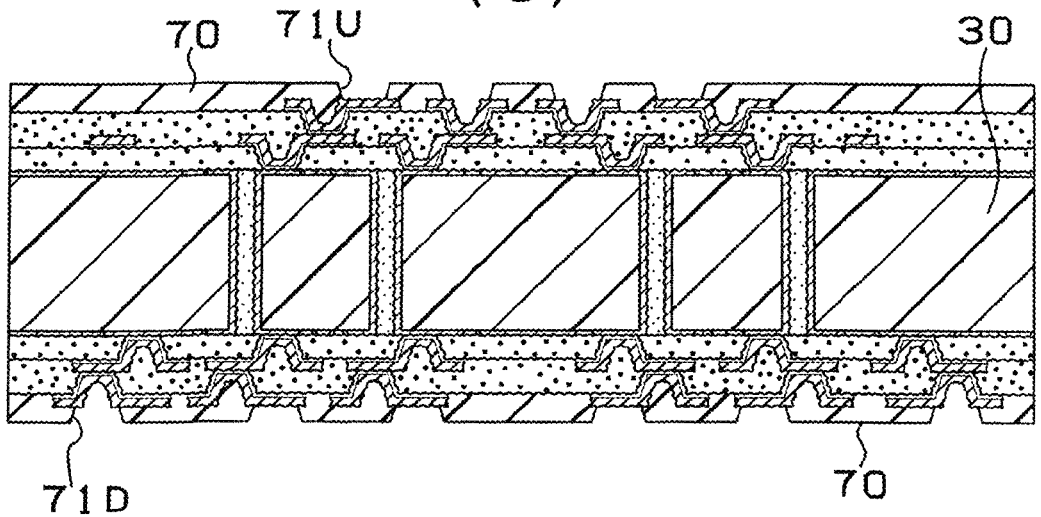

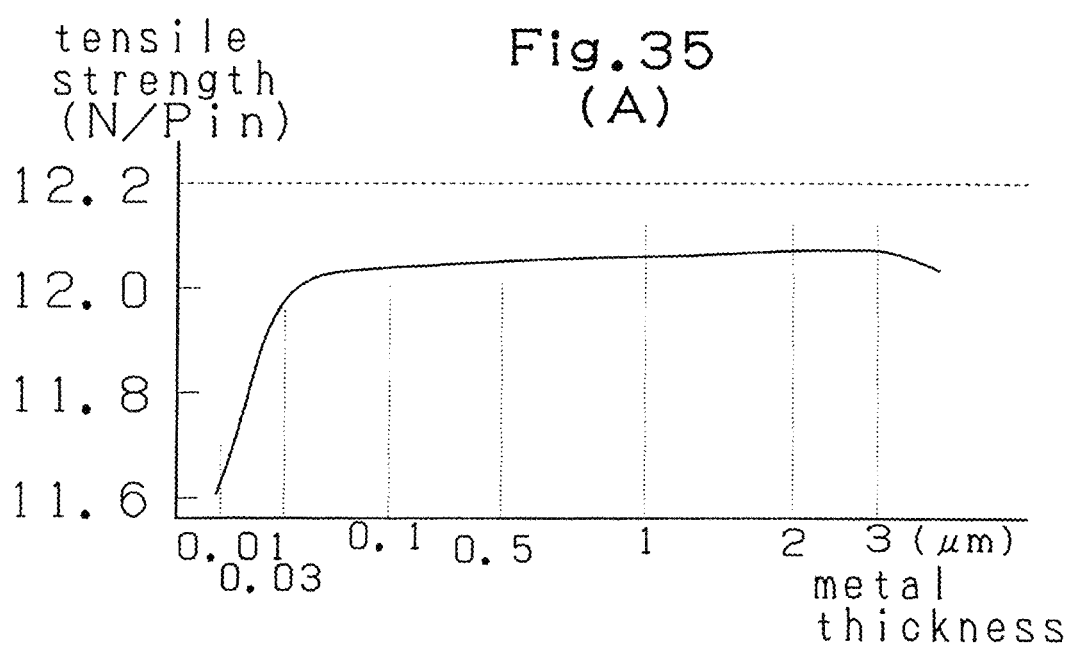
Fig. 35 (A)
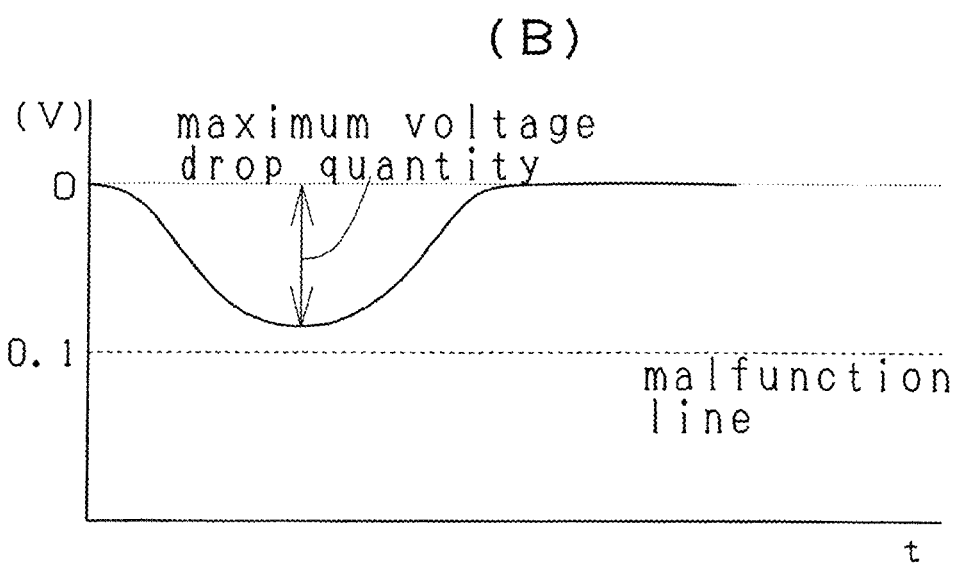
(B)

Fig.36

| Item | Metal Layer Thickness (μm) | Solder Composition | Tensile Strength[ mN/bump] | | Operation Test | Voltage Drop Quantity (V) Note 2 |
|---|---|---|---|---|---|---|
| | | | Before Reliability Test | After Reliability Test | | |
| First Embodiment | 0.04 | Sn:Pb=63:37 | 12.1 | 11.7 | ○ | 0.087 |
| | 0.03 | Sn:Sb=95:5 | 11.9 | 11.6 | ○ | 0.090 |
| | 0.05 | Sn:Ag=96.5:3.5 | 12.2 | 11.7 | ○ | 0.088 |
| | 0.03 | Sn:Ag:Cu=95.8:3.5:0.7 | 12.1 | 11.8 | ○ | 0.086 |
| | 0.05 | Sn:Cu=99.3:0.7 | 12.1 | 11.8 | ○ | 0.084 |
| Third Modification | 0.03 | Sn:Pb=63:37 | 12.0 | 11.8 | ○ | 0.086 |
| | 0.04 | Sn:Sb=95:5 | 12.2 | 11.8 | ○ | 0.088 |
| | 0.05 | Sn:Ag=96.5:3.5 | 12.2 | 11.7 | ○ | 0.088 |
| | 0.03 | Sn:Ag:Cu=95.8:3.5:0.7 | 11.9 | 11.6 | ○ | 0.087 |
| | 0.04 | Sn:Cu=99.3:0.7 | 12.2 | 11.7 | ○ | 0.085 |
| Fourth Modification | 0.10 | Sn:Pb=63:37 | 12.2 | 11.7 | ○ | 0.089 |
| | 0.09 | Sn:Sb=95:5 | 12.1 | 11.8 | ○ | 0.090 |
| | 0.07 | Sn:Ag=96.5:3.5 | 12.2 | 11.6 | ○ | 0.089 |
| | 0.11 | Sn:Ag:Cu=95.8:3.5:0.7 | 12.1 | 11.7 | ○ | 0.089 |
| | 0.08 | Sn:Cu=99.3:0.7 | 12.0 | 11.7 | ○ | 0.086 |
| Second Comparison | Ni:5 Au:0.03 | Sn:Pb=63:37 | 10.9 | 9.5 | ○ | 0.103 |
| | | Sn:Sb=95:5 | 11.1 | 9.7 | ○ | 0.110 |
| | | Sn:Ag=96.5:3.5 | 10.8 | 9.7 | ○ | 0.106 |

Note 1) Reliability test conditions: After exposing target to high humidity and high temperature (130°C/85wt%) for 1000 hr, the target is left as it is for 2 hours and the tensile strength is then measured (see Fig. 18(A)).

Note 2) A voltage drop value at initial operation is measured. Average of the values measured ten times is shown(see Fig. 18(B))

PRINTED WIRING BOARD

CROSS-REFERENCE TO RELATED APPLICATIONS

This application is a continuation of U.S. Ser. No. 12/261,517 filed Oct. 30, 2008 now U.S. Pat. No. 8,013,256, the entire content of which is incorporated herein by reference. U.S. Ser. No. 12/261,517 is a divisional of U.S. Ser. No. 11/200,077 filed Aug. 10, 2005 now U.S. Pat. No. 7,449,781 which is a divisional of U.S. Ser. No. 10/432,640 filed Jun. 10, 2003 now U.S. Pat. No. 7,129,158, which is a National Stage of PCT/JP02/10144 filed Sep. 30, 2002 and claims priority to 35 U.S.C. §119 to Japanese Application Nos. 2001-299668, 2001-299669 and 2001-299670 filed Sep. 28, 2001.

TECHNICAL FIELD

This invention relates to a printed wiring board suitable for use as a package substrate, and particularly relates to a printed wiring board having a solder bump formed in each opening of an organic resin insulating layer (a solder resist layer), a printed wiring board having a BGA (ball grid array) connected to each opening through a solder, and a printed wiring board having a conductive connect ion pin attached, through a conductive adhesive, to a conductor circuit opened and exposed.

BACKGROUND ART

A printed wiring board employed as a package substrate is manufactured by a method disclosed in, for example, JP H0 9-130050 A. Electroless plating or etching is conducted on the surface of a conductor circuit for a printed wiring board, thereby forming a roughened layer. Thereafter, the roughened layer is coated with interlayer insulating resin, exposed, and developed by a roll coater and printed to form via hole opening portions for interlayer continuity, and UV hardening and actual hardening are conducted to the resultant layer, thereby forming an interlayer resin insulating layer. Further, the interlayer insulating layer is subjected to a roughening treatment with acid or oxidizer, and a catalyst such as palladium is put on the roughened surface of the layer. A thin electroless plated film is formed and, a pattern is formed on the plated film by a dry film, a thick plated layer is plated by electroplating, the dry film is peeled off with alkali, and the thin film and the thick layer are etched to form a conductor circuit. By repeating this process, a buildup multi layer printed wiring board is obtained. In addition, a solder resist layer is formed as the outermost layer of the printed wiring board so as to protect the conductor circuit.

As shown in FIG. 17, in case of forming solder bumps 376, a part of a solder resist layer 370 is opened, a nickel layer 372 and a gold layer 374 are provided on each exposed conductor circuit 358 to form a solder pad 373. A solder paste is printed on the solder pad 373, and reflow is conducted, thereby forming the solder bump 376. The reason for forming the gold layer 374 above the conductor circuit 358 with the nickel layer 272 intervening is as follows. If the gold layer is formed on the nickel layer by electroless plating, the nickel layer serves to stabilize the formation of the gold layer. That is, the nickel layer prevents the diffusion or the like of the gold layer.

The printed wiring board employed as an IC chip package substrate is required to improve frequency characteristics. On the printed wiring board constituted as stated above with reference to FIG. 17, if the frequency of an IC chip exceeds 1 GHz, signal propagation delays and malfunction tends to occur. If the frequency of the IC chip exceeds 3 GHz, the tendency of the malfunction becomes more conspicuous. The inventor of the present application fathomed the cause of this disadvantage, and discovered that this is caused by providing the nickel layer 372 and the gold layer 374 on the conductor circuit 358 to constitute the solder pad 373. In other words, because of the use of the two-layer structure of the nickel layer 372 and the gold layer 374, signal propagation delay, increase in resistance and the like occur to the interfaces of the respective layers. The inventor discovered that the signal delay tends to occur particularly to the nickel layer and that the nickel layer differs in delay from the other metals.

Further, if the opening size of the nickel layer becomes smaller, plating-based precipitation tends to be adversely influenced by the smaller size. In addition, the nickel layer 372 pushes up the printed wiring board manufacturing cost. Besides, since the nickel layer 372 is high in electric resistance, the electric properties of the printed wiring board are lowered. If a connected wiring is a power supply layer and the frequency thereof exceeds 1 GHz in a high frequency range, then the quantity of the supply of power to the IC chip increases. Since a large capacity of power should be supplied momentarily, the transmission of the power is hampered by the nickel layer.

On the other hand, as shown in FIG. 34, in case of providing conductive connection pins 398, a part of the solder resist layer 370 is opened, the nickel layer 372 and the gold layer 374 are provided on each exposed conductor circuit (via) 358 to thereby form the solder pad 373. A solder paste which becomes conductive adhesive, is printed on the solder pad 373, and reflow is conducted, thereby bonding the conductive adhesive 395 through the conductive adhesive 395. The reason for forming the gold layer 374 on the conductor circuit 358 with the nickel layer 272 intervening is as follows. If the gold layer is formed on the nickel layer by electroless plating, the nickel layer serves to stabilize the formation of the gold layer. That is, the nickel layer prevents the diffusion or the like of the gold layer.

As described above, the printed wiring board employed as an IC chip package substrate is required to improve frequency characteristics. On the printed wiring board constituted as stated above with reference to FIG. 34, if the frequency of an IC chip exceeds 1 GHz, signal propagation delays and malfunction tends to occur. If the frequency of the IC chip exceeds 3 GHz, the tendency of the malfunction becomes more conspicuous. The inventor of the present application determined the cause of this disadvantage, and discovered that this is caused by providing the nickel layer 372 and the gold layer 374 on the conductor circuit 358 to constitute the solder pad 373. In other words, because of the use of the two-layer structure of the nickel layer 372 and the gold layer 374, signal propagation delay, increase in resistance and the like occur to the interfaces of the respective layers. The inventor also discovered that the signal delay tends to occur particularly to the nickel layer and that the nickel layer differs in delay from the other metals.

The present invention has been made to solve the above-stated problems, and the first object of the present invention is to provide a printed wiring board which includes solder pads excellent in high frequency characteristic and a printed wiring board manufacturing method.

It is the second object of the present invention to provide a printed wiring board which includes BGAs excellent in high frequency characteristic and a printed wiring board manufacturing method.

It is the third object of the present invention to provide a printed wiring board which includes conductive connection pins and has an excellent high frequency characteristic and a printed wiring board manufacturing method.

DISCLOSURE OF THE INVENTION

In order to achieve the first object of the present invention, according to the first invention, a printed wiring board having a solder bump provided on a conductor circuit having a part of an organic resin insulating layer exposed and opened, is characterized in that a single metal layer of tin or noble metal is provided on said exposed conductor circuit, and said solder bump is provided.

According to the first invention, a solder bump is formed by providing a single metal layer on a conductor circuit. Due to this, a signal propagation rate can be increased, as compared with the printed wiring board of the prior art on which the two metal layers are formed. In addition, due to a lack of the nickel layer, manufacturing cost can be decreased and electric characteristics can be enhanced. Further, as for the supply of power to IC chip, the power supply is not hampered and desired power is, therefore, supplied to the IC chip. It is possible to suppress malfunction, delay and the like in initial operation. It is also possible to improve adhesion between the conductor circuit and the solder.

The printed wiring board according to the present invention is constituted so that via holes which are non-penetrating holes are formed in an interlayer resin insulating layer which is not impregnated with a reinforcement core material on a resin substrate having a thickness of about 30 μm, serving as a core substrate, having a thickness of about 0.4 to 1 mm and impregnated with a reinforcement core material, solder bumps made of C4 are formed on the interlayer resin insulating layer, and a flip-chip is mounted on the resultant printed wiring board. In addition, the printed wiring board is connected to an external substrate such as a daughter board through pins or BGAs serving as external terminals. During mounting, the IC chip for the flip-chip is superposed on the solder bumps, and reflow is conducted to thereby melt the solder and, at the same time, connect the solder to the IC chip. As a result, the printed wiring board is electrically connected to the IC chip.

According to the second invention, since noble metal is gold, silver, platinum or palladium, the noble metal is excellent in corrosion resistance and it is difficult to oxidize and degenerate the surface of the noble metal. Further, if the metal is formed on the roughened conductor circuit, the electric characteristic of the board such as resistance is improved, as compared with the board of the two-layer structure (nickel-gold) of the prior art. The reason is considered to be lack of a nickel layer which hampers the improvement of the electric characteristic.

By forming gold on each conductor circuit having a part of an organic resin insulating layer exposed, it is possible to not only obtain the conductor circuit excellent in corrosion resistance or a solder bump formation pad, but also to decrease metal resistance on the IC chip—the solder bump—the conductor layer. Impediment of power supply hardly occur. It is possible to decrease the voltage drop quantity of the power supply. Further, if the solder which is molten by reflow is solidified again, it is possible to improve the adhesion and bonding property of the solder to the pad. Due to this, even if a reliability test is conducted, decrease in tensile strength is small.

By forming silver on each conductor circuit having a part of an organic resin insulating layer exposed, it is possible to not only obtain the conductor circuit excellent in corrosion resistance or a solder bump formation pad, but also to decrease metal resistance on the IC chip—the solder bump—the conductor layer because silver itself is excellent in electric conductivity. Impediment of power supply hardly occur. It is possible to decrease the voltage drop quantity of the power supply. Further, if the solder which is molten by reflow is solidified again, it is possible to improve the adhesion and bonding property of the solder to the pad. Due to this, even if a reliability test is conducted, decrease in tensile strength is small.

By forming tin on each conductor circuit having a part of an organic resin insulating layer exposed, it is possible to not only obtain the conductor circuit excellent in corrosion resistance or a solder bump formation pad, but also to decrease metal resistance on the IC chip—the solder bump—the conductor layer. Impediment of power supply hardly occur. It is possible to decrease the voltage drop quantity of the power supply. Further, if the solder which is molten by reflow is solidified again, it is possible to improve the adhesion and bonding property of the solder to the pad. Due to this, even if a reliability test is conducted, decrease in tensile strength is small. If the solder containing tin is used, in particular, an alloy of the bump and the pad is formed during reflow crystallization, thus making it possible to improve tensile strength.

According to the third invention, the thickness of a metal layer is 0.01 to 3.0 μm. If the thickness is less than 0.01 μm, portions which cannot completely cover the conductor circuit are generated, adversely influencing strength and corrosion resistance. In particular, it is because the roughened surface is exposed, as the conductive circuit having roughened layers formed is provided with metal layers. Besides, no improvement in electric characteristic and strength is seen. Conversely, if the thickness exceeds 3.0 μm, the corrosion resistance and the strength are not improved and the metal becomes too expensive, adversely influencing cost-effectiveness. In addition, a fluctuation in thickness tends to occur, and the characteristic of the respective pads differ, which sometimes adversely influences the electric characteristic. The thickness is preferably 0.05 to 1 μm, more preferably 0.1 to 0.5 μm. In this range, no problem occurs even if there is somewhat a fluctuation in thickness.

According to the fourth invention, roughened layers are formed on the surface and sides of each conductor circuit. This can ensure high adhesion between the conductor circuit and the organic resin insulating layer. The solder bump preferably comprises of eutectic metals of one of Sn/Pb, Sn/Sb, Sn/Ag, Sn/Ag/Cu, and Sn/Cu. Further, the solder bump melting point is preferably between 180 and 280° C. In such a temperature range, even if reflow is conducted, the melting of the resin substrate by the temperature does not occur. If such the solder is used, good adhesion between the solder and the metal layer is ensured. When the solder is solidified again after being molten, an alloy of the solder and the single metal layer is surely formed, thus preventing the deterioration of the strength. Problems concerning to mechanical connection and electric connection hardly occur. With the nickel-gold layers of the prior art, when the nickel layer is defectively formed, the defective layer effects quality of the gold layer thereon, with the result that the formation of an alloy between the metal layer and the solder is hampered. Due to this, bonding strength is deteriorated.

According to the sixth invention, the solder bump comprises of eutectic metals of one of Sn/Pb, Sn/Sb, Sn/Ag, and Sn/Ag/Cu and contains tin, thus ensuring high adhesion to the metal layer (solder pad) comprising of tin.

According to the seventh invention, the solder bump comprises of eutectic metals of one of Sn/Ag and Sn/Ag/Cu and contains silver, thus ensuring high adhesion to the metal layer (solder pad) comprising of silver.

According to the eighth invention, a printed wiring board manufacturing method is characterized by providing a single metal layer on a conductor circuit mainly comprising of copper and having a part of an organic resin insulating layer exposed and opened to form a solder pad by executing at least steps (a) to (c):

(a) the step of immersing the printed wiring board having said conductor circuit exposed from the organic resin insulating layer in an etchant of one of sulfuric acid—hydrogen peroxide, cuprous chloride and ferrous chloride;

(b) the activation step using acid; and (c) the step of providing said single metal layer on said conductor circuit by tin or noble metal substitutional plating.

According to the eighth invention, the conductor circuit mainly comprising of copper is etched and activated by acid. It is, therefore, possible to form a uniformly thin single-layer metal film comprising of tin or noble metal by substitutional plating, regardless of the form and size of the conductor circuit.

According to the ninth invention, noble metal constituting the metal layer is soft metal. It is, therefore, possible to form a single-layer metal film on the conductor circuit without nickel intervening and without diffusing the gold layer to copper. Namely, according to the prior art, hard gold which enables wire bonding to gold wires is continuously used as gold at the time of establishing connection by the solder pad. Since the hard gold is diffused into the conductor circuit made of copper by electroless plating, a film cannot be formed unless the nickel layer intervenes. In addition, it is necessary to ensure strength for the bonding. According to the ninth invention, in contrast, it is possible to directly form the film on the conductor circuit made of copper.

In order to achieve the second object of the present invention, according to the first invention, a printed wiring board having a BGA (ball grid array) provided on a conductor circuit having a part of an organic resin insulating layer exposed and opened, is characterized in that a single metal layer of tin or noble metal is provided on said exposed conductor circuit, and said BGA is provided.

According to the first invention, a BGA is formed by providing a single metal layer on a conductor circuit. Due to this, a signal propagation rate can be increased, as compared with the prior art of the printed wiring board on which the two metal layers are formed. In addition, due to lack of the nickel layer, manufacturing cost can be decreased and electric characteristics can be enhanced. Further, as for the supply of power to IC chip, the power supply is not hampered and desired power is, therefore, supplied to the IC chip. It is possible to suppress malfunction, delay and the like in initial operation. It is also possible to improve adhesion between the conductor circuit and the solder.

According to the second invention, since noble metal is gold, silver, platinum or palladium, the noble metal is excellent in corrosion resistance and it is difficult to oxidize and degenerate the surface of the noble metal. Further, if the metal is formed on the roughened conductor circuit, the electric characteristic of the board such as resistance is improved, as compared with the board of the two-layer structure (nickel-gold) of the prior art. The reason is considered to be lack of a nickel layer which hampers the improvement of the electric characteristic.

By forming gold on each conductor circuit having a part of an organic resin insulating layer exposed, it is possible to not only obtain the conductor circuit excellent in corrosion resistance or a BGA formation pad, but also to decrease metal resistance on the IC chip—the BGA—the conductor layer. Impediment of power supply hardly occur. It is possible to decrease the voltage drop quantity of the power supply. Further, if the solder which is molten by reflow is solidified again, it is possible to improve the adhesion and bonding property of the solder to the pad. Due to this, even if a reliability test is conducted, decrease in tensile strength is small.

By forming silver on each conductor circuit having a part of an organic resin insulating layer exposed, it is possible to not only obtain the conductor circuit excellent in corrosion resistance or a BGA formation pad, but also to decrease metal resistance on the daughter board—the BGA—the conductor layer because silver itself is excellent in electric conductivity. Impediment of power supply hardly occur. It is possible to decrease the voltage drop quantity of the power supply. Further, if the solder which is molten by reflow is solidified again, it is possible to improve the adhesion and bonding property of the solder to the pad. Due to this, even if a reliability test is conducted, decrease in tensile strength is small.

By forming tin on each conductor circuit having a part of an organic resin insulating layer exposed, it is possible to not only obtain the conductor circuit excellent in corrosion resistance or a BGA formation pad, but also to decrease metal resistance on the daughter board—the BGA—the conductor layer. Impediment of power supply hardly occur. It is possible to decrease the voltage drop quantity of the power supply. Further, if the solder which is molten by reflow is solidified again, it is possible to improve the adhesion and bonding property of the solder to the pad. Due to this, even if a reliability test is conducted, decrease in tensile strength is small. If the solder containing tin is used, in particular, an alloy of the BGA and the pad is formed during reflow crystallization, thus making it possible to improve tensile strength.

According to the third invention, the thickness of a metal layer is 0.01 to 3.0 μm. If the thickness is less than 0.01 μm, portions which cannot completely cover the conductor circuit are generated, adversely influencing strength and corrosion resistance. In particular, it is because the roughened surface is exposed, the conductive circuit having roughened layers formed is provided with metal layers. Besides, no improvement in electric characteristic and strength is seen. Conversely, if the thickness exceeds 3.0 μm, the corrosion resistance and the strength are not improved and the metal becomes too expensive, adversely influencing cost-effectiveness. In addition, a fluctuation in thickness tends to occur, and the characteristic of the respective pads differ, which sometimes adversely influences the electric characteristic. The thickness is preferably 0.05 to 1 μm, more preferably 0.1 to 0.5 μm. In this range, no problem occurs even if there is somewhat a fluctuation in thickness.

According to the fourth invention, roughened layers are formed on the surface and sides of each conductor circuit. This can ensure high adhesion between the conductor circuit and the organic resin insulating layer.

The conductive adhesive for connecting the solders or BGAs which constitute the BGAs preferably comprises of eutectic metals of one of Sn/Pb, Sn/Sb, Sn/Ag, Sn/Ag/Cu, and Sn/Cu. Further, the solder bump melting point is preferably between 180 and 280° C. Within such a temperature range, even if reflow is conducted, the melting of the resin substrate by the temperature does not occur. If such a solder is used, good adhesion between the solder and the metal layer is ensured. When the solder is solidified again after being molten, an alloy of the solder and the single metal layer is surely formed, thus preventing the deterioration of the strength. Problems concerning to mechanical connection and electric connection hardly occur. With the prior art of the nickel-gold layers, when the nickel layer is defectively formed, the defective layer effects the quality of the gold layer thereon, with the result that the formation of an alloy between the metal layer and the solder is hampered. Due to this, bonding strength is deteriorated. Furthermore, the same result can be obtained even if the eutectic metals of Sn/Cu are used.

According to the fifth invention, the conductive adhesive for connecting the solders or BGAs which constitute the BGAs is made of eutectic metals of Sn/Pb, Sn/Sb, Sn/Ag, Sn/Ag/Cu and contains tin, thus ensuring high adhesion of the adhesive to the metal layer (solder pad) comprising of tin.

According to the sixth invention, the conductive adhesive for connecting the solders or BGAs which constitute the BGAs is made of eutectic metals of Sn/Ag, Sn/Ag/Cu and contains silver, thus ensuring high adhesion of the adhesive to the metal layer (solder pad) comprising of silver.

According to the seventh invention, the conductive adhesive for connecting the solders or BGAs which constitute the BGAs is made of eutectic metals of Sn/Pb, Sn/Sb, Sn/Ag, Sn/Ag/Cu and contains gold, thus ensuring high adhesion of the adhesive to the metal layer (solder pad) comprising of gold.

According to the eighth invention, a printed wiring board manufacturing method is characterized by providing a single metal layer on a conductor circuit mainly comprising of copper and having a part of an organic resin insulating layer exposed and opened to form a BGA (ball grid array) comprising of a solder bump by executing at least steps (a) to (c):

(a) the step of immersing the printed wiring board having said conductor circuit exposed from the organic resin insulating layer in an etchant of one of sulfuric acid—hydrogen peroxide, cuprous chloride and ferrous chloride;

(b) the activation step using acid; and (c) the step of providing said single metal layer on said conductor circuit by tin or noble metal substitutional plating.

According to the eighth invention, the conductor circuit mainly comprising of copper is etched and activated by acid. It is, therefore, possible to form a uniformly thin single-layer metal film comprising of tin or noble metal by substitutional plating, regardless of the form and size of the conductor circuit.

According to the ninth invention, noble metal constituting the metal layer is soft metal. It is, therefore, possible to form a single-layer metal film on the conductor circuit without nickel intervening and without diffusing the gold layer to copper. Namely, according to the prior art, hard gold which enables wire bonding to gold wires is continuously used as gold at the time of establishing connection by the solder pad. Since the hard gold is diffused into the conductor circuit made of copper by electroless plating, a film cannot be formed unless the nickel layer intervenes. In addition, it is necessary to ensure strength for the bonding. According to the ninth invention, in contrast, it is possible to directly form the film on the conductor circuit made of copper.

In order to achieve the third object of the present invention, according to the first invention, a printed wiring board having a conductive connection pin attached to a conductor circuit having a part of an organic resin insulating layer exposed and opened, with a conductive adhesive intervening between the conductive connection pin and the conductor circuit is characterized in that a single metal layer of tin or noble metal is provided on said exposed conductor circuit, and the conductive connection pin is attached to the conductor circuit with the conductive adhesive intervening between the conductive connection pin and the conductor circuit.

According to the first invention, the conductive connection pin is attached to the conductor circuit with the conductive adhesive intervening between the conductive connection pin and the conductor circuit by providing a single metal layer on a conductor circuit. Due to this, a signal propagation rate can be increased, as compared with the printed wiring board of the prior art on which the two metal layers are formed. In addition, due to lack of the nickel layer, manufacturing cost can be decreased and electric characteristics can be enhanced. Further, as for the supply of power to an external substrate such as a daughter board, the power supply is not hampered and desired power is, therefore, supplied to the daughter board. It is possible to suppress malfunction, delay and the like in initial operation. It is also possible to improve adhesion between the conductor circuit and the solder.

The printed wiring board according to the present invention is constituted so that via holes which are non-penetrating holes are formed in an interlayer resin insulating layer which is not impregnated with a reinforcement core material on a resin substrate having a thickness of about 30 μm, serving as a core substrate, having a thickness of about 0.4 to 1 mm and impregnated with a reinforcement core material, solder bumps made of C4 are formed on the interlayer resin insulating layer, and a flip-chip is mounted on the resultant printed wiring board. In addition, the printed wiring board is connected to an external substrate such as a daughter board through conductive connection pins serving as external terminals.

According to the second invention, since noble metal is gold, silver, platinum or palladium, the noble metal is excellent in corrosion resistance and it is difficult to oxidize and degenerate the surface of the noble metal. Further, if the metal is formed on the roughened conductor circuit, the electric characteristic of the board such as resistance is improved, as compared with the board of the two-layer structure (nickel-gold) of the prior art. The reason is considered to be lack of a nickel layer which hampers the improvement of the electric characteristic.

By forming gold on each conductor circuit having a part of an organic resin insulating layer exposed, it is possible to not only obtain the conductor circuit excellent in corrosion resistance or a conductive connection pin attachment pad, but also to decrease metal resistance on the daughter board—the conductive connection pin—the conductor layer. Impediment of power supply hardly occur. It is possible to decrease the voltage drop quantity of the power supply. Further, if the solder which is molten by reflow is solidified again, it is possible to improve the adhesion and bonding property of the solder to the pad. Due to this, even if a reliability test is conducted, decrease in tensile strength is small.

By forming silver on each conductor circuit having a part of an organic resin insulating layer exposed, it is possible to not only obtain the conductor circuit excellent in corrosion resistance or a conductive connection pin attachment pad, but also to decrease metal resistance on the daughter board—the conductive connection pin—the conductor layer because silver itself is excellent in electric conductivity. Impediment of power supply hardly occur. It is possible to decrease the voltage drop quantity of the power supply. Further, if the solder which is molten by reflow is solidified again, it is possible to improve the adhesion and bonding property of the solder to the pad. Due to this, even if a reliability test is conducted, decrease in tensile strength is small.

By forming tin on each conductor circuit having a part of an organic resin insulating layer exposed, it is possible to not only obtain the conductor circuit excellent in corrosion resistance or a conductive connection pin attachment pad, but also to decrease metal resistance on the daughter board—the conductive connection pin—the conductor layer. Impediment of power supply hardly occur. It is possible to decrease the voltage drop quantity of the power supply. Further, if the solder which is molten by reflow is solidified again, it is possible to improve the adhesion and bonding property of the solder to the pad. Due to this, even if a reliability test is conducted, decrease in tensile strength is small. If the solder containing tin is used, in particular, an alloy of the bump and the pad is formed during reflow crystallization, thus making it possible to improve tensile strength.

According to the third invention, the thickness of a metal layer is 0.01 to 3.0 μm. If the thickness is less than 0.01 μm, portions which cannot completely cover the conductor circuit are generated, adversely influencing strength and corrosion resistance. In particular, it is because the roughened surface is exposed, as the conductive circuit having roughened layers formed is provided with metal layers. Besides, no improvement in electric characteristic and strength is seen. Conversely, if the thickness exceeds 3.0 μm, the corrosion resistance and the strength are not improved and the metal becomes too expensive, adversely influencing cost-effectiveness. In addition, a fluctuation in thickness tends to occur, and the characteristic of the respective pads differ, which sometimes adversely influences the electric characteristic. The thickness is preferably 0.05 to 1 μm, more preferably 0.1 to 0.5 μm. In this range, no problem occurs even if there is somewhat a fluctuation in thickness.

According to the fourth invention, roughened layers are formed on the surface and sides of each conductor circuit. This can ensure high adhesion between the conductor circuit and the organic resin insulating layer. The conductive adhesive preferably comprises of eutectic metals of one of Sn/Pb, Sn/Sb, Sn/Ag, and Sn/Ag/Cu. Further, the conductive adhesive melting point is preferably between 180 and 280° C. Within such a temperature range, even if reflow is conducted, the melting of the resin substrate by the temperature does not occur. If such a solder is used, good adhesion between the solder and the metal layer is ensured. When the solder is solidified again after being molten, an alloy of the solder and the single metal layer is surely formed, thus preventing the deterioration of the strength. Problems concerning to mechanical connection and electric connection hardly occur. With the prior art of the nickel-gold layers, when the nickel layer is defectively formed, the defective layer effects the quality of the gold layer thereon, with the result that the formation of an ally between the metal layer and the solder is hampered. Due to this, bonding strength is deteriorated. Furthermore, the same result can be obtained even if the eutectic metals of Sn/Cu are used.

According to the fifth invention, the conductive adhesive comprises of eutectic metals of one of Sn/Pb, Sn/Sb, Sn/Ag, and Sn/Ag/Cu and contains tin, thus ensuring high adhesion to the metal layer (solder pad) comprising of tin.

According to the sixth invention, a printed wiring board manufacturing method is characterized by providing a single metal layer on a conductor circuit mainly comprising of copper and having a part of an organic resin insulating layer exposed and opened to attach a conductive connection pin with a conductive adhesive by executing at least steps (a) to (c):

(a) the step of immersing the printed wiring board having said conductor circuit exposed from the organic resin insulating layer in an etchant of one of sulfuric acid—hydrogen peroxide, cuprous chloride and ferrous chloride;

(b) the activation step using acid; and (c) the step of providing said single metal layer on said conductor circuit by tin or noble metal substitutional plating.

According to the sixth invention, the conductor circuit mainly comprising of copper is etched and activated by acid. It is, therefore, possible to form a uniformly thin single-layer metal film comprising of tin or noble metal by substitutional plating, regardless of the form and size of the conductor circuit.

According to the seventh invention, noble metal constituting the metal layer is soft metal. It is, therefore, possible to form a single-layer metal film on the conductor circuit without nickel intervening and without diffusing the gold layer to copper. Namely, according to the prior art, hard gold which enables wire bonding to gold wires is continuously used as gold at the time of establishing connection by the conductive connection pin. Since the hard gold is diffused into the conductor circuit made of copper by electroless plating, a film cannot be formed unless the nickel layer intervenes. In addition, it is necessary to ensure strength for the bonding. According to the seventh invention, by contrast, it is possible to directly form the film on the conductor circuit made of copper.

A conductive connection pin comprises of a columnar connection portion and a plate fixed portion, and made of metal selecting from a group comprising of copper, copper alloy, nickel, tin, zinc, aluminum and noble metal.

BRIEF DESCRIPTION OF THE DRAWINGS

FIGS. 4(A), (B) and (C) are manufacturing step diagrams for the printed wiring board according to the first embodiment.

FIGS. 5(A), (B) and (C) are manufacturing step diagrams for the printed wiring board according to the first embodiment.

FIGS. 8(A), (B) and (C) are cross-sectional views showing an enlarged solder pad portion of the printed wiring board according to the first embodiment.

FIGS. 13(A), (B) and (C) are manufacturing step diagrams for a printed wiring board according to the first modification of the present invention.

FIGS. 14(A), (B) and (C) are manufacturing step diagrams for a printed wiring board according to the first modification of the present invention.

FIG. 18(A) is a graph showing the tensile strength of the solder bump, and FIG. 18(B) is a graph showing voltage drop of the solder bump.

FIG. 19 is a table for comparing the first embodiment, the first modification, the second modification, and the first comparison in tensile strength and voltage drop quantity.

FIG. 20(A) is a graph showing the tensile strength of a BGA, and FIG. 20(B) is a graph showing the voltage drop of the BGA.

FIG. 21 is a table for comparing the first embodiment, the first modification, the second modification, and the first comparison in the tensile strength and voltage drop quantity of the BGA.

FIGS. 22(A), (B) and (C) are manufacturing step diagrams for a printed wiring board according to the second embodiment of the present invention.

FIGS. 23(A), (B) and (C) are manufacturing step diagrams for the printed wiring board according to the second embodiment.

FIGS. 26(A), (B) and (C) are cross-sectional views showing the enlarged solder pad portion of the printed wiring board according to the second embodiment.

FIGS. 30(A), (B) and (C) are manufacturing step diagrams for the printed wiring board according to the third modification of the present invention.

FIG. 35(A) is a graph showing the tensile strength of the conductive connection pin, and FIG. 35(B) is a graph showing the voltage drop of the conductive connection pin.

FIG. 36 is a table for comparing the second embodiment, the third modification, the fourth modification, and the second comparison in tensile strength and voltage drop quantity.

BEST MODES FOR CARRYING OUT THE INVENTION

First Embodiment

Figure 1:
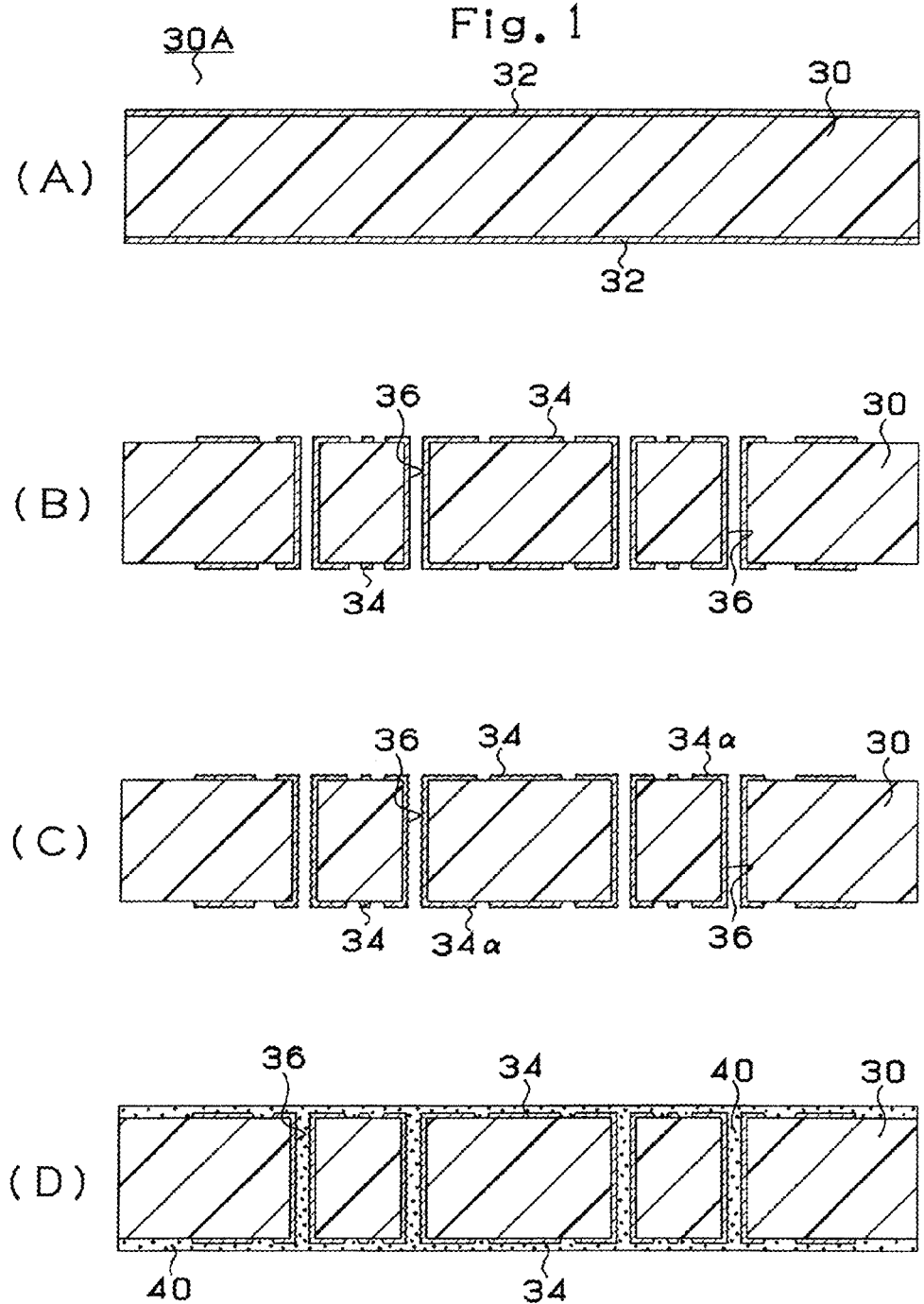
FIGS. 1(A), (B), (C) and (D) are manufacturing step diagrams for a printed wiring board according to the first embodiment of the present invention.
Figure 2:
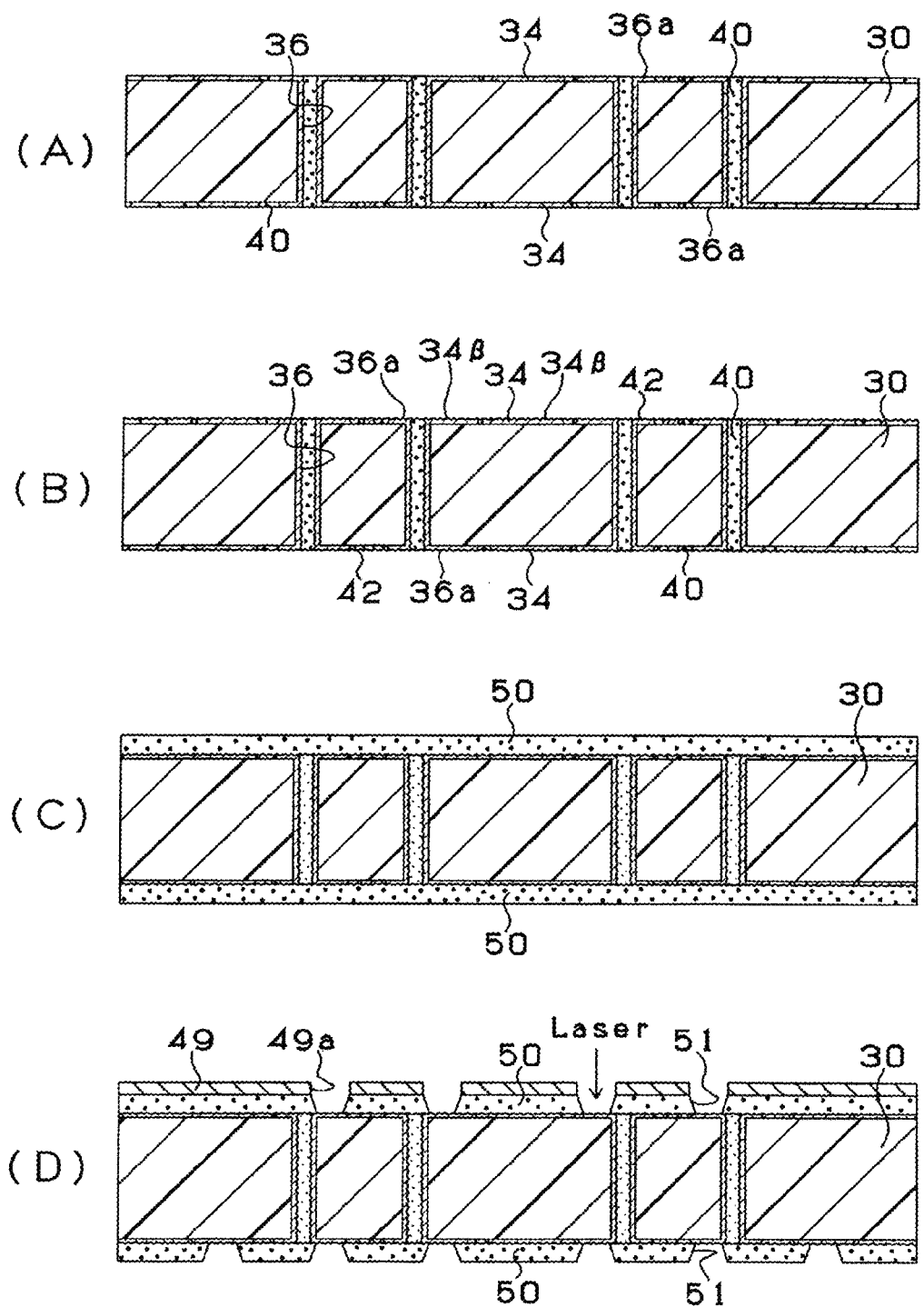
FIGS. 2(A), (B), (C) and (D) are manufacturing step diagrams for the printed wiring board according to the first embodiment.
Figure 3:
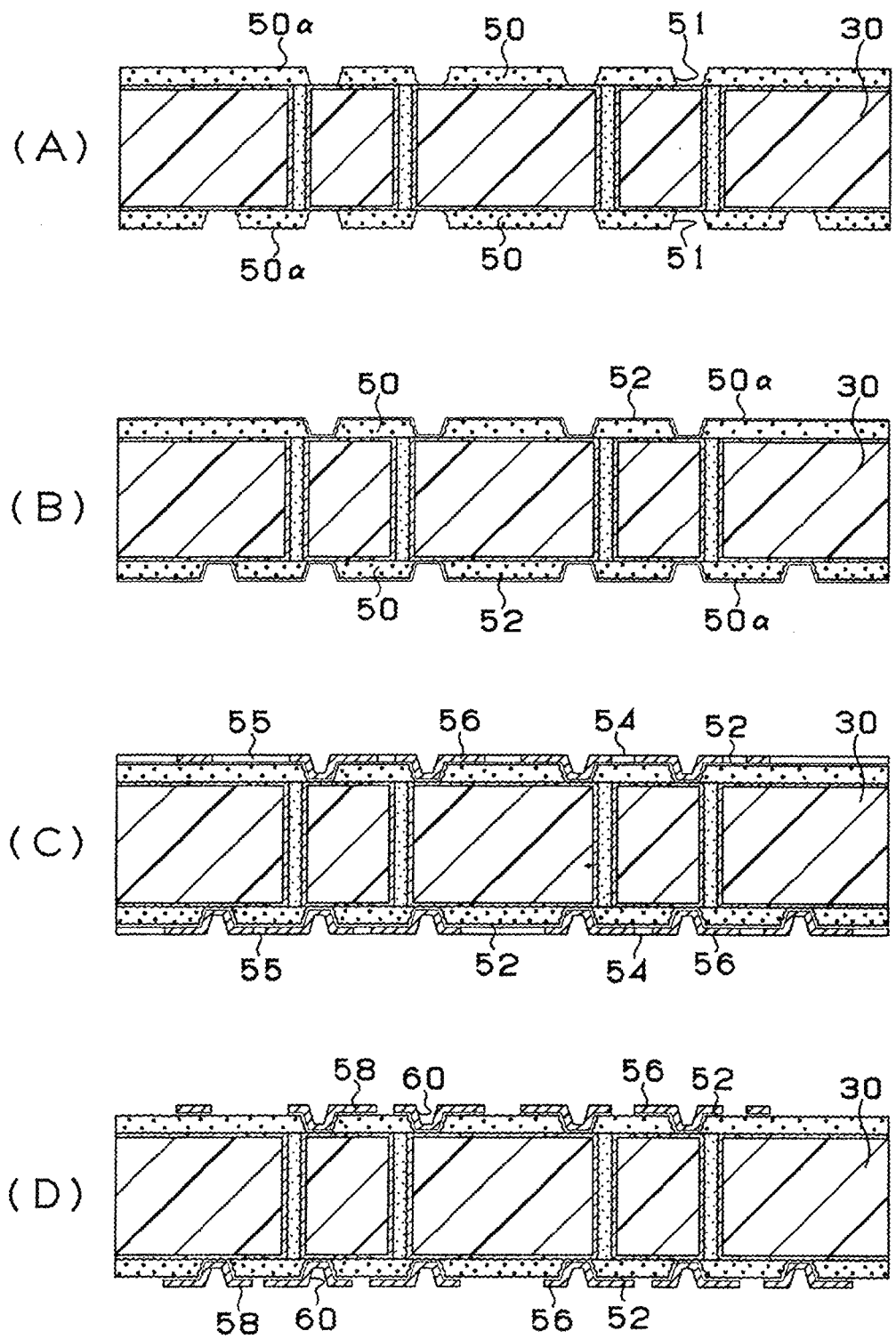
FIGS. 3(A), (B), (C) and (D) are manufacturing step diagrams for the printed wiring board according to the first embodiment.
Figure 6:
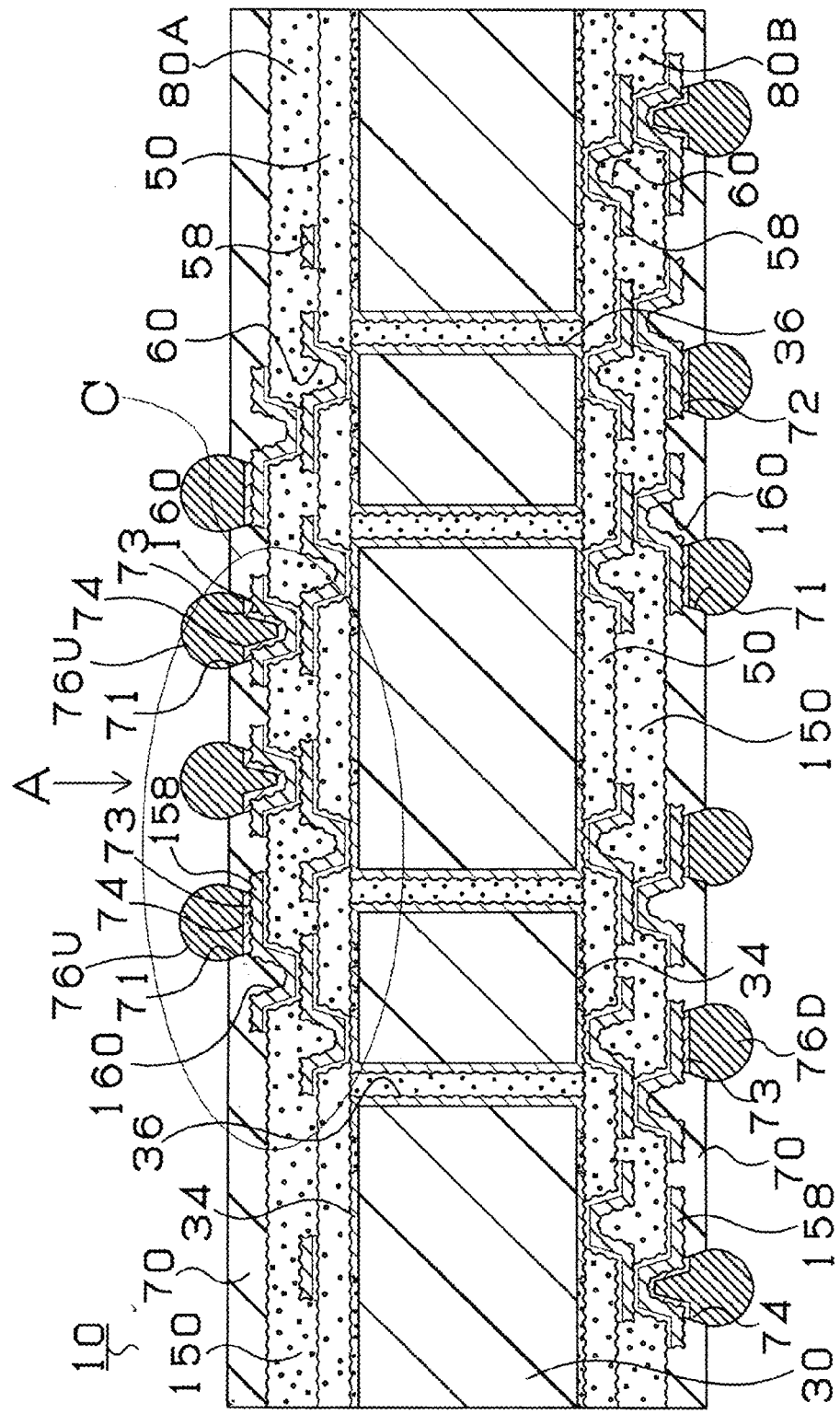
FIG. 6 is a cross-sectional view of the printed wiring board according to the first embodiment.

The configuration of a printed wiring board according to the first embodiment of the present invention will first be described with reference to FIGS. 6 to 9. FIG. 6 shows the cross-section of a printed wiring board 10, and FIG. 7 shows a state in which an IC chip 90 is mounted on the printed wiring board shown in FIG. 6 and attached to a daughter board 94-side.

As shown in FIG. 6, the printed wiring board 10 has buildup wiring layers 80A and 80B formed on the front and rear surfaces of a core substrate 30, respectively. Each of the buildup wiring layers 80A and 80B comprises of an interlayer resin insulating layer 50 on which conductor circuits 158 and vias 160 are formed, and an interlayer resin insulating layer 150 on which conductor circuits 158 and vias 160 are formed. The buildup wiring layer 80A and the buildup wiring layer 80B are connected through holes 36 formed in the core substrate 30. A solder resist layer 70 is formed on the interlayer resin insulating layer 150, and solder bumps 76U are formed on the conductor circuits 158 and the vias 160 on the upper surface side and BGAs 76D are formed on the lower surface side through the opening portions 71 of the solder resists 70, respectively. Each BGA can comprise of a solder ball or comprise of a metal ball other than the solder ball and a solder (or conductive adhesive).

Figure 9:
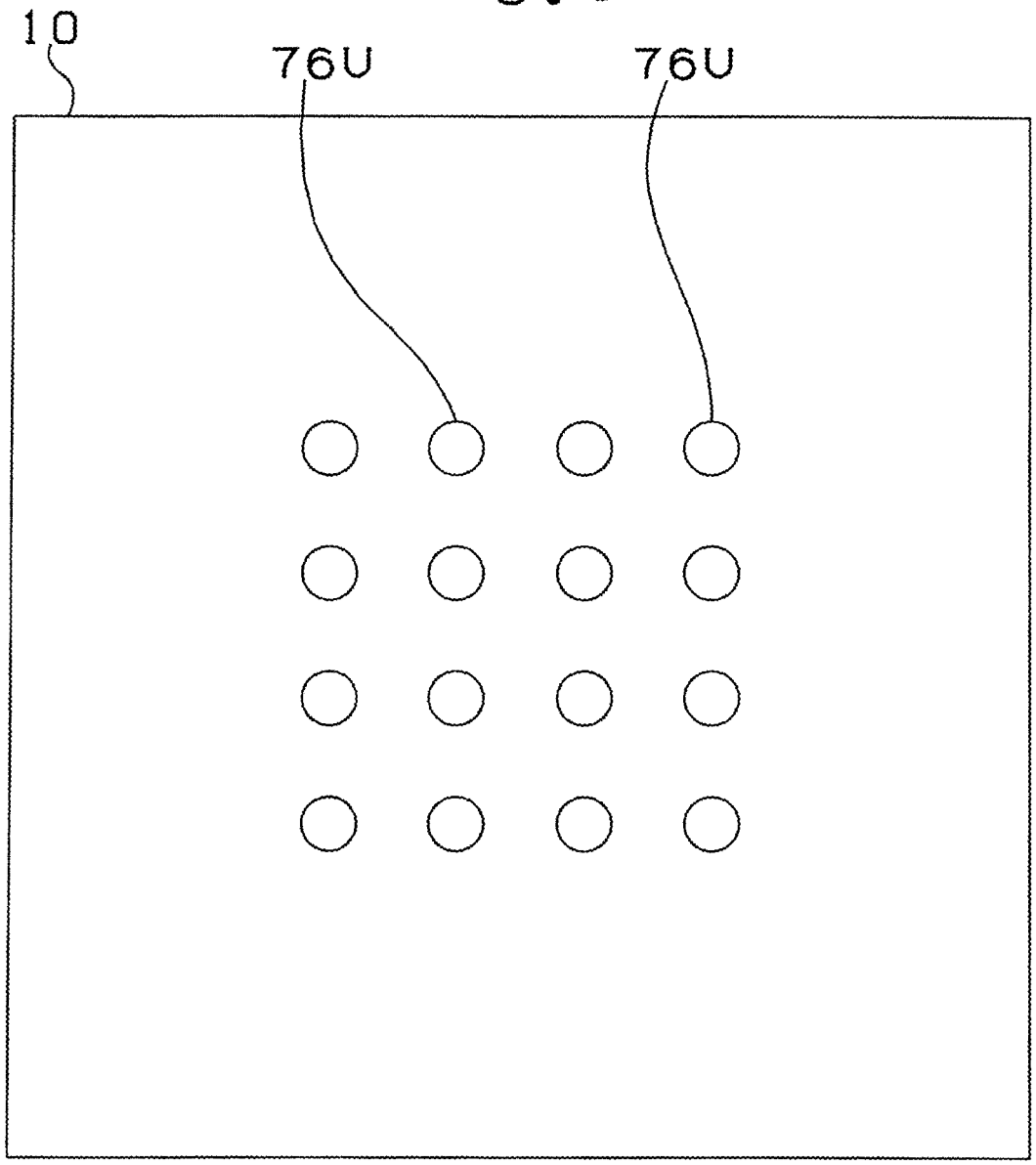
FIG. 9 is a plan view of the printed wiring board according to the first embodiment.
Figure 10:
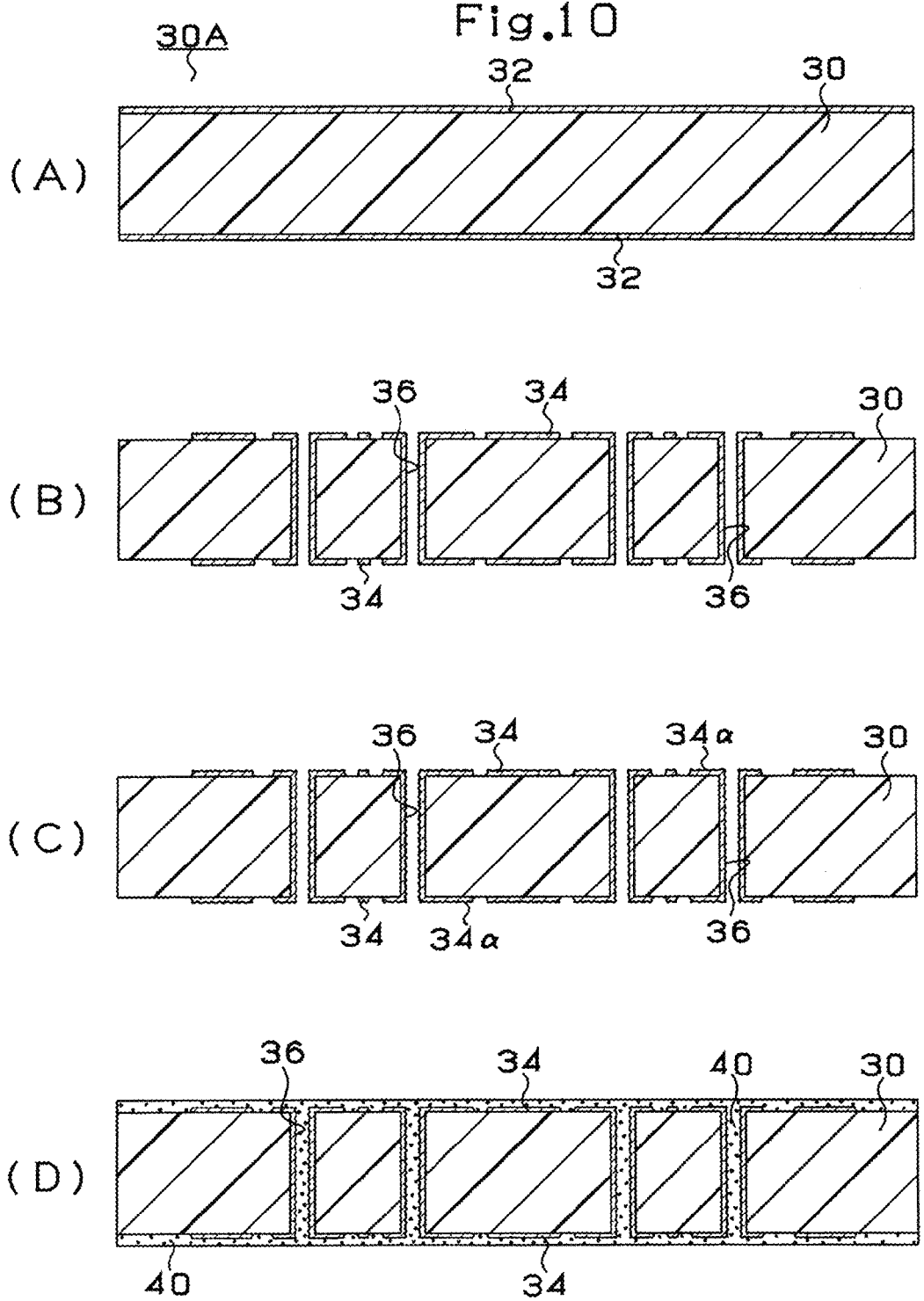
FIGS. 10(A), (B), (C) and (D) are manufacturing step diagrams for a printed wiring board according to the first modification of the present invention.
Figure 11:
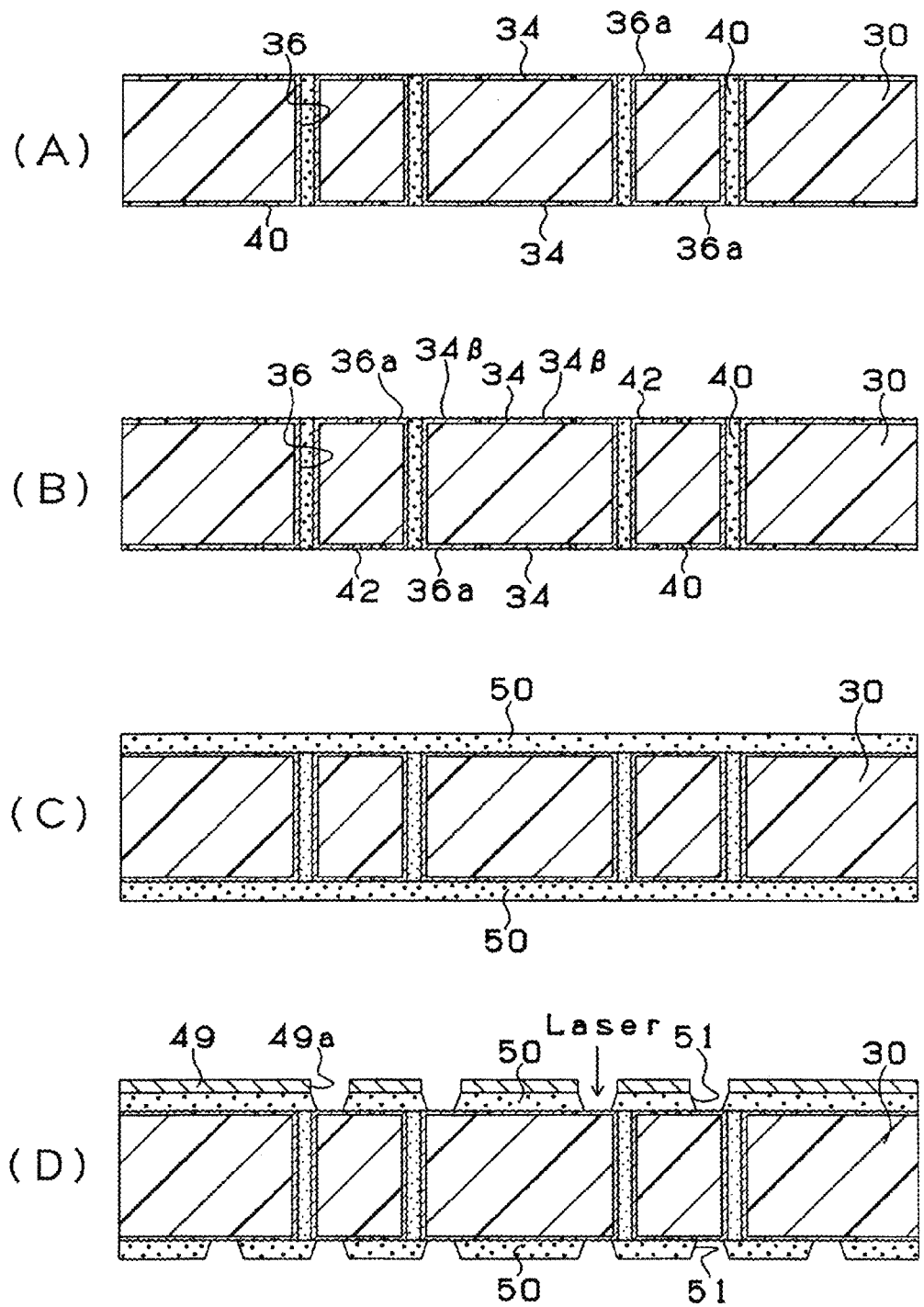
FIGS. 11(A), (B), (C) and (D) are manufacturing step diagrams for a printed wiring board according to the first modification of the present invention.
Figure 12:
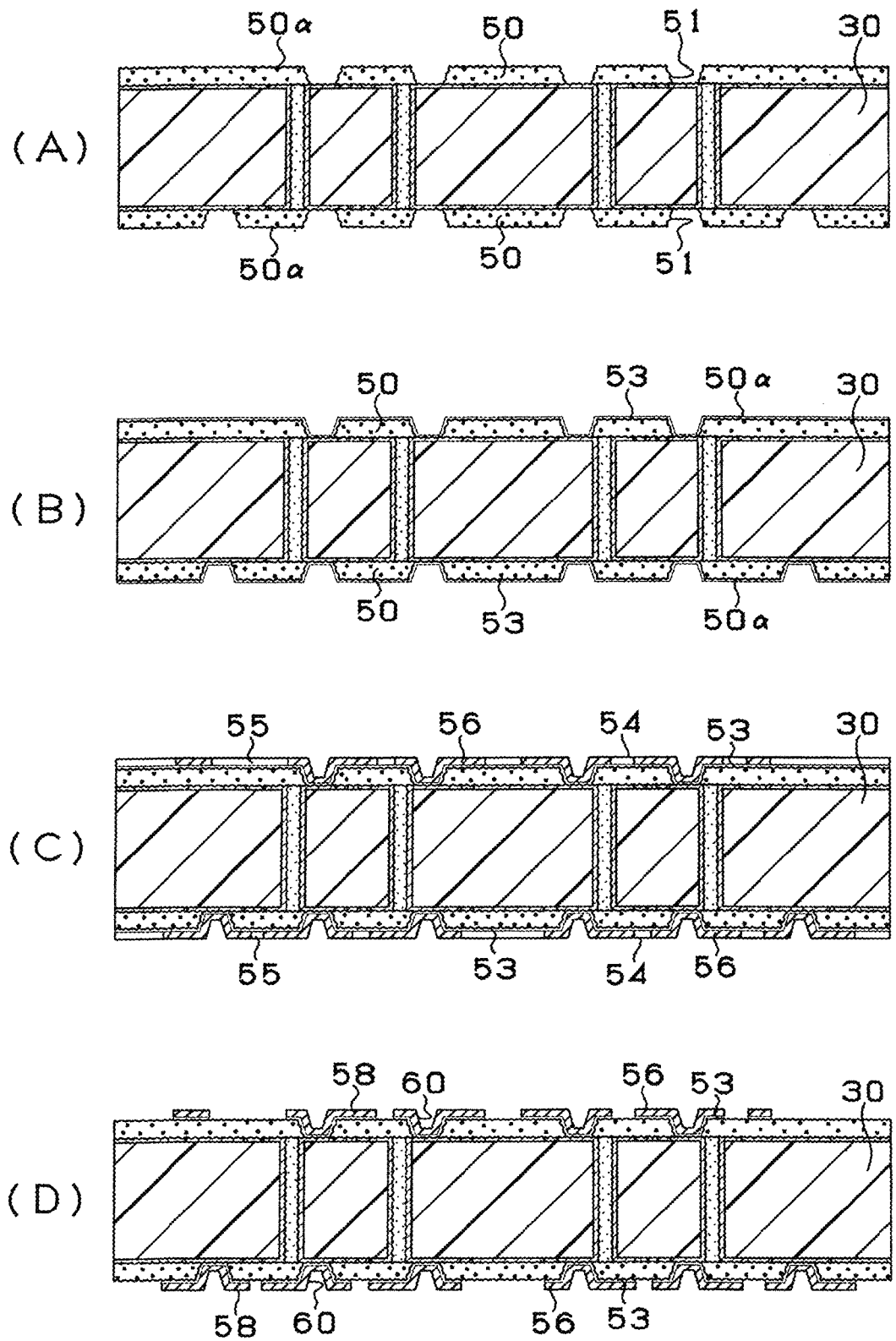
FIGS. 12(A), (B), (C) and (D) are manufacturing step diagrams for a printed wiring board according to the first modification of the present invention.

FIG. 9 is a view showing the printed wiring board 10 shown in FIG. 6 from an arrow A side (plan view thereof). On this printed wiring board 10, the solder bumps 76U connected to the IC chip are arranged as BGAs (ball grid arrays). Although not shown therein, BGAs 76D connected to the daughter board are arranged in the same fashion. In FIG. 9, only 16 solder bumps 76U are shown for the convenience of illustration. On a printed wiring board for a package substrate mounting therein a CPU, several hundreds of solder bumps 76U are arranged.

Figure 7:
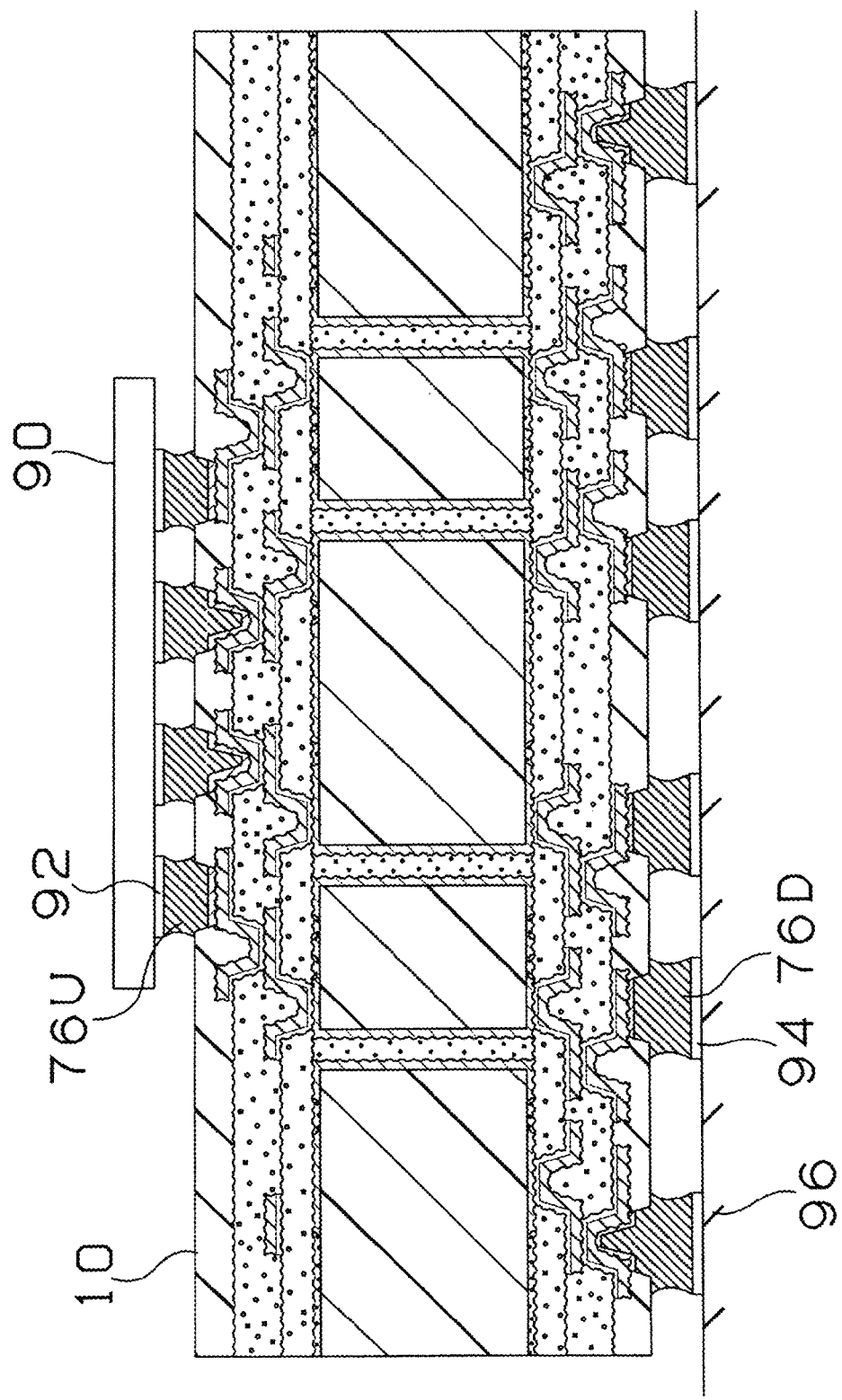
FIG. 7 is a cross-sectional view showing a state in which an IC chip is mounted on the printed wiring board according to the first embodiment and attached to a daughter board.

As shown in FIG. 7, the solder bumps 76U on the upper side of the printed wiring board 10 are connected to the pads 92 of the IC chip 90, and the BGAs (solder bumps) 76D on the lower side thereof are connected to the pads 96 of the daughter board 94, respectively.

As shown in FIG. 8(C) which is an enlarged view of a region surrounded by an ellipse C shown in FIG. 6, a tin layer (single metal layer) 74 is provided on each of the conductor circuits 158 and vias 160 exposed through the opening portions 71 of the solder resists 70, and a solder pad 73 is formed on the tin layer 74. The solder bumps 79U are arranged on the solder pads 76.

Figure 17:
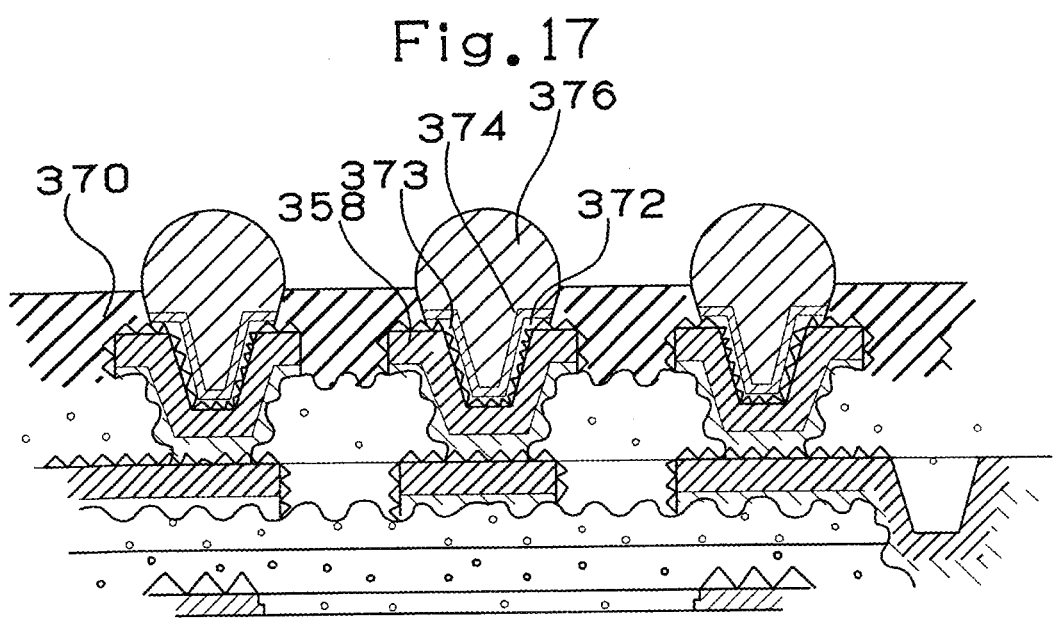
FIG. 17 is a cross-sectional view of a solder pad portion of a printed wiring board according to the prior art.

On the printed wiring board 10 in the first embodiment, since the single tin layer 74 is provided on each of the conductor circuits 158 and vias 160 and the solder pad 73 is formed thereon, a signal propagation rate can be increased, as compared with the printed wiring board of the prior art on which the two metal layers are formed as described above with reference to FIG. 17. In addition, due to lack of the nickel layers, manufacturing cost can be decreased.

The thickness of the tin layer 74 is preferably 0.01 to 3.0 μm. If the thickness is less than 0.01 μm, portions which cannot completely cover the conductor circuit 158 or via 160 are generated, adversely influencing strength and corrosion resistance. Conversely, if the thickness exceeds 3.0 μm, the corrosion resistance and the strength are not improved. Besides, it is difficult to form a tin layer of not less than 3.0 μm by substitutional plating. Further, with such a thickness, peeling occurs in the film, thus deteriorating the strength. The thickness is more preferably 0.03 to 0.5 µm. In this range, no problem occurs even if there is somewhat a fluctuation in thickness.

On the printed wiring board 10 in this embodiment, a roughened layer 158α is formed on the surface of each of the conductor circuits 158 and vias 160 as shown in FIG. 8(C). Due to this, the adhesion between the conductor circuit 158 or the via 160 and the solder resist layer 70 is high.

Furthermore, in the first embodiment, a conductive adhesive for connecting the solder or BGA which constitutes the solder bump 76U or the BGA 76D, respectively is an eutectic metal of Sn/Pb, Sn/Sb, Sn/Ag or Sn/Ag/Cu. Since the conductive adhesive contains tin, the adhesive strongly adheres to the solder pad 73 which includes the tin layer 74.

Now, a method for manufacturing the printed wiring board stated above with reference to FIG. 6 will be described with reference to FIGS. 1 to 5.

(1) A copper-clad laminate 30A having copper foils 32 of 18 µm laminated on the both surfaces of a substrate 30 made of glass epoxy resin or BT (Bsmaleimide-Triazine) resin whose thickness is 0.8 mm, respectively, is used as a starting material (see FIG. 1(A)). 1.0% to 40% of inorganic particles such as silica are mixed into the resin. First, this copper-clad laminate 30A is drilled and a plating resist is formed. Thereafter, an electroless copper plating treatment is conducted to this substrate 30 to form through holes 36. Further, the copper foils are etched into pattern according to an ordinary method, thereby forming lower layer conductor circuits 34 on the both surfaces of the substrate 30, respectively (see FIG. 1(B)).

(2) After washing and drying the substrate 30 having the lower layer conductor circuits 34 formed thereon, etchant is sprayed onto the both surfaces of the substrate 30 with a spray. The surfaces of the lower layer conductor circuits 34 and the land surfaces of the through holes 36 are etched, thereby forming roughened surfaces 34α on the entire surfaces of the respective lower layer conductor circuits 34 (see FIG. 1(C)). As the etchant, a mixture of 10 parts by weight of an imidazole copper (II) complex, 7 parts by weight of glycolic acid, 5 parts by weight of potassium chloride and 78 parts by weight of ion exchanged water is used.

(3) Resin filler 40 mainly comprising of cycloolefin-based resin or epoxy resin is coated on the both surfaces of the substrate 30 using a printer, thereby filling the filler between the lower layer conductor circuits 34 and into the through holes 36, and then the filler is heated and dried (see FIG. 1(D)). Namely, through this step, the resin filler 40 is filled between the lower layer conductor circuits 34 and into the through holes 36. Thereafter, the surfaces of the lower layer conductor circuits 34 and the land surfaces 36a of the through holes 36 are polished so as not to leave the resin filler 40 on these surfaces by belt sander polishing using belt abrasive paper (manufactured by Sankyo Rikagaku Co.), and buffed to remove scratches caused by the belt sander polishing. A series of these polishing treatments are similarly conducted to the other surface of the substrate 30. The resin filler 40 thus filled is heated and hardened (see FIG. 2(A)).

(4) Next, the same etchant as that used in (2) is sprayed onto the both surfaces of the substrate 30 completed with the treatments in (3) by the spray, and the surfaces of the lower layer conductor circuits 34 and the land surfaces 36a of the through holes 36 which have been flattened are subjected to light etching, thereby forming roughened surfaces 34β on the entire surfaces of the respective lower layer conductor circuits 34 (see FIG. 2(B)).

(5) Thermosetting cycloolefin-based resin sheets having a thickness of 50 µm are vacuum-bonding laminated on the both surfaces of the substrate which have been subjected to the above steps while raising temperature to 50 to 150° C. at pressure of 5 kg/cm², providing interlayer resin insulating layers 50 made of the cycloolefin-based resin (see FIG. 2(C)). The vacuum at vacuum-bonding is 10 mmHg.

(6) A mask 49 having openings 49a formed therein is put on the substrate, and openings 52 for vias are formed in the interlayer resin insulating film 50 by a carbonic acid gas laser (see FIG. 2(D)). While the laser is employed in this embodiment, openings 51 for vias can be formed by an exposure-development treatment.

(7) Using acid or oxidizer (a chromic acid or permanganic acid), a roughened surface is formed on the insulating layer. Alternatively, using SV-4540 manufactured by ULVAC JAPAN LTD, a plasma treatment is conducted to form the roughened surface 50α on the surface of each interlayer resin insulating layer 50 (see FIG. 3(A)). At this time, argon gas is used as inactive gas, and the plasma treatment is executed for two minutes under the conditions of power of 200 W, gas pressure of 0.6 Pa and a temperature of 70° C.

(8) Sputtering is conducted to target at Ni and Cu, forming a Ni/Cu metal layer 52 on the surface of each interlayer resin insulating layer 50 (see FIG. 3(B)). While sputtering is utilized herein, the metal layers of copper, nickel or the like may be formed by electroless plating. Depending on the situations, an electroless plated film may be formed after forming each Ni/Cu metal layer 52 by sputtering.

(9) A photosensitive dry film is bonded to the surface of each Ni/Cu metal layer 52, a mask is put thereon, and an exposure-development treatment is conducted, thereby forming a resist 54 having a predetermined pattern. The core substrate 30 is immersed with an electroplating solution, a current is carried to the substrate through the Ni/Cu metal layers 52, and electroplating is conducted to portions on which the resists 54 are not formed under the following conditions, thus precipitating electroplated members 56 (see FIG. 3(C)).

[Electroplating Aqueous Solution]

| | |
|---|---|
| Sulfuric acid | 2.24 mol/l |
| Copper sulfate | 0.26 mol/l |
| Additive | 19.5 ml/l |
| (manufactured by ATOTECH JAPAN KK, "Copperacid HL") | |

[Electroplating Conditions]

| | |
|---|---|
| Current density | 1 A/dm² |
| Time | 120 min. |
| Temperature | 22 ± 2° C. |

(10) Next, after peeling away the plating resists 54 by 5% NaOH, the Ni/Cu metal layers 52 under the plating resists 54 are etched with a solution mixture of sulfuric acid and hydrogen peroxide and molten and removed, and conductor circuits 58 and vias 60 each comprising of the Ni/Cu metal layer 52 and the electrolytic copper-plated member 56 (see FIG. 3(D)). Spraying the etchant onto the both surfaces of the substrate 30 by the spray, and etching the surfaces of the conductor circuits 58 and the vias 60, roughened surfaces 58α are formed on the respective surfaces (see FIG. 4(A)).

(11) By repeating the above steps (5) to (9), the interlayer resin insulating layers 150, the conductor circuits 158, and the vias 160 are formed. By spraying the etchant onto the both surfaces of the substrate by the spray and etching the surfaces of the conductor circuits 158 and the vias 160, roughened layers 158α are formed on the respective surfaces (see FIG. 4(B)). As the etchant, a mixture of 10 parts by weight of an imidazole copper (II) complex, 7 parts by weight of glycolic acid, 5 parts by weight of potassium chloride and 78 parts by weight of ion exchanged water is used.

(12) 46.67 parts by weight of oligomer (molecular weight of 4000) which is obtained by forming 50% of epoxy groups of cresol novolac type epoxy resin (manufactured by Nippon Kayaku Co., Ltd.) into an acrylic structure dissolved in diethylene glycol dimethyl ether (DMDG) so as to be 60 tw % and which imparts photosensitive characteristic, 15 parts by weight of 80 wt % of bisphenol A type epoxy resin (manufactured by Yuka Shell, product name: Epicoat 1001) dissolved in methylethyl ketone, 1.6 parts by weight of imidazole hardening agent (manufactured by Shikoku Chemicals, product name: 2E4MZ-CN), 3 parts by weight of polyhydric acryl monomer which is a photosensitive monomer (manufactured by Kyoei Chemical, product name: R604), 1.5 parts by weight of polyhydric acryl monomer (manufactured by Kyoei Chemical, product name: DPE6A) and 0.71 parts by weight of dispersing defoaming agent (manufactured by San Nopco Ltd., product name: S-65) are input in a container, agitated and mixed to prepare mixture compositions. 2.0 parts by weight of benzophenone (manufactured by Kanto Kagaku) serving as photoinitiator and 0.2 parts by weight of Michler's ketone (manufactured by Kanto Kagaku) serving as photosensitizer are added to the mixture compositions, thereby obtaining a solder resist composition (an organic resin insulating material) adjusted to have a viscosity of 2.0 Pa·s at 25° C.

The viscosity is measured by using No. 4 rotor of a B-type viscometer (DVL-B type, manufactured by Tokyo Keiki) when the velocity is 60 rpm, and using No. 3 rotor thereof when the velocity is 6 rpm.

(13) The solder resist compositions are coated on the both surfaces of the substrate 30 each by a thickness of 20 μm, respectively, and dried for 20 minutes at 70° C. and for 30 minutes at 70° C. Thereafter, a photomask on which a pattern of solder resist opening portions 71 are drawn and which has a thickness of 5 mm, is fixedly attached to each solder resist layer 70, exposed with ultraviolet rays of 1000 mJ/cm$^2$, and developed with DMTG solution, thereby forming opening portions 71 having a diameter of 200 μm. Further, heat treatments are conducted for 1 hour at 80° C., for 1 hour at 100° C., for 1 hour at 120° C. for 1 hour at 120° C., and for 3 hours at 150° C., respectively, to harden the solder resist layers 70, thus forming the solder resist layers 70 each having the opening portions 71 and a thickness of 20 μm (see FIG. 4(C)). FIG. 8(A) shows the enlarged opening 71 shown in an ellipse C in FIG. 4(C).

(14) The substrate having the solder resist layers (organic resin insulating layers) 70 formed thereon is degreased by alkali degreasing. While the alkali degreasing is conducted, neutral degreasing or acid degreasing can be conducted.

(15) The substrate on which the solder resist layers 70 are formed is immersed in etchant of sulfuric acid—hydrogen peroxide, cuprous chloride or ferrous chloride, scraping off the surface layers of the conductor circuits 158 and the vias 160 exposed from the respective openings 71 of the solder resist layers 70 (see FIG. 5(A)).

(16) The substrate on which the solder resist layers 70 is immersed in acid such as sulfuric acid or hydrochloric acid, thereby adjusting the surface potentials of the conductor circuits 158 and the vias 160 exposed from the respective openings 71 of the solder resist layers 70 and scraping off the oxide films (see FIG. 5(B)).

(17) The substrate is immersed in a tin substitutional plating solution having the following compositions to form tin layers 74 having a thickness of 0.6 μm on the surfaces of the conductor circuits 158 and the vias 160 exposed from the respective openings 71 of the solder resist, thereby forming solder pads 73 (see FIG. 5(C) and FIG. 8(B) which is an enlarged view of the region surrounded by the ellipse C shown in FIG. 5(C)). The opening diameter ranges from 100 to 1000 μm. While a tin fluoroborate compound is used for the tin substitutional plating solution, tin chloride can be used instead of this compound. In the first embodiment, the conductor circuits 158 and the vias 160 which mainly comprise of copper are etched and activated with acid, so that the monolayer metal films 74 comprising of tin can be formed by the substitutional plating. In addition, monolayer metals are formed on external terminal formation portions on the rear surfaces of the solder bump formation portions.

Tin Substitutional Plating Solution

| | |
|---|---|
| Thio urea | 20 g/l |
| Tin fluoroborate (concentration of 35% by volume) | 80 ml/l |
| Stabilizer (PEG) | 5 ml/l |
| Temperature | 60° C. |
| Immersion time | 10 minutes |

(18) Thereafter, a solder paste made of eutectic metals of Sn/Pb, Sn/Sb, Sn/Ag, Sn/Ag/Cu or Sn/Cu is printed on each opening portion 71 of the solder resist layers 70, and reflow is conducted at 200° C., thereby forming the BGA structure solder bumps 76U and BGAs 76D described above with reference to FIG. 9. As a result, the printed wiring board 10 including the solder bumps 76U and the GBA's 76D can be obtained (see FIG. 6). In the first embodiment, the conductive adhesive for connecting the solders or BGAs which constitute the solder bumps 76U or BGAs 76D is made of eutectic metals of Sn/Pb, Sn/Sb, Sn/Ag, Sn/Ag/Cu or Sn/Cu and contains tin, thus ensuring high adhesion of the adhesive to the solder pads 73 each including the tin layer 74. Each BGA 76D can be formed out of either a solder ball or a metal ball other than the solder ball and a solder (or conductive adhesive). The solders may be either the same or different. For example, the melting point of the conductive adhesive for the solder bumps is preferably higher than that of the conductive adhesive for the BGAs. This can avoid trouble at the time of packaging the BGAs.

Next, the mounting of the IC chip to the printed wiring board 10 completed through the above-stated steps, and the attachment of the printed wiring board 10 to the daughter board will be described with reference to FIG. 7. The IC chip 90 is mounted on the completed printed wiring board 10 so that the solder pads 92 of the IC chip 90 correspond to the respective solder bumps 76U of the board 10, and ref low is conducted, thereby attaching the IC chip 90 onto the printed wiring board 10. At the same time, by conducting reflow so that the pads 94 of the daughter board 95 correspond to the respective BGAs 76D of the printed wiring board 10, the printed wiring board 10 is attached onto the daughter board 95.

In the first embodiment stated above, cycloolefin-based resin is used for the interlayer resin insulating layers 50 and 150. Alternatively, epoxy-based resin can be used in place of the cycloolefin-based resin. The epoxy-based resin contains refractory resin, soluble particles, a hardening agent and other components. These materials will be described below one by one.

The epoxy-based resin which is applicable to the manufacturing method of the present invention has a structure in which particles soluble in acid or oxidizer (which particles will be referred to as "soluble particles" hereinafter) are dispersed into resin refractory with respect to acid or oxidizer (which resin will be referred to as "refractory resin" hereinafter).

The expressions "refractory" and "soluble" will now be described. When materials are immersed in solution composed of the same acid or the same oxidizers for the same time, a material of a type which is dissolved at a relatively high dissolving rate is called a "soluble" material for convenience. A material of a type which is dissolved at a relatively slow dissolving rate is called a "refractory material" for convenience.

The soluble particles are exemplified by resin particles which are soluble in acid or an oxidizer (hereinafter called "soluble resin particles"), inorganic particles which are soluble in acid or an oxidizer (hereinafter called "inorganic soluble particles") and metal particles which are soluble in acid or an oxidizer (hereinafter called "soluble metal particles"). The foregoing soluble particles may be employed solely or two or more particles may be employed.

The shape of each of the soluble particles is not limited. The shape may be a spherical shape or a pulverized shape. It is preferable that the particles have a uniform shape. The reason for this lies in that a rough surface having uniformly rough pits and projections can be formed.

It is preferable that the mean particle size of the soluble particles is 0.1 μm to 10 μm. When the particles have the diameters satisfying the foregoing range, particles having two or more particle sizes may be employed. That is, soluble particles having a mean particle size of 0.1 μm to 0.5 μm and soluble particles having a mean particle size of 1 μm to 3 μmm may be mixed. Thus, a more complicated rough surface can be formed. Moreover, the adhesiveness with the conductor circuit can be improved. In the present invention, the particle size of the soluble particles is the length of a longest portion of each of the soluble particles.

The soluble resin particles may be particles constituted by thermosetting resin or thermoplastic resin. When the particles are immersed in solution composed of acid or an oxidizer, the particles must exhibit dissolving rate higher than that of the foregoing refractory resin.

Specifically, the soluble resin particles are exemplified by particles constituted by epoxy resin, phenol resin, polyimide resin, polyphenylene resin, polyolefin resin or fluorine resin. The foregoing material may be employed solely or two or more materials may be mixed.

The soluble resin particles may be resin particles constituted by rubber. The rubber above is exemplified by polybutadiene rubber, a variety of denatured polybutadiene rubber, such as denatured epoxy rubber, denatured urethane rubber or denatured (metha)acrylonitrile rubber, and (metha)acrylonitrile butadiene rubber containing a carboxylic group. When the foregoing rubber material is employed, the soluble resin particles can easily be dissolved in acid or an oxidizer. That is, when the soluble resin particles are dissolved with acid, dissolution is permitted with acid except for strong acid. When the soluble resin particles are dissolved, dissolution is permitted with permanganate which has a relatively weak oxidizing power. When chromic acid is employed, dissolution is permitted even at a low concentration. Therefore, retention of the acid or the oxidizer on the surface of the resin can be prevented. When a catalyst, such as palladium chloride, is supplied after the rough surface has been formed as described later, inhibition of supply of the catalyst and oxidation of the catalyst can be prevented.

The inorganic soluble particles are exemplified by particles made of at least a material selected from a group comprising of an aluminum compound, a calcium compound, a potassium compound, a magnesium compound and a silicon compound.

The aluminum compound is exemplified by alumina and aluminum hydroxide. The calcium compound is exemplified by calcium carbonate and calcium hydroxide. The potassium compound is exemplified by potassium carbonate. The magnesium compound is exemplified by magnesia, dolomite and basic magnesium carbonate. The silicon compound is exemplified by silica and zeolite. The foregoing material may be employed solely or two or more materials may be mixed.

The soluble metal particles are exemplified by particles constituted by at least one material selected from a group comprising of copper, nickel, iron, zinc, lead, gold, silver, aluminum, magnesium, potassium and silicon. The soluble metal particles may have surfaces coated with resin or the like in order to maintain an insulating characteristic.

When two or more types of the soluble particles are mixed, it is preferable that the combination of the two types of soluble particles is a combination of resin particles and inorganic particles. Since each of the particles has low conductivity, an insulating characteristic with the resin film can be maintained. Moreover, the thermal expansion can easily be adjusted with the refractory resin. Thus, occurrence of a crack of the interlayer resin insulating layer constituted by the resin film can be prevented. Thus, separation between the interlayer resin insulating layer and the conductor circuit can be prevented.

The refractory resin is not limited when the resin is able to maintain the shape of the rough surface when the rough surface is formed on the interlayer resin insulating layer by using acid or oxidizer. The refractory resin is exemplified by thermosetting resin, thermoplastic resin and their composite material. As an alternative to this, the foregoing photosensitive resin of a type having photosensitive characteristic imparted thereto may be employed. When the photosensitive resin is employed, exposure and development processes of the interlayer resin insulating layers can be performed to form the openings for the via holes.

In particular, it is preferable that the resin containing thermosetting resin is employed. In the foregoing case, the shape of the rough surface can be maintained against plating solution and when a variety of heating processes are performed.

The refractory resin is exemplified by epoxy resin, phenol resin, polyimide resin, polyphenylene resin, polyolefin resin and fluorine resin. The foregoing material may be employed solely or two or more types of the materials may be mixed.

It is preferable that epoxy resin having two or more epoxy groups in one molecule thereof is employed. The reason for this lies in that the foregoing rough surface can be formed. Moreover, excellent heat resistance and the like can be obtained. Thus, concentration of stress onto the metal layer can be prevented even under a heat cycle condition. Thus, occurrence of separation of the metal layer can be prevented.

The epoxy resin is exemplified by cresol novolac epoxy resin, bisphenol-A epoxy resin, bisphenol-F epoxy resin, phenol novolac epoxy resin, alkylphenol novolac epoxy resin, biphenol-F epoxy resin, naphthalene epoxy resin, dicyclopentadiene epoxy resin, an epoxy material constituted by a condensation material of phenol and an aromatic aldehyde having a phenol hydroxyl group, triglycidyl isocyanurate and alicyclic epoxy resin. The foregoing materials may be employed solely or two or more material may be mixed. Thus, excellent heat resistance can be realized.

It is preferable that the soluble particles in the resin film according to the present invention are substantially uniformly dispersed in the refractory resin. The reason for this lies in that a rough surface having uniform pits and projections can be formed. When via holes and through holes are formed in the resin film, adhesiveness with the metal layer of the conductor circuit can be maintained. As an alternative to this, a resin film containing soluble particles in only the surface on which the rough surface is formed may be employed. Thus, the portions of the resin film except for the surface is not exposed to acid or the oxidizer. Therefore, the insulating characteristic between conductor circuits through the interlayer resin insulating layer can reliably be maintained.

It is preferable that the amount of the soluble particles which are dispersed in the refractory resin is 3 wt % to 40 wt % with respect to the resin film. When the amount of mixture of the soluble particles is lower than 3 wt %, the rough surface having required pits and projections cannot be formed. When the amount is higher than 40 wt %, deep portions of the resin film are undesirably dissolved when the soluble particles are dissolved by using acid or the oxidizer. Thus, the insulating characteristic between the conductor circuits through the interlayer resin insulating layer constituted by the resin film cannot be maintained. Thus, short circuit is sometimes incidentally caused.

It is preferable that the resin film contains a hardening agent and other components as well as the refractory resin.

The hardening agent is exemplified by an imidazole hardening agent, an amine hardening agent, a guanidine hardening agent, an epoxy adduct of each of the foregoing hardening agents, a microcapsule of each of the foregoing hardening agents and an organic phosphine compound, such as triphenylphosphine or tetraphenyl phosphonium tetraphenyl borate.

It is preferable that the content of the hardening agent is 0.05 wt % to 10 wt % with respect to the resin film. When the content is lower than 0.05 wt %, the resin film cannot sufficiently be hardened. Thus, introduction of acid and the oxidizer into the resin film occurs greatly. In the foregoing case, the insulating characteristic of the resin film sometimes deteriorates. When the content is higher than 10 wt %, an excessively large quantity of the hardening agent component sometimes denatures the composition of the resin. In the foregoing case, the reliability sometimes deteriorates.

The other components are exemplified by an inorganic compound which does not exert an influence on the formation of the rough surface and a filler constituted by resin. The inorganic compound is exemplified by silica, alumina and dolomite. The resin is exemplified by polyimide resin, polyacrylic resin, polyamideimide resin, polyphenylene resin, melanine resin and olefin resin. When any one of the foregoing fillers is contained, conformity of the thermal expansion coefficients can be established. Moreover, heat resistance and chemical resistance can be improved. As a result, the performance of the printed circuit board can be improved.

The resin film may contain solvent. The solvent is exemplified by ketone, such as acetone, methylethylketone or cyclohexane; aromatic hydrocarbon, such as ethyl acetate, butyl acetate, cellosolve acetate, toluene or xylene. The foregoing material may be employed solely or two or more materials may be mixed.

Figure 15:
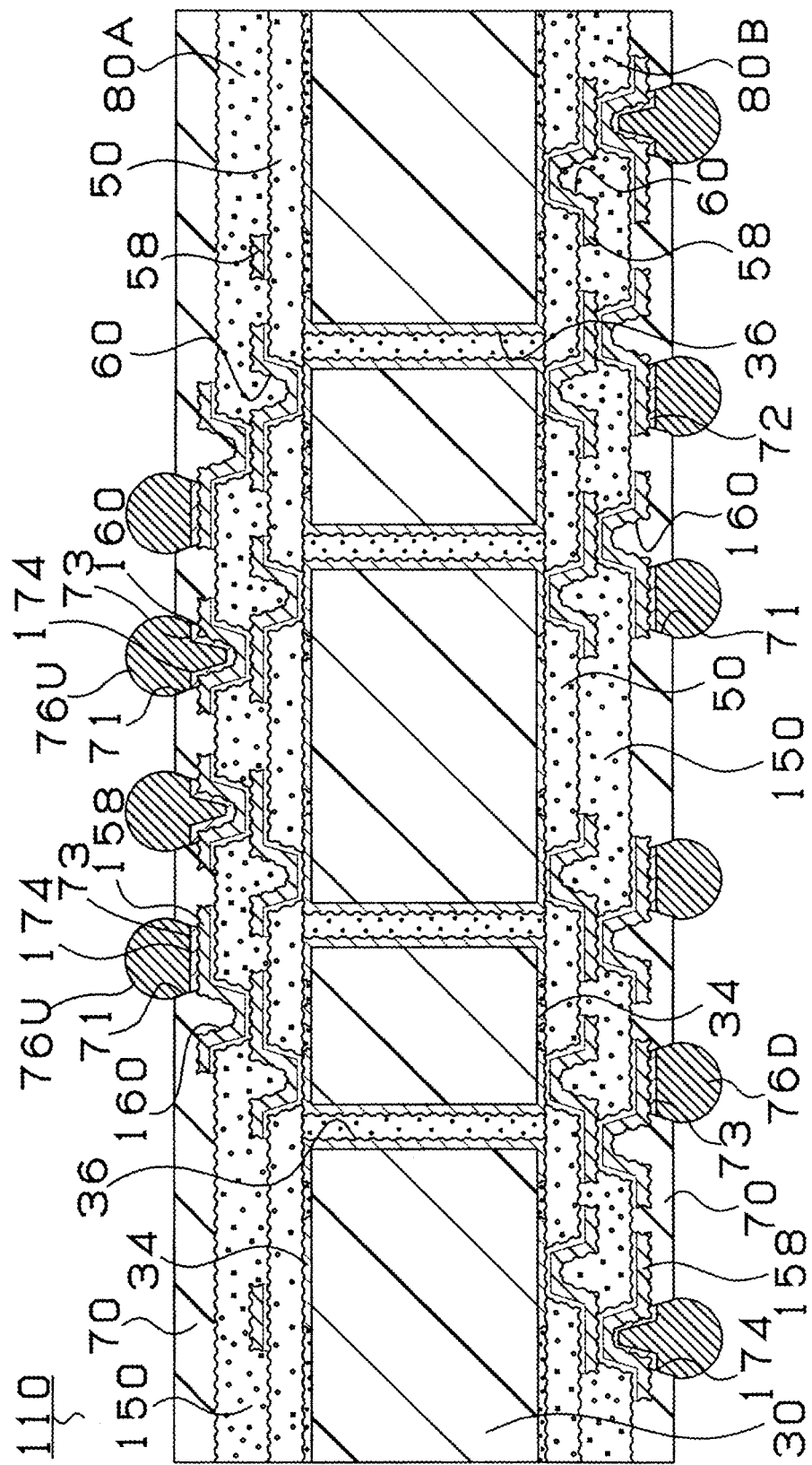
FIG. 15 is a cross-sectional view of the printed wiring board according to the first modification of the present invention.

A printed wiring board 110 according to the first modification of the present invention will next be described with reference to FIG. 15. In the first embodiment stated above, each solder pad 73 comprises of the tin layer 74 formed on the conductor circuit 158 or via 160. In the first modification, by contrast, the solder pad comprises of a gold layer 174 formed on the conductor circuit 158 or via 160. In the first modification, noble metal is used to coat the conductor circuits 158 and the vias 160, thus ensuring that the solder pads 73 have excellent corrosion resistance. In addition, the use of gold lower in resistance than tin can further increase high frequency characteristic, as compared with the first embodiment.

The thickness of the gold layer 174 is desirably 0.01 to 3 μm. If the thickness is less than 0.01 μm, portions which cannot completely cover the conductor circuit 158 or via 160 are generated, adversely influencing strength and corrosion resistance. Conversely, if the thickness exceeds 3 μm, the corrosion resistance is not improved, electronic characteristic is often deteriorated, and peeling occurs in the films. In addition, the gold layers become too expensive, adversely influencing cost-effectiveness. The thickness of the gold layer 174 is preferably 0.05 to 2 μm. Preferably, the thickness is 0.05 to 2 μm. More preferably, the thickness is in a range of 0.1 to 1 μm. In this range, no problem occurs even if there is a fluctuation in thickness.

Next, A. an interlayer resin insulating layer resin film, and B. resin filler used in a method for manufacturing the printed wiring board according to the first modification of the present invention will be described.

A. Manufacturing of Interlayer Resin Insulating Layer Resin Film 30 parts by weight of bisphenol A epoxy resin (epoxy equivalent: 469, Epicoat 1001 manufactured by Yuka Shell), 40 parts by weight of cresol novolac type epoxy resin (epoxy equivalent: 215, manufactured by Dainippon Ink and Chemicals, EpiclonN-673) and 30 parts by weight of phenol novolac resin including a triazine structure (phenol hydroxyl group equivalent: 120, manufactured by Dainippon Ink and Chemicals, PhenoliteKA-7052) are heated and molten while being agitated with 20 parts by weight of ethyl diglycol acetate and 20 parts by weight of solvent naphtha, and 15 parts by weight of terminally epoxidized polybutadiene rubber (manufactured by Nagase Chemicals Ltd., DenalexR-45EPT) and 1.5 parts by weight of crushed product of 2-phenyl-4,5-bis(hydroxymethyl)imidazole, 2 parts by weight of pulverized silica and 0.5 parts by weight of silicon-based defoaming agent are added, thereby preparing the epoxy resin composition. The obtained epoxy resin composition is coated on a PET film having a thickness of 38 μm so as to have a thickness of 50 μm after being dried by the roll coater, and dried for 10 minutes at 80 to 120° C., thereby manufacturing the interlayer resin insulating layer resin film.

B. Preparation of Resin Filler 100 parts by weight of bisphenol F type epoxy monomer (manufactured by Yuka Shell, molecular weight: 310, YL983U), 170 parts by weight of $SiO_2$ spheroidal particles having a silane coupling agent coated on surfaces thereof, a mean particle size of 1.6 μm, and a largest particle diameter of not more than 15 μm (manufactured by ADTEC, CRS 1101-CE) and 1.5 parts by weight of leveling agent (manufactured by San Nopco Ltd., PelenolS4) are input in the container, and agitated and mixed therein, thereby preparing resin filler having a viscosity of 45 to 49 Pa·s at 23±1° C. As hardening agent, 6.5 parts by weight of imidazole hardening agent (manufactured by Shikoku Chemicals, 2E4MZ-CN) is used.

A method for manufacturing the printed wiring board stated above with reference to FIG. 15 will next be described with reference to FIGS. 10 to 14.

(1) A copper-clad laminate 30A having copper foils 32 of 18 μm laminated on the both surfaces of the substrate 30 made of glass epoxy resin or BT (Bsmaleimide-Triazine) resin, whose thickness is 0.8 mm respectively, is used as a starting material (see FIG. 10(A)). This copper-clad laminate 30A is drilled, subjected to an electroless plating treatment, and etched into a pattern, thereby forming lower layer conductor circuits 34 and through holes 36 on the both surfaces of the substrate 30, respectively (see FIG. 10(B)).

(2) After washing and drying the substrate 30 having the through holes 36 and the lower layer conductor circuits 34 formed thereon, an oxidization treatment using an aqueous solution containing NaOH (10 g/l), NaClO$_2$ (40 g/l) and Na$_3$PO$_4$ (6 g/l) as an oxidization bath and a reduction treatment using an aqueous solution containing NaOH (10 g/l) and NaBH$_4$ (6 g/l) as a reduction batch are conducted to the substrate 30, thereby forming roughened surfaces 34α on the entire surfaces of the respective lower layer conductor circuits 34 including the through holes 36 (see FIG. 10(C)).

(3) After preparing the resin filler described in B above, layers of the resin filler 40 are formed on the portions in which the lower layer conductor circuits 34 are not formed on one surface of the substrate 30 (see FIG. 10(D)). Namely, using a squeezer, the resin filler 40 is forced into the through holes 36, and then dried at 100° C. for 20 minutes. Next, a mask having openings in portions corresponding to the lower layer conductor circuit 34 non-formation regions is put on the substrate 30, layers of the resin filler 40 are formed in the concave lower layer conductor circuit 34 non-formation regions are formed using the squeezer, and dried at 100° C. for 20 minutes. Thereafter, one surface of the substrate 30 is polished by belt sander polishing using abrasive paper of #600 (manufactured by Sankyo Rikagaku Co.) so as not to leave the resin filler 40 on the surfaces of the lower layer conductor circuits 34 and those of the lands 36a of the through holes 36, and buffed to remove scratches caused by the belt sander polishing. A series of these polishing treatments are similarly conducted to the other surface of the substrate 30. The resin filler 40 is then heated at 100° C. for 1 hour and at 150° C. for 1 hour and hardened (see FIG. 11(A)).

(4) After washing and acid degreasing the substrate 30, etchant is sprayed onto the both surfaces of the substrate 30 by the spray and the surfaces of the lower layer conductor circuits 34 and those of the lands 36a of the through holes 36 are subjected to light etching, thereby forming roughened surfaces 34β on the entire surfaces of the respective lower layer conductor circuits (see FIG. 11(B)).

As the etchant, etchant (manufactured by Mech, Mech-Etch Bond) comprising of 10 parts by weight of an imidazole copper (II) complex, 7 parts by weight of glycolic acid and 5 parts by weight of potassium chloride is used.

(5) Interlayer resin insulating layer resin films slightly larger than the substrate 30 manufactured in A are put on the both surfaces of the substrate 30, respectively, temporarily press-fitted at pressure of 4 kgf/cm$^2$, a temperature of 80° C. and press-fit time of 10 seconds and cut, and bonded using a vacuum laminator by the following method, thereby forming interlayer resin insulating layers 50 (see FIG. 11(C)). Namely, the interlayer resin insulating layer resin films are actually press-fitted onto the substrate 30 at vacuum of 0.5 Torr, pressure of 4 kgf/cm$^2$, a temperature of 80° C. and press-fit time of 60 seconds, and then heated and hardened at 170° c. for 30 minutes.

(6) A mask 49 having holes 49a formed therein is mounted on the substrate, and openings 51 for vias are formed in the interlayer resin insulating layers 50 by a carbonic acid gas laser (see FIG. 11(D)). The openings 51 can be formed by an exposure-development treatment instead of the laser.

(17) The substrate 30 having the via openings 51 formed therein is immersed in an 80° C.-solution containing 60 g/l of permanganic acid for 10 minutes to melt and remove epoxy resin particles existing on the surfaces of the interlayer resin insulating layers 50, thereby forming roughened surfaces 50α on the surfaces of the respective interlayer resin insulating layers 50 including the inner walls of the via openings 51 (see FIG. 12(A)).

(8) Next, the substrate 30 completed with the above-stated treatments is immersed in neutralizer (manufactured by Shipley) and then washed. Further, a palladium catalyst is added to the surface of the roughened substrate 30 (a roughening depth of 3 μm), thereby attaching catalyst nuclei to the surfaces of the interlayer resin insulating layers 50 and the inner wall surfaces of the large via openings 51.

(9) The substrate 30 is immersed in an electroless copper plating aqueous solution having the following compositions, and electroless copper plated films 53 having a thickness of 0.6 to 3.0 μm are formed on the entire roughened surfaces 50α (see FIG. 12(B)).

[Electroless Plating Aqueous Solution]

| | |
|---|---|
| NiSo$_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-bipyridyl | 40 mg/l |
| Polyethylene glycol (PEG) | 0.10 g/l |

[Electroless Plating Conditions]

Solution temperature of 35° C. for 40 minutes.

(10) After forming resists 54 of a predetermined pattern on the substrate 30, electroplating is conducted under the following conditions to form electroplated films 56 (see FIG. 12(C)).

[Electroplating Aqueous Solution]

| | |
|---|---|
| Sulfuric acid | 2.24 mol/l |
| Copper sulfate | 0.26 mol/l |
| Additive | 19.5 ml/l |
| (Kalapacid HL manufactured by Atotech Japan) | |

[Electroplating Conditions]

| | |
|---|---|
| Current density | 1 A/dm$^2$ |
| Time | 65 minutes |
| Temperature | 22 ± 2° C. |

(11) After peeling off the resists 54, the electroless plated films 53 under the resists 54 are etched away, thereby forming conductor circuits 58 and vias 60 each comprising of the electroless plated film 53 and the electroplated film

56 (see FIG. 12(D)). Thereafter, the etchant is sprayed onto the both surface of the substrate 30 and the surfaces of the conductor circuits 58 and vias 60 are etched, thereby forming roughened layers 58α on the respective surfaces (see FIG. 13(A)).

(12) The steps (5) to (11) stated above are repeated, thereby forming interlayer resin insulating layers 150, conductor circuits 158 and vias 160. The etchant is sprayed on the both surfaces of the substrate and the surfaces of the conductor circuits 158 and vias 160 are etched, thereby forming roughened layers 158α on the respective entire surfaces (see FIG. 13(B)). As the etchant, a mixture of 10 parts by weight of an imidazole copper (II) complex, 7 parts by weight of glycolic acid, 5 parts by weight of potassium chloride and 78 parts by weight of ion exchanged water is used.

(13) 46.67 parts by weight of oligomer (molecular weight of 4000) which is obtained by forming 50% of epoxy groups of cresol novolac type epoxy resin (manufactured by Nippon Kayaku Co., Ltd.) into an acrylic structure dissolved in diethylene glycol dimethyl ether (DMDG) so as to be 60 tw % and which imparts photosensitive characteristic, 15 parts by weight of 80 wt % of bisphenol A type epoxy resin (manufactured by Yuka Shell, product name: Epicoat 1001) dissolved in methylethyl ketone, 1.6 parts by weight of imidazole hardening agent (manufactured by Shikoku Chemicals, product name: 2E4MZ-CN), 4.5 parts by weight of polyhydric acryl monomer which is a photosensitive monomer (manufactured by Kyoei Chemical, product name: R604), 1.5 parts by weight of polyhydric acryl monomer (manufactured by Kyoei Chemical, product name: DPE6A), and 0.71 parts by weight of dispersing defoaming agent (manufactured by San Nopco Ltd., product name: S-65) are input in a container, agitated and mixed to prepare mixture compositions. 2.0 parts by weight of benzophenone (manufactured by Kanto Kagaku) serving as photoinitiator and 0.2 parts by weight of Michler's ketone (manufactured by Kanto Kagaku) serving as photosensitizer are added to the mixture compositions, thereby obtaining a solder resist composition (an organic resin insulating material) adjusted to have a viscosity of 2.0 Pa·s at 25° C.

The viscosity is measured by using No. 4 rotor of a B-type viscometer (DVL-B type, manufactured by Tokyo Keiki) when the velocity is 60 rpm, and using No. 3 rotor thereof when the velocity is 6 rpm.

(14) The solder resist compositions prepared in (13) are coated on the both multi-layer wiring surfaces of the substrate 30 each by a thickness of 20 μm, respectively, and dried for 20 minutes at 70° C. and for 30 minutes at 70° C. Thereafter, a photomask on which a pattern of solder resist opening portions are drawn and which has a thickness of 5 mm, is fixedly attached to each solder resist composition, exposed with ultraviolet rays of 1000 mJ/cm², and developed with DMTG solution, thereby forming opening portions 71.

Further, heat treatments are conducted for 1 hour at 80° C., 1 hour at 100° C., for 1 hour at 120° C., and for 3 hours at 150° C., respectively, to harden the solder resist layers compositions, thus forming solder resist layers 70 each having the opening portions 71 and a thickness of 20 μm (see FIG. 13(C)). As the solder resist compositions, commercially available solder resist compositions can be also used.

(15) The substrate having the solder resist layers (organic resin insulating layers) 70 formed thereon is degreased by alkali degreasing. While the alkali degreasing is conducted, neutral degreasing or acid degreasing can be conducted.

(16) The substrate on which the solder resist layers 70 are formed is immersed in etchant of sulfuric acid—hydrogen peroxide, cuprous chloride or ferrous chloride, scraping off the surface layers of the conductor circuits 158 and the vias 160 (see FIG. 14(A)).

(17) The substrate on which the solder resist layers 70 are formed is immersed in acid such as sulfuric acid or hydrochloric acid, thereby adjusting the surface potentials of the conductor circuits 158 and the vias 160 and scraping off the oxide films (see FIG. 14(B)).

(18) The substrate is immersed in a gold substitutional plating solution having the following compositions to form gold layers 174 having a thickness of 0.03 to 0.05 μm on the surfaces of the conductor circuits 158 and the vias 160 exposed from the respective openings 71 of the solder resist, thereby forming solder pads 73 (see FIG. 14(C)). In the first modification, gold cyanide is used for the gold substitutional plating solution. Metal layers are formed in solder formation portions and external terminal formation portions, respectively.

Gold Substitutional Plating Solution

| Potassium cyanide | 6 g/l |
|---|---|
| tetrahydroborate | 40 ml/l |
| Temperature | 70° C. |
| Immersion time | 3 minutes |

(18) Thereafter, a solder paste made of eutectic metals of Sn/Pb, Sn/Sb, Sn/Ag, Sn/Ag/Cu or Sn/Cu is printed on each opening portion 71 of the solder resist layers 70, and reflow is conducted at 200 to 250° C., thereby forming the BGA structure solder bumps 76U and BGAs 76D similarly to the first embodiment described above with reference to FIG. 9. As a result, the printed wiring board 210 including the solder bumps 76U and the GBA's 76D can be obtained (see FIG. 15). The solders may be either the same or different. For example, the melting point of the conductive adhesive for the solder bumps is preferably higher than that of the conductive adhesive for the BGAs. This can avoid trouble at the time of packaging the BGAs.

In the first modification, since the noble metal constituting the gold layer 174 is soft gold, it is possible to form single-layer gold films 174 on the conductor circuits 158 and the vias 160 without making nickel intervene and diffusing the gold layers to copper. Namely, according to the prior art, hard gold which enables wire bonding to gold wires is continuously used as gold at the time of establishing connection by the solder pads. Since the hard gold is diffused into the conductor circuits made of copper by electroless plating, films cannot be formed unless the nickel layers intervene. In the first modification, by contrast, it is possible to directly form films on the conductor circuits 158 made of copper and the vias 160. While gold is used herein, platinum or palladium can be used.

A printed wiring board 210 according to the second modification of the present invention will be described with reference to FIG. 16. In the first embodiment stated above, each solder pad 73 comprises of the tin layer 74 formed on the conductor circuit 158 and the via 160. In the second modification, by contrast, the solder pad 73 comprises of a silver layer 274 formed on the conductor circuit 158 and the via 160. In the second modification, noble metal is used to cover the conductor circuits 158 and the vias 160, thus ensuring the good corrosion resistance of the solder pads 73. In addition, since silver having the lowest resistance is used, it is possible to further improve the high frequency characteristic, as compared with the first embodiment and the first modification.

Manufacturing steps of the printed wiring board in the second modification will be described. Manufacturing steps (1) to (17) of this second modification are equal to those of the first modification described above with reference to FIGS. 10 to 14. Therefore, step (18) and the following will be described.

Figure 16:
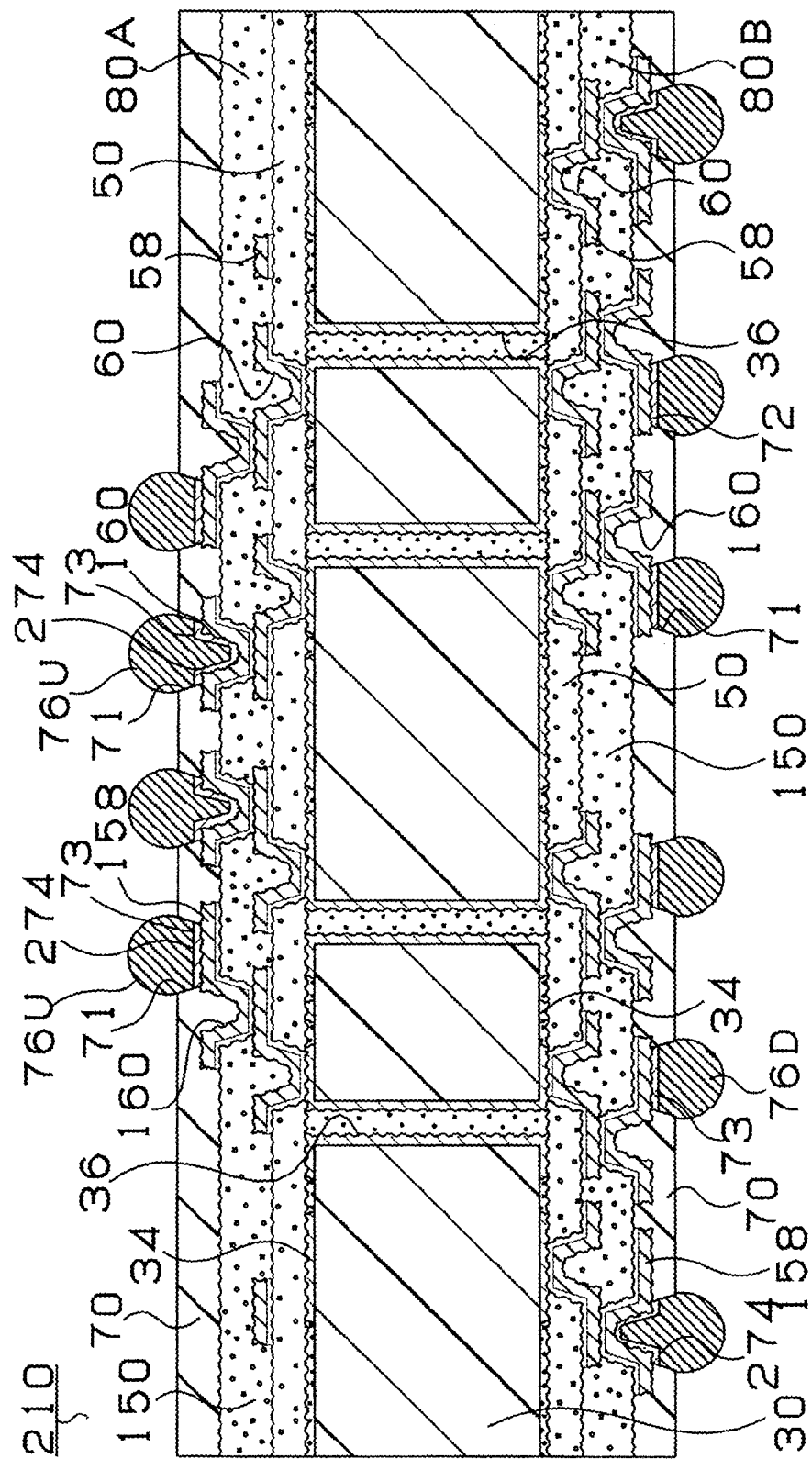
FIG. 16 is a cross-sectional view of a printed wiring board according to the second modification of the present invention.

(18) The substrate is immersed in a silver substitutional plating solution having the following compositions to form silver layers 274 having a thickness of 0.7 to 0.11 µm on the surfaces of the conductor circuits 158 and the vias 160 exposed from the respective openings 71 of the solder resists, thereby forming solder pads 73 (see FIG. 16). In the second modification, silver nitrate is used for the silver substitutional plating solution. Silver layers are formed in solder formation portions and external terminal formation portions, respectively.

Silver Substitutional Plating Solution

| Silver nitrate | 8 g/l |
| Ammonium compound | 30 ml/l |
| Sodium nitrate · 5 hydrate | 60 ml/l |
| Temperature | 70° C. |
| Immersion time | 5 minutes |

(19) Thereafter, a treatment for washing away silver adhering to the surfaces of the solder resist layers 70 is conducted.

(20) A solder paste made of eutectic metals of Sn/Pb, Sn/Ag, Sn/Ag/Cu or Sn/Cu is printed on each opening portion 71 of the solder resist layers 70, and reflow is conducted at 200 to 250° C., thereby forming the BGA structure solder bumps 76U and BGAs 76D similarly to the first embodiment described above with reference to FIG. 9 (see FIG. 16). The opening diameter is 100 to 600 µm. The solders may be either the same or different. For example, the melting point of the conductive adhesive for the solder bumps is preferably higher than that of the conductive adhesive for the BGAs. This can avoid trouble at the time of packaging the BGAs.

Further, in the second modification, the conductive adhesive for connecting the solders or BGAs which constitute the solder bumps 76U or BGAs 76D is made of eutectic metals of Sn/Ag or Sn/Ag/Cu and contains silver, thus ensuring high adhesion of the adhesive to the solder pads 73 each including the silver layer 274. The second modification is congenital to the solders which do not contain lead (Sn/Ag, Sn/Ag/Cu, and Sn/Cu), so that these solders can be suitably used in this modification.

In the first to second modifications stated above, the metal layer of each solder pad is formed by substitutional plating. Alternatively, it can be formed by electroless plating with catalyst intervening. The electroless plating is less expensive. However, without the catalyst, non-reaction tends to occur. Besides, it is difficult to control film thickness.

As the first comparison, a gold layer (thickness of 0.3 µm) is formed on a nickel layer (thickness of 5 µm) as a metal pad for each of the exposed conductor layers almost similar to those in the first embodiment.

[Solder Bump Test]

The tensile strength of the solder bumps in the first embodiment, the first modification, the second modification, and the first comparison are measured before and after reliability tests, respectively. Dummy IC's are packaged and the voltage drop quantity of power supplies is determined. The results are compared as shown in FIG. 19 as a table. In addition, FIG. 18(A) shows the correlation between the thickness and strength for gold. At a thickness of about 0.03 µm, the strength nears 800 mN/bump. If the thickness exceeds 3 µm, peeling occurs in the films and strength deterioration starts. The same trend is seen for the other metals (silver, tin, platinum and palladium).

The tensile strength is measured when melting each solder bump formed, burying the tip end portion of a peel measurement equipment, stretching the resultant molten bump in a vertical direction to break the bump.

As a result, in the embodiment, no problems occur to the tensile strength, operation test and the voltage drop quantity at the test, irrespective of the compositions of the solder.

The voltage drop will be described with reference to FIG. 18 (B. In FIG. 18(B), the vertical axis indicates voltage and the horizontal axis indicates time. That is, FIG. 18(B) shows time-voltage correlation. If the semiconductor is actuated, a current is carried to each capacitor (capacitive load) in the semiconductor. Due to this, particularly at initial actuation, voltage drop occurs momentarily. Thereafter, since the current is gradually filled into each capacitor or the like, the voltage drop state is returned to a state of no voltage drop. The maximum voltage drop will be referred to as "maximum voltage drop quantity". As the frequency of an IC becomes higher (which means that the frequency increases to 1 GHz, 2 GHz, . . . ), momentary power consumption quantity increases and the maximum voltage drop quantity increases, accordingly. At this moment, if the voltage drops by a certain quantity or more, operation defect momentarily occurs, which sometimes causes malfunction. It is therefore, necessary to increase the capacity of power supplied to the semiconductor and to decrease the resistance of a power supply line. In the first embodiment, the first modification and the second modification, a voltage drop of 0.1(V) or more at which malfunction possibly occurs does not appear, so that it is determined that no malfunction occurs.

Further, the drop quantity of the tensile strength after the reliability test is 2 to 3%. Therefore, no problem occurs with respect to the strength.

In the comparison, by contrast, the tensile strength is lower than that in the embodiment and the drop quantity after the reliability test is 12 to 14%. This shows that there is a problem with the adhesion strength of the adhesion of a solder bump to a solder pad. The voltage drop quantity sometimes exceeds 0.1(V), thus often causing malfunction.

[BGA Test]

The tensile strength of the BGAs in the first embodiment, the first modification, the second modification, and the first comparison are measured before and after reliability tests, respectively. Dummy IC's are packaged and the voltage drop quantity of power supplies are determined. The results are compared as shown in FIG. 21 as a table. In addition, FIG. 20(A) shows the correlation between the thickness and strength for gold. At a thickness of about 0.03 µm, the strength nears 9.8 N/pin. If the thickness exceeds 3 µm, peeling occurs in the films and strength deterioration starts. The same trend is seen for the other metals (silver, tin, platinum and palladium).

The tensile strength is measured when directly pinching each BGA, stretching the BGA in a vertical direction to break the BGA.

As a result, in the first embodiment, the first modification and the second modification, no problems occur to the tensile strength, operation test and the voltage drop quantity at the test, irrespective of the compositions of the solder. In addition, a voltage drop of 0.1(V) or more at which malfunction possibly occurs does not appear, so that it is determined that no malfunction occurs.

Further, the drop quantity of the tensile strength after the reliability test is 2 to 3%. Therefore, no problem occurs with respect to the strength.

In the first comparison, by contrast, the tensile strength is lower than that in the embodiment and the drop quantity after the reliability test is about 12%. This shows that there is a problem with the adhesion strength of the adhesion of a BGA to a solder pad. The voltage drop quantity sometimes exceeds 0.1(V), thus often causing malfunction.

Second Embodiment

The second embodiment of the present invention will be described hereinafter with reference to the drawings.

Figure 24:
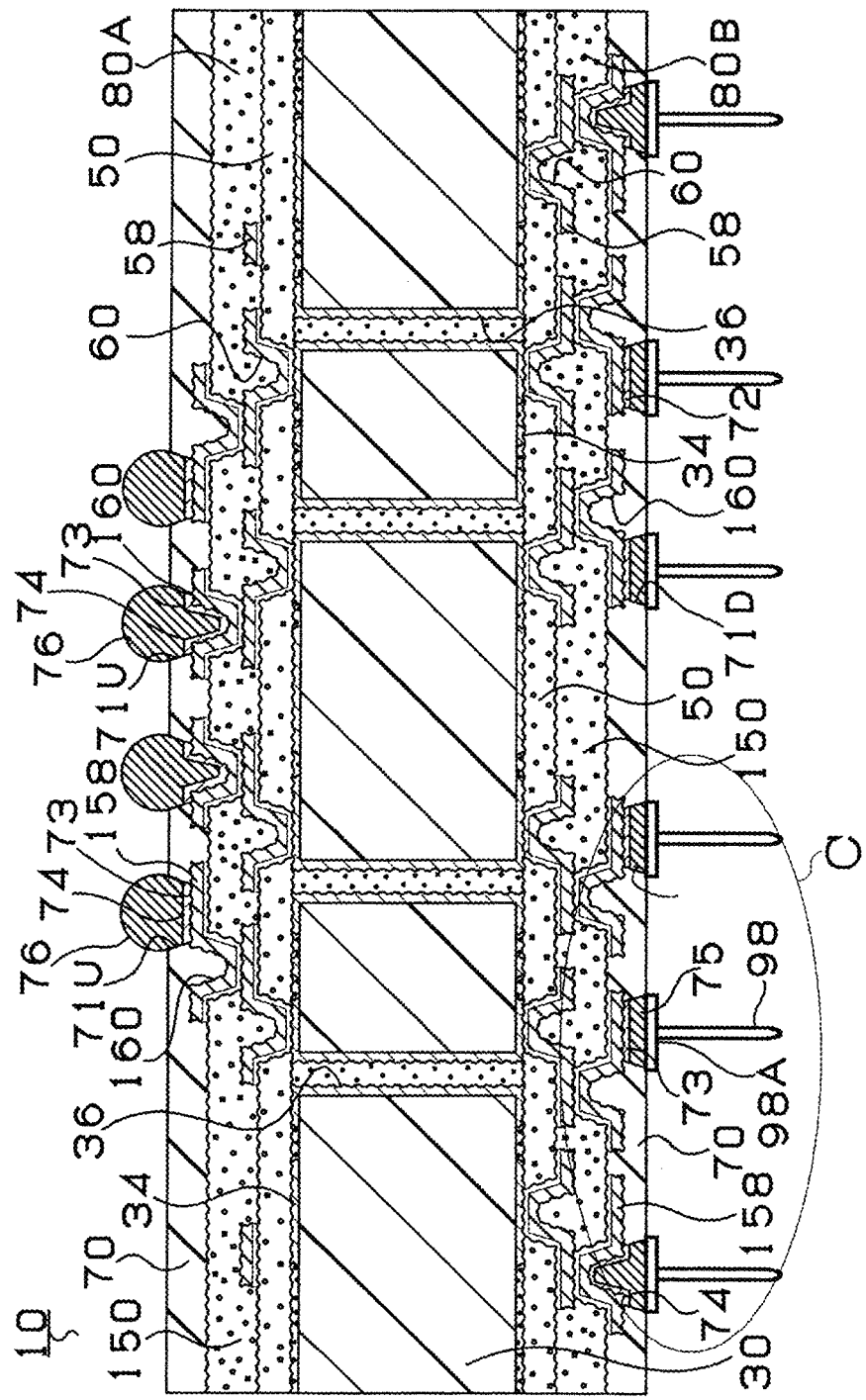
FIG. 24 is a cross-sectional view of the printed wiring board according to the second embodiment.

The configuration of a printed wiring board according to the second embodiment of the present invention will first be described with reference to FIGS. 24 to 26. FIG. 24 shows the cross-section of a printed wiring board 10, and FIG. 25 shows a state in which an IC chip 90 is mounted on the printed wiring board shown in FIG. 24.

As shown in FIG. 24, the printed wiring board 10 has buildup wiring layers 80A and 80B formed on the front and rear surfaces of a core substrate 30, respectively. Each of the buildup wiring layers 80A and 80B comprises of an interlayer resin insulating layer 50 on which conductor circuits 58 and vias 60 are formed, and an interlayer resin insulating layer 150 on which conductor circuits 158 and vias 160 are formed. The buildup wiring layer 80A is connected to the buildup wiring layer 80B via through holes 36 formed in the core substrate 30. A solder resist layer 70 is formed on the interlayer resin insulating layer 150, and solder bumps 76 are formed on the conductor circuits 158 and the vias 160 through the upper-side opening portions 71U of the solder resists 70 and conductive connection pins 98 are formed on the conductor circuits 158 and the vias 160 through the lower-side opening portions 71D, respectively.

Figure 25:
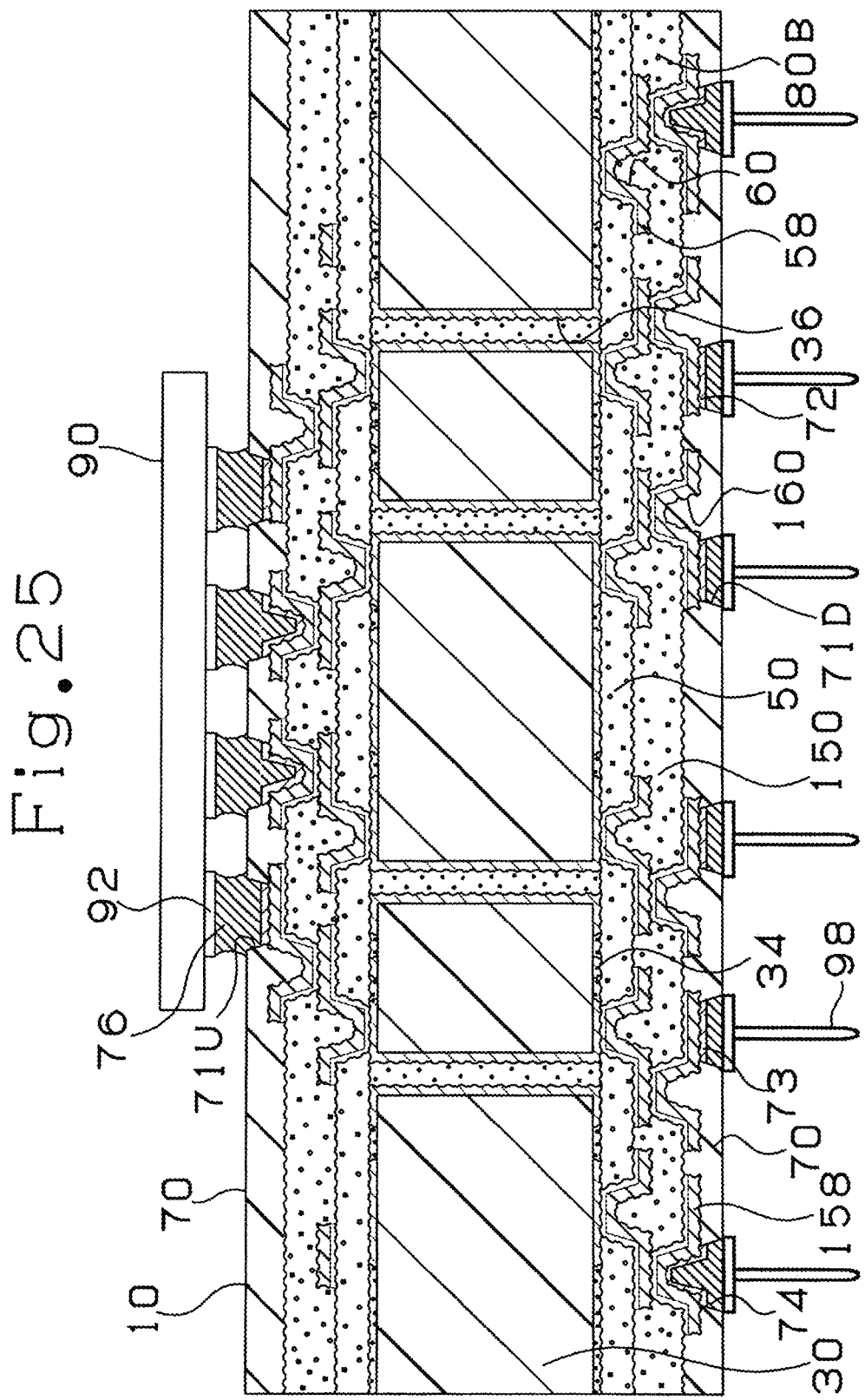
FIG. 25 is a cross-sectional view showing a state in which an IC chip is mounted on the printed wiring board according to the second embodiment.
Figure 27:
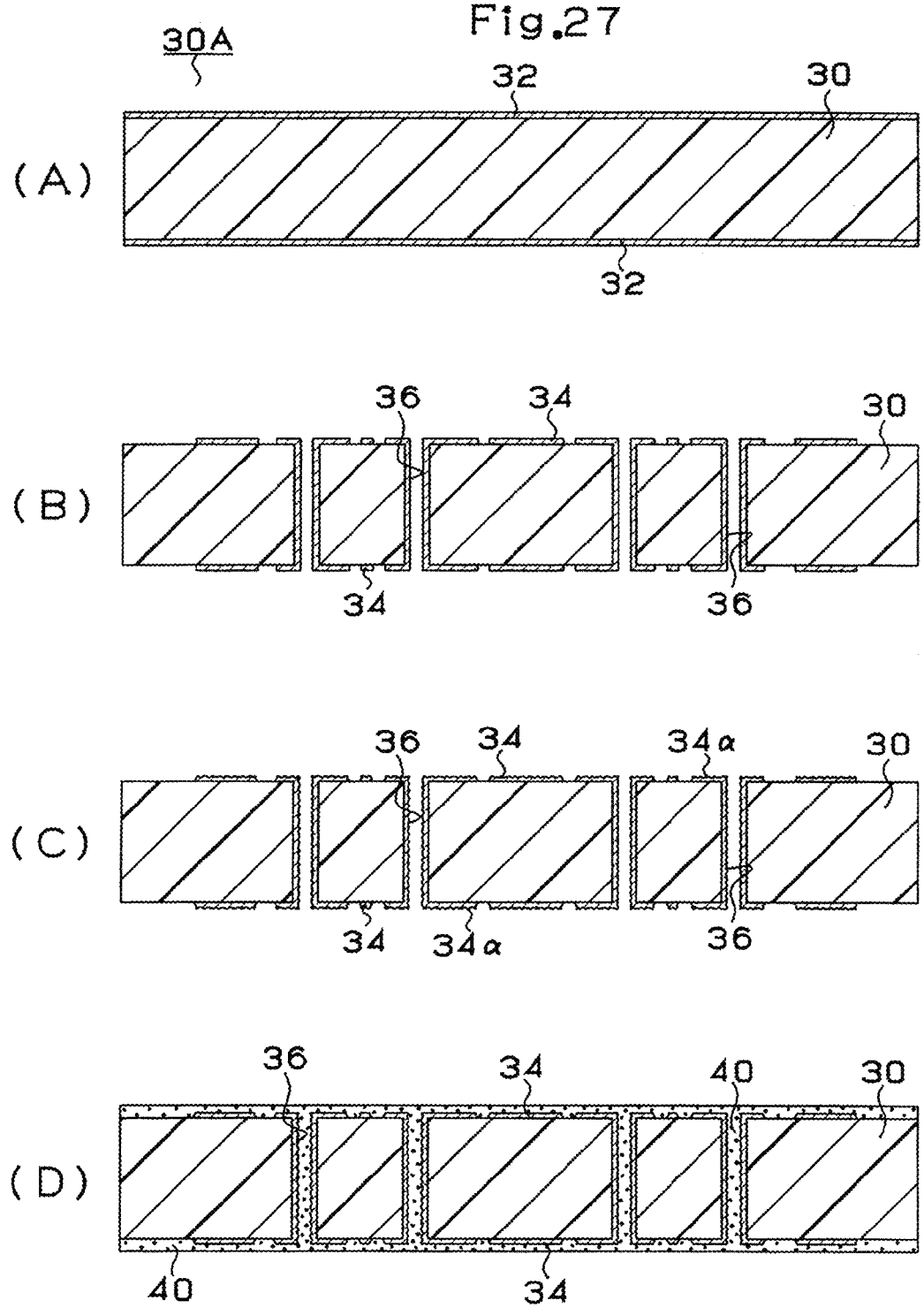
FIGS. 27(A), (B), (C) and (D) are manufacturing step diagrams for a printed wiring board according to the third modification of the present invention.
Figure 28:
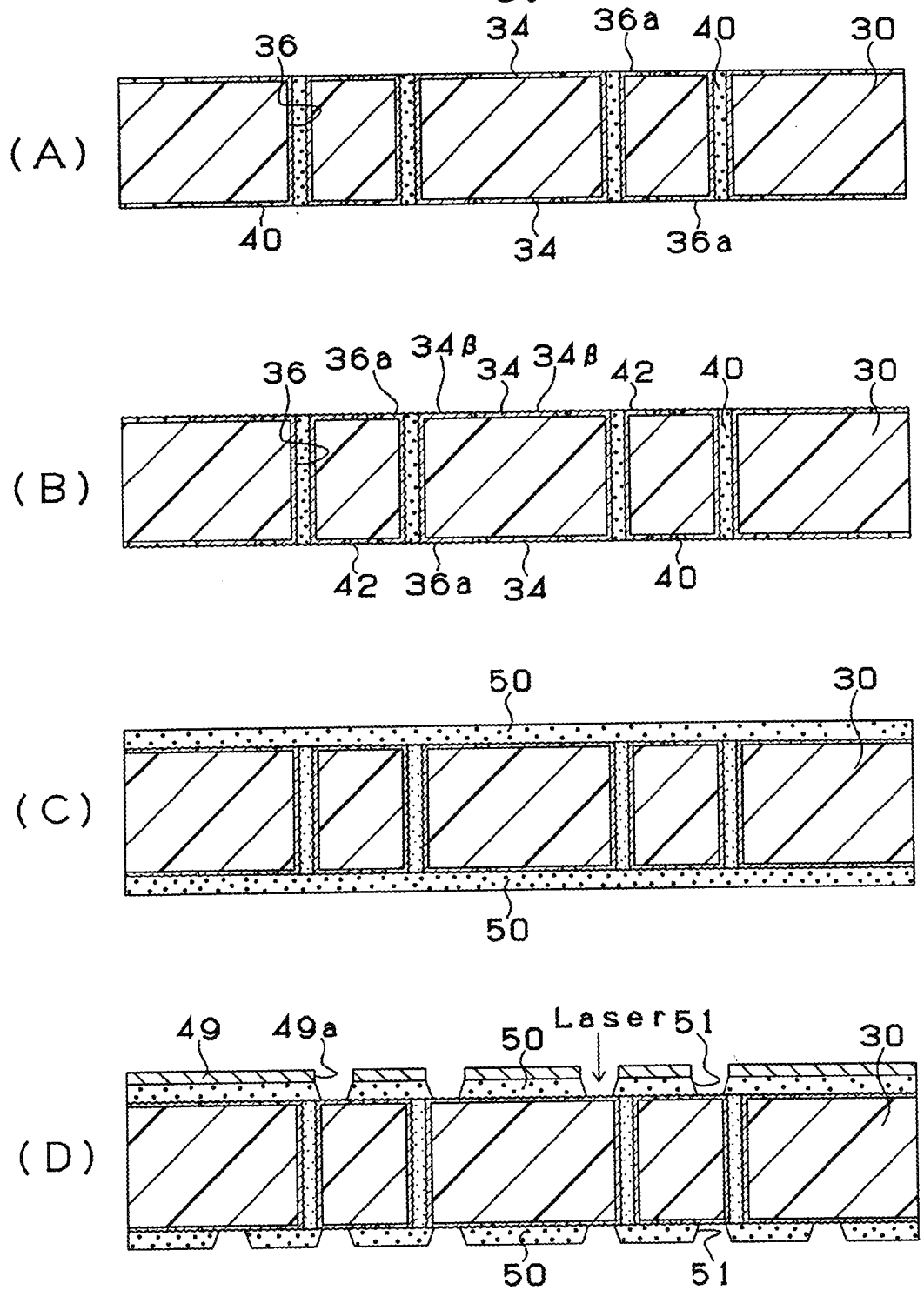
FIGS. 28(A), (B), (C) and (D) are manufacturing step diagrams for the printed wiring board according to the third modification of the present invention.
Figure 29:
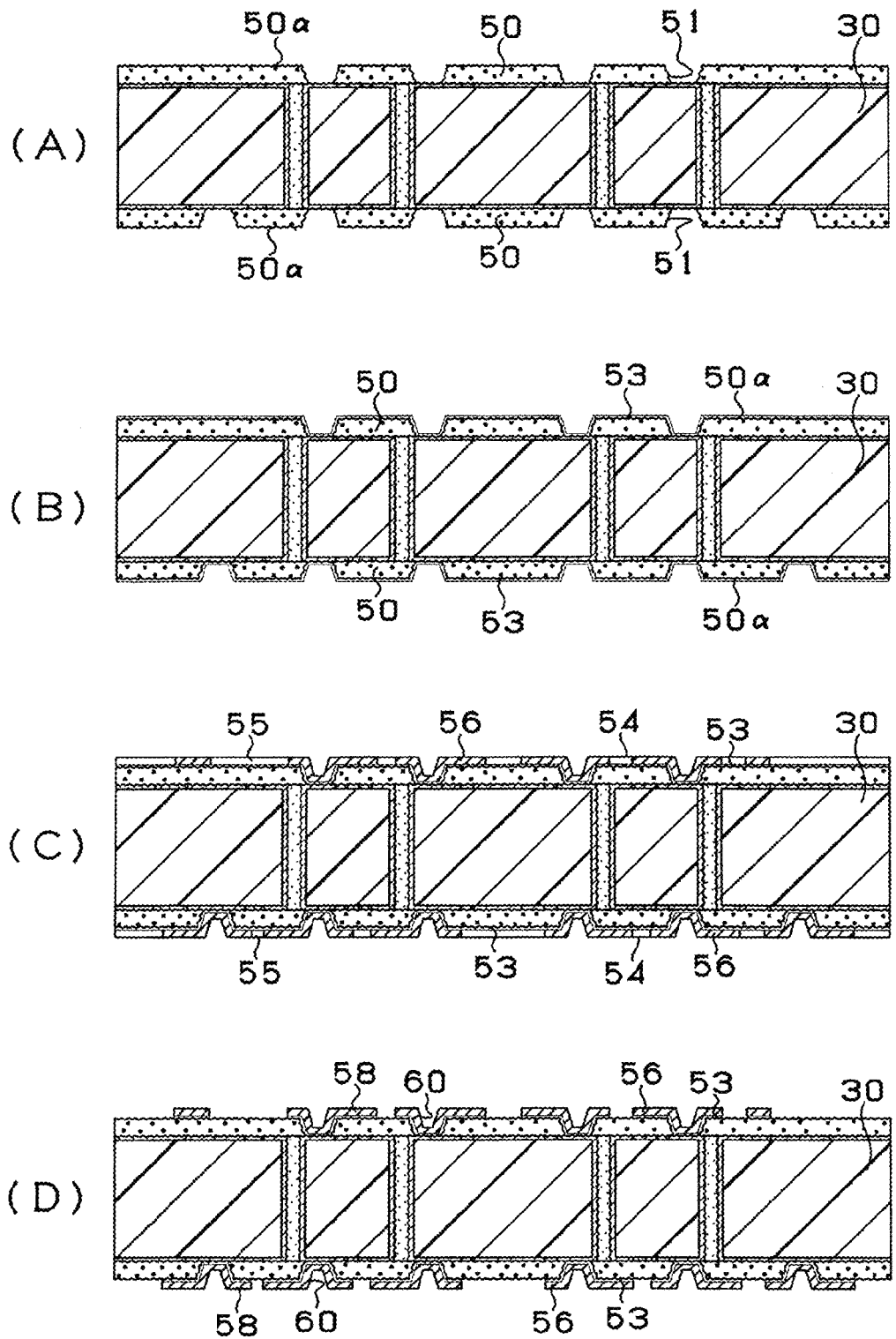
FIGS. 29(A), (B), (C) and (D) are manufacturing step diagrams for the printed wiring board according to the third modification of the present invention.
Figure 31:
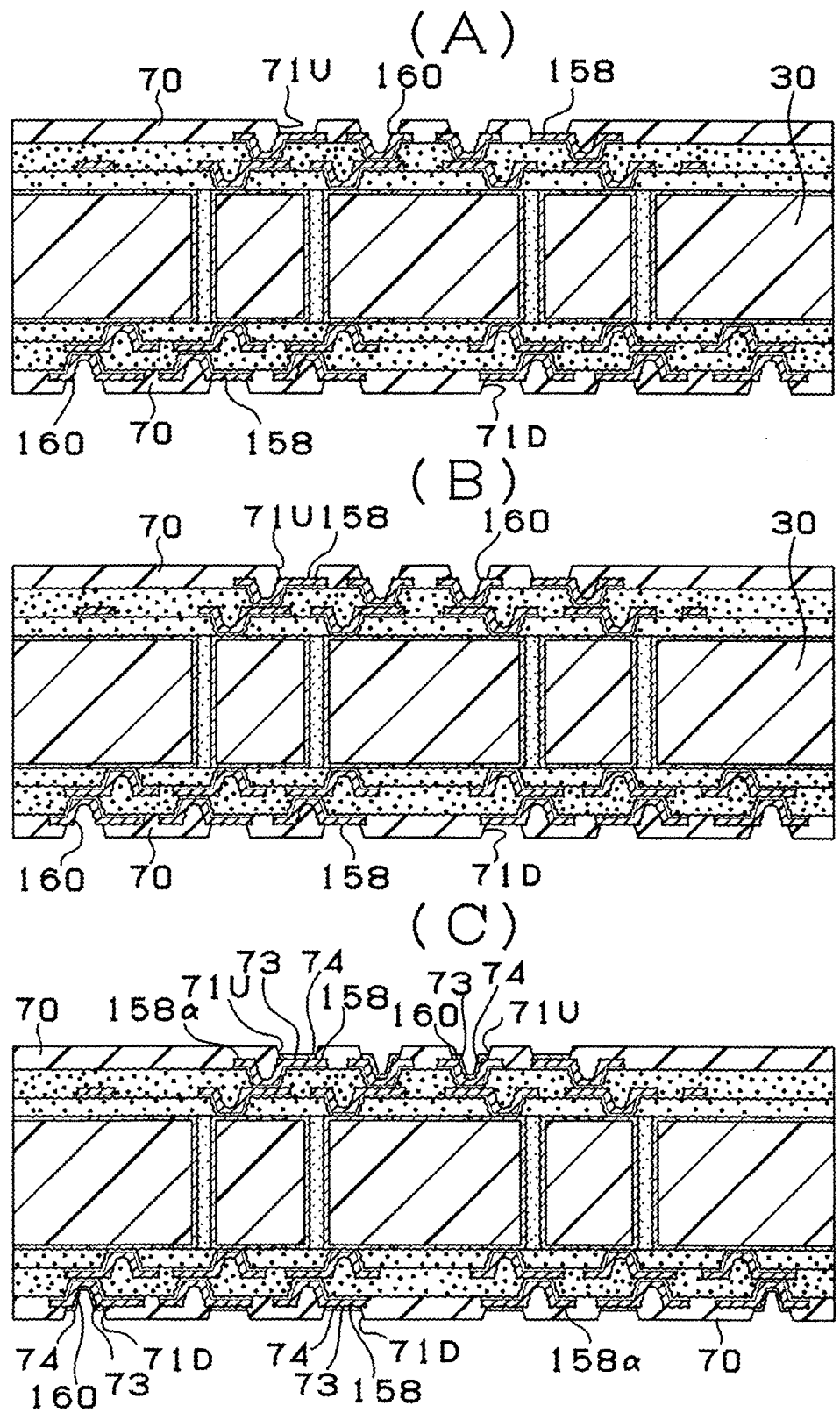
FIGS. 31(A), (B) and (C) are manufacturing step diagrams for the printed wiring board according to the third modification of the present invention.

As shown in FIG. 25, the solder bumps 76 on the upper side of the printed wiring board 10 are connected to the respective pads 92 of the IC chip 90, whereas the conductive connection pins 95 on the lower side thereof are connected to the respective sockets of the daughter board, not shown.

As shown in FIG. 26(C) which is an enlarged view of a region surrounded by an ellipse C shown in FIG. 24, a tin layer (single metal layer) 74 is provided on each of the conductor circuits 158 and vias 160 exposed through the opening portions 71D of the solder resists 70, and a solder pad 73 is formed on the tin layer 74. The conductive connection pins 98 are attached onto the respective solder pads 73 through conductive adhesive 75.

Figure 34:
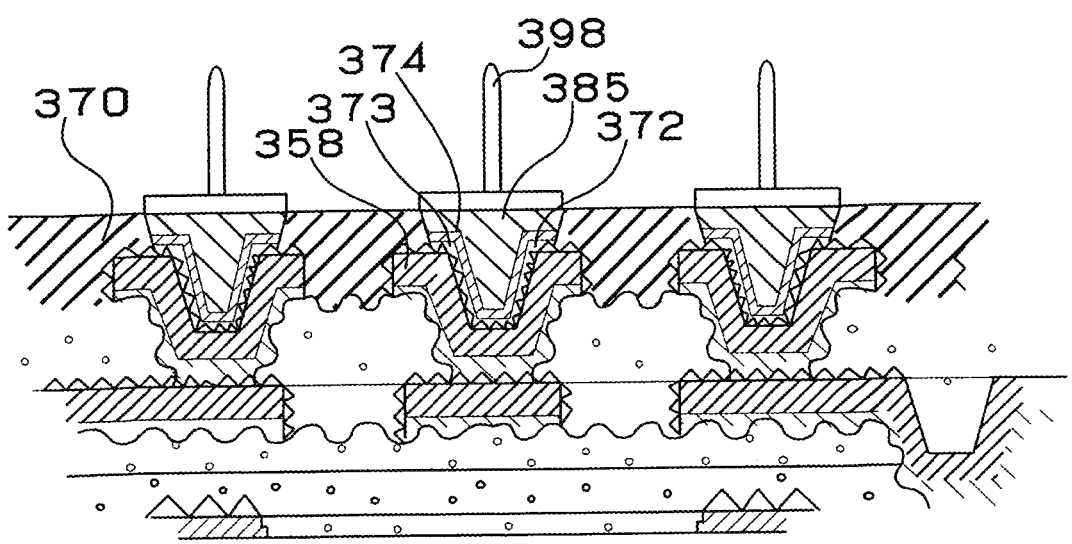
FIG. 34 is a cross-sectional view of the connection part of a conductive connection pin on the printed wiring board of the prior art.

On the printed wiring board 10 in the second embodiment, since the single tin layer 74 is provided on each of the conductor circuits 158 and vias 160 and the conductive adhesive 75 is formed thereon, a signal propagation rate can be increased, as compared with the printed wiring board of the prior art on which the two metal layers are formed as described above with reference to FIG. 34. In addition, due to lack of the nickel layers, manufacturing cost can be decreased.

The thickness of the tin layer 74 is preferably 0.01 to 3.0 µm. If the thickness is less than 0.01 µm, portions which cannot completely cover the conductor circuit 158 or via 160 are generated, adversely influencing strength and corrosion resistance. Conversely, if the thickness exceeds 3.0 µm, the corrosion resistance is not improved. Further, with such a thickness, peeling occurs in the film, thus deteriorating the strength. Besides, it is difficult to form a tin layer of not less than 1.0 µm by substitutional plating. The thickness is more preferably 0.05 to 0.5 µm. In this range, no problem occurs even if there is somewhat a fluctuation in thickness.

On the printed wiring board 10 in this embodiment, a roughened layer 158α is formed on the surface of each of the conductor circuits 158 and vias 160 as shown in FIG. 26(C). Due to this, the adhesion between the conductor circuit 158 or the via 160 and the solder resist layer 70 is high.

Furthermore, in the second embodiment, the solder bumps 76 and the conductive adhesive 75 are eutectic metals of Sn/Pb, Sn/Sb, Sn/Ag or Sn/Ag/Cu. Since they contain tin, they strongly adhere to the solder pads 73 each of which includes the tin layer 74.

Now, a method for manufacturing the printed wiring board stated above with reference to FIG. 24 will be described with reference to FIGS. 1 to 23. Since the steps (1) to (9) are equal to those of the first embodiment described above with reference to FIGS. 1 to 3, they will not be described herein.

(10) After peeling away the plating resists 54 by 5% NaOH, the Ni/Cu metal layers 52 under the plating resists 54 are etched with a solution mixture of sulfuric acid and hydrogen peroxide and molten and removed, and conductor circuits 58 and vias 60 each comprising of the Ni/Cu metal layer 52 and the electrolytic copper-plated member 56 (see FIG. 3(D)). Spraying the etchant onto the both surfaces of the substrate 30 by the spray, and etching the surfaces of the conductor circuits 58 and the vias 60, roughened surfaces 58α are formed on the respective surfaces (see FIG. 22(A)).

(11) By repeating the above steps (5) to (9), the interlayer resin insulating layers 150, the conductor circuits 158, and the vias 160 are formed. By spraying the etchant onto the both surfaces of the substrate by the spray and etching the surfaces of the conductor circuits 158 and the vias 160, roughened layers 158α are formed on the respective surfaces (see FIG. 22(B)). As the etchant, a mixture of 10 parts by weight of an imidazole copper (II) complex, 7 parts by weight of glycolic acid, 5 parts by weight of potassium chloride and 78 parts by weight of ion exchanged water is used.

(12) Next, solder resist composition is obtained similarly to the first embodiment.

(13) The solder resist compositions are coated on the both surfaces of the substrate 30 each by a thickness of 20 µm, respectively, and dried for 20 minutes at 70° C. and for 30 minutes at 70° C. Thereafter, a photomask on which a pattern of solder resist opening portions 71U or 71D are drawn and which has a thickness of 5 mm, is fixedly attached to each solder resist layer 70, exposed with ultraviolet rays of 1000 mJ/cm$^2$, and developed with DMTG solution, thereby forming opening portions 71U or 71D having a diameter of 200 µm. Further, heat treatments are conducted for 1 hour at 80° C., for 1 hour at 100° C., for 1 hour at 120° C., and for 3 hours at 150° C., respectively, to harden the solder resist layers 70, thus forming the solder resist layers 70 each having the opening portions 71U or 71D and a thickness of 20 µm (see FIG. 22(C)). FIG. 26(A) shows the enlarged opening 71D shown in an ellipse C in FIG. 22(C).

(14) The substrate having the solder resist layers (organic resin insulating layers) 70 formed thereon is degreased by alkali degreasing. While the alkali degreasing is conducted, neutral degreasing or acid degreasing can be conducted.

(15) The substrate on which the solder resist layers 70 are formed is immersed in etchant of sulfuric acid—hydrogen peroxide, cuprous chloride or ferrous chloride, scraping off the surface layers of the conductor circuits 158 and the vias 160 exposed from the respective openings 71U and 71D of the solder resist layers 70 (see FIG. 23(A)).

(16) The substrate on which the solder resist layers 70 are formed is immersed in acid such as sulfuric acid or hydrochloric acid, thereby adjusting the surface potentials of the conductor circuits 158 and the vias 160 exposed from the respective openings 71U and 71D of the solder resist layers 70 and scraping oft the oxide films (see FIG. 23(B)).

(17) The substrate is immersed in a tin substitutional plating solution having the following compositions to form tin layers 74 having a thickness of 0.6 μm on the surfaces of the conductor circuits 158 and the vias 160 exposed from the respective openings 71U and 71D of the solder resist layers 70, thereby forming solder pads 73 (see FIG. 23(C) and FIG. 26(B) which is an enlarged view of the region surrounded by the ellipse C shown in FIG. 23(C)). The opening diameter ranges from 600 to 1000 μm. While a tin fluoroborate compound is used for the tin substitutional plating, tin chloride can be used instead of this compound. In the second embodiment, the conductor circuits 158 and the vias 160 which mainly comprise of copper are etched and activated with acid, so that the monolayer metal films 74 comprising of tin can be formed by the substitutional plating. In addition, monolayer metals are formed on solder bump formation portions and external terminal portions, respectively.

Tin Substitutional Plating Solution

| | |
|---|---|
| Thio urea | 20 g/l |
| Tin fluoroborate (concentration of 35% by volume) | 80 ml/l |
| Stabilizer (PEG) | 5 ml/l |
| Temperature | 60° C. |
| Immersion time | 10 minutes |

(18) Thereafter, a solder paste made of eutectic metals of Sn/Pb, Sn/Sb, Sn/Ag, Sn/Ag/Cu or Sn/Cu is printed on each upper opening portion 71U of the solder resist layers 70 on the surface of the substrate on which the IC chip is mounted. In addition, a solder paste made of eutectic metals of Sn/Pb, Sn/Sb, Sn/Ag or Sn/Ag/Cu is printed, as the conductive adhesive 75, in each lower opening portion 71D. Next, the conductive connection pins 98 are attached to an appropriate pin holding device and supported by the device, and the fixed portions 98A of the respective conductive connection pins 98 are abutted on the conductive adhesives 75 in the opening portions 71D. Reflow is then conducted, thereby forming the solder bumps 76 on the upper openings 71, and fixing the conductive connection pins 98 to the conductive adhesives 75 through the lower openings 71D (see FIG. 24). In the second embodiment, the solder bumps 76 and the conductive adhesives 75 are made of eutectic metals of Sn/Pb, Sn/Sb, Sn/Ag, Sn/Ag/Cu or Sn/Cu and contain tin, thus ensuring high adhesion to the solder pads 73 each including the tin layer 74. Each conductive connection pin 98 can be attached by shaping the conductive adhesive 75 into a ball form or the like and inputting the adhesive 75 in the opening portion 71D, or by bonding the conductive adhesive 75 to the fixed portion 98 to attach the conductive connection pin 98 and then conducting reflow. The solders may be either the same or different. For example, the melting point of the conductive adhesive for the solder bumps is preferably higher than that of the conductive adhesive for the conductive connection pins. This can avoid trouble at the time of mounting the conductive connection pins.

Next, the IC chip 90 is mounted on the printed wiring board 10 so that the solder pads 92 of the IC chip 90 correspond to the respective solder bumps 76 of the upper openings 71U of the print wiring board 10, and reflow is conducted, thereby attaching the IC chip 90 onto the printed wiring board 10 (see FIG. 25)

In the embodiment stated above, cycloolefin-based resin is used for the interlayer resin insulating layers 50 and 150. Alternatively, epoxy-based resin can be used in place of the cycloolefin-based resin similarly to the first embodiment.

[Third Modification]

Figure 32:
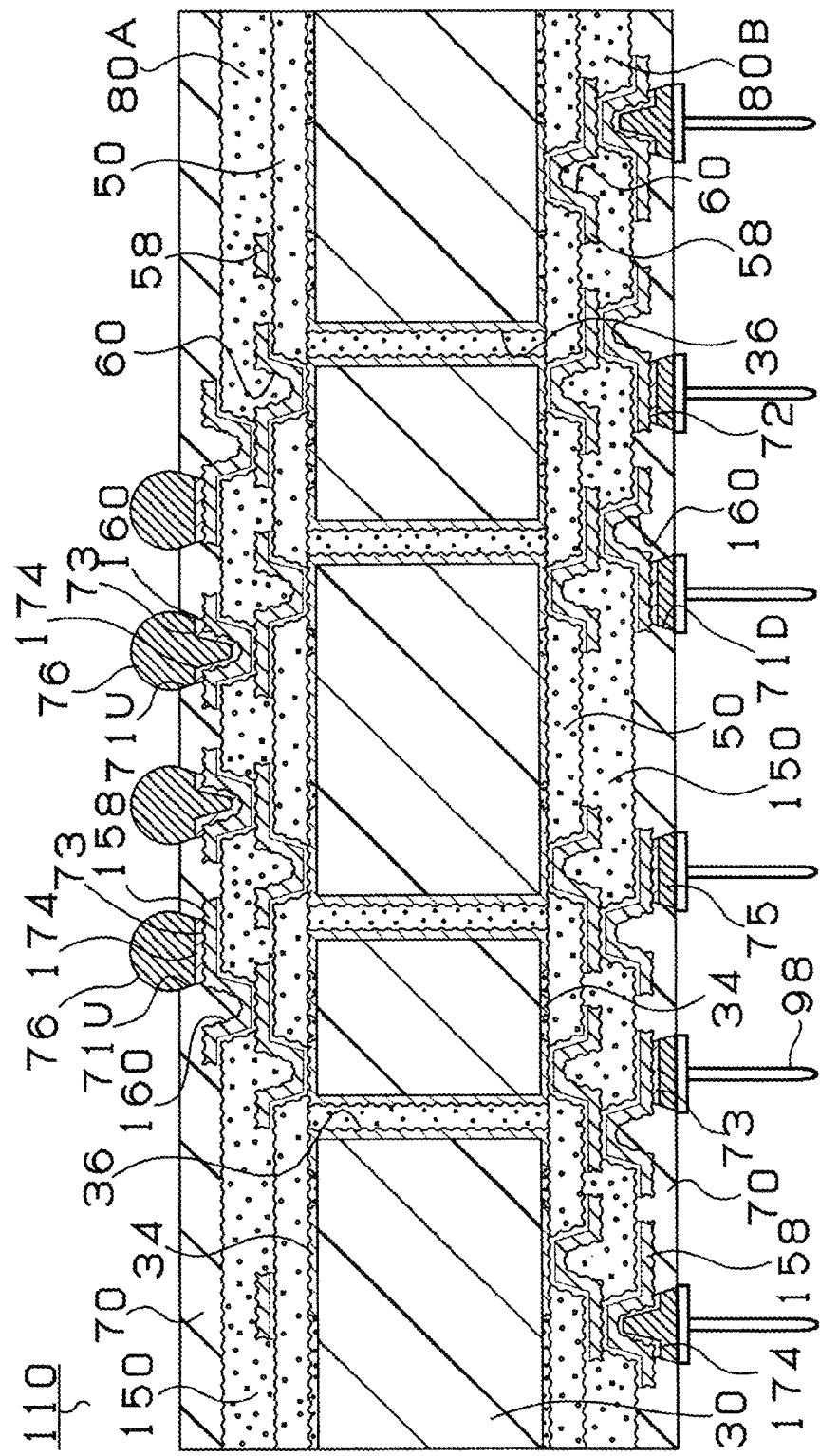
FIG. 32 is a cross-sectional view of the printed wiring board according to the third modification of the present invention.

A printed wiring board 110 according to the third modification of the present invention will next be described with reference to FIG. 32. In the second embodiment stated above, each solder pad 73 comprises of the tin layer 74 formed on the conductor circuit 158 or via 160. In the third modification, by contrast, the solder pad 73 comprises of a gold layer 174 formed on the conductor circuit 158 or via 160. In the third modification, noble metal is used to coat the conductor circuits 158 and the vias 160, thus ensuring that the solder pads 73 have excellent corrosion resistance. In addition, the use of gold lower in resistance than tin can further increase high frequency characteristic, as compared with the first embodiment. The thickness of the gold layer 174 is desirably 0.01 to 3 μm. If the thickness is less than 0.01 μm, portions which cannot completely cover the conductor circuit 158 or via 160 are generated, adversely influencing strength and corrosion resistance. Conversely, if the thickness exceeds 3 μm, the corrosion resistance is not improved, peeling occurs in the films, thus deteriorating the strength. In addition, the gold layers become too expensive, adversely influencing cost-effectiveness. The thickness of the gold layer 174 is preferably 0.05 to 2 μm. More preferably, the thickness is in a range of 0.1 to 1 μm. In this range, no problem occurs even if there is a fluctuation in thickness.

A. an interlayer resin insulating layer resin film, and B. resin filler used in a method for manufacturing the printed wiring board according to the third modification of the present invention are the same as those of the first modification.

A method for manufacturing the printed wiring board stated above with reference to FIG. 32 will next be described with reference to FIGS. 27 to 31.

(1) A copper-clad laminate 30A having copper foils 32 of 18 μm laminated on the both surfaces of the substrate 30 made of glass epoxy resin or BT (Bsmaleimide-Triazine) resin whose thickness is 0.8 mm, respectively, is used as a starting material (see FIG. 27(A)). 10 to 40% of inorganic particles such as silica are mixed into the resin. This copper-clad laminate 30A is drilled, subjected to an electroless plating treatment, and etched into a pattern, thereby forming lower layer conductor circuits 34 and through holes 36 on the both surfaces of the substrate 30, respectively (see FIG. 27(B)).

(2) After washing and drying the substrate 30 having the through holes 36 and the lower layer conductor circuits 34 formed thereon, an oxidization treatment using an aqueous solution containing NaOH (10 g/l), NaClO$_2$ (40 g/l) and Na$_3$PO$_4$ (6 g/l) as an oxidization bath and a reduction treatment using an aqueous solution containing NaOH (10 g/l) and NaBH$_4$ (6 g/l) as a reduction batch are conducted to the substrate 30, thereby forming roughened surfaces 34α on the entire surfaces of the respective lower layer conductor circuits 34 including the through holes 36 (see FIG. 27(C)).

(3) After preparing the resin filler described in B above, layers of the resin filler 40 are formed on the portions in which the lower conductor circuits 34 are not formed on one surface of the substrate 30 (see FIG. 27(D)). Namely, using a squeezer, the resin filler 40 is forced into the through holes 36, and then dried at 100° C. for 20 minutes. Next, a mask having openings in portions corresponding to the lower layer conductor circuit 34 non-formation regions is put on the substrate 30, layers of the resin filler 40 are formed in the concave lower layer conductor circuit 34 non-formation regions are formed using the squeezer, and dried at 100° C. for 20 minutes. Thereafter, one surface of the substrate 30 is polished by belt sander polishing using abrasive paper of #600 (manufactured by Sankyo Rikagaku Co.) so as not to leave the resin filler 40 on the surfaces of the lower layer conductor circuits 34 and those of the lands 36a of the through holes 36, and buffed to remove scratches caused by the belt sander polishing. A series of these polishing treatments are similarly conducted to the other surface of the substrate 30. The resin filler 40 is then heated at 100° C. for 1 hour and at 150° C. for 1 hour and hardened (see FIG. 28(A)).

(4) After washing and acid degreasing the substrate 30, etchant is sprayed onto the both surfaces of the substrate 30 by the spray and the surfaces of the lower layer conductor circuits 34 and those of the lands 36a of the through holes 36 are subjected to light etching, thereby forming roughened surfaces 34β on the entire surfaces of the respective lower layer conductor circuits (see FIG. 28(B)).

As the etchant, etchant (manufactured by Mech, Mech-Etch Bond) comprising of 10 parts by weight of an imidazole copper (II) complex, 7 parts by weight of glycolic acid and 5 parts by weight of potassium chloride is used.

(5) Interlayer resin insulating layer resin films slightly larger than the substrate 30 manufactured in A are put on the both surface of the substrate 30, respectively, temporarily press-fitted at pressure of 4 kgf/cm², a temperature of 80° C. and press-fit time of 10 seconds and cut, and bonded using a vacuum laminator by the following method, thereby forming interlayer resin insulating layers 50 (see FIG. 28(C)). Namely, the interlayer resin insulating layer resin films are actually press-fitted onto the substrate 30 at vacuum of 0.5 Torr, pressure of 4 kgf/cm², a temperature of 80° C. and press-fit time of 60 seconds, and then heated and hardened at 170° c. for 30 minutes.

(6) A mask 49 having holes 49a formed therein is mounted on the substrate, and openings 51 for vias are formed in the interlayer resin insulating film 50 by a carbonic acid gas laser (see FIG. 28(D)). The openings 51 can be formed by an exposure-development treatment instead of the laser.

(7) The substrate 30 having the via openings 51 formed therein is immersed in an 80° C.-solution containing 60 g/l of permanganic acid for 10 minutes to melt and remove epoxy resin particles existing on the surfaces of the interlayer resin insulating layers 50, thereby forming roughened surfaces 50α on the surfaces of the respective interlayer resin insulating layers 50 including the inner walls of the via openings 51 (see FIG. 29(A)).

(8) Next, the substrate 30 completed with the above-stated treatments is immersed in neutralizer (manufactured by Shipley) and then washed. Further, a palladium catalyst is added to the surface of the roughened substrate 30 (a roughening depth of 3 μm), thereby attaching catalyst nuclei to the surfaces of the interlayer resin insulating layers 50 and the inner wall surfaces of the large via openings 51.

(9) The substrate 30 is immersed in an electroless copper plating aqueous solution having the same compositions as those of the first modification, and electroless copper plated films 53 having a thickness of 0.6 to 3.0 μm are formed on the entire roughened surfaces 50α (see FIG. 29(B)).

(10) After forming resists 54 of a predetermined pattern on the substrate 30, electroplating is conducted under the same conditions as those of the first modification to form electroplated films 56 (see FIG. 29(C)).

(11) After peeling off the resists 54, the electroless plated films 53 under the resists 54 are etched away, thereby forming conductor circuits 58 and vias 60 each comprising of the electroless plated film 53 and the electroplated film 56 (see FIG. 29(D)). Thereafter, the etchant is sprayed onto the both surfaces of the substrate 30 and the surfaces of the conductor circuits 58 and vias 60 are etched, thereby forming roughened layers 58α on the respective surfaces (see FIG. 30(A)).

(12) The steps (5) to (11) stated above are repeated, thereby forming interlayer resin insulating layers 150, conductor circuits 158 and vias 160. The etchant is sprayed on the both surfaces of the substrate and the surfaces of the conductor circuits 158 and vias 160 are etched, thereby forming roughened layers 158α on the respective entire surfaces (see FIG. 30(B)). As the etchant, a mixture of 10 parts by weight of an imidazole copper (II) complex, 7 parts by weight of glycolic acid, 5 parts by weight of potassium chloride and 78 parts by weight of ion exchanged water is used.

(13) The solder resist composition (organic resin insulating material) is obtained similarly to the first modification.

(14) The solder resist compositions prepared in (13) are coated on the both surfaces of the multi-layer wiring substrate substrate 30 each by a thickness of 20 μm, respectively, and dried for 20 minutes at 70° C. and for 30 minutes at 70° C. Thereafter, a photomask on which a pattern of solder resist opening portions are drawn and which has a thickness of 5 mm, is fixedly attached to each solder resist composition, exposed with ultraviolet rays of 1000 mJ/cm², and developed with DMTG solution, thereby forming opening portions 71U and 71D.

Further, heat treatments are conducted for 1 hour at 80° C., for 1 hour at 100° C., for 1 hour at 120° C., and for 3 hours at 150° C., respectively, to harden the solder resist layer's compositions, thus forming solder resist layers 70 each having the opening portions 71U and 71D and a thickness of 20 μm (see FIG. 30(C)). As the solder resist compositions, commercially available solder resist compositions can also be used. The opening diameter is formed in the range of 600 to 1000 μm.

(15) The substrate having the solder resist layers (organic resin insulating layers) 70 formed thereon is degreased by alkali degreasing. While the alkali degreasing is conducted, neutral degreasing or acid degreasing can be conducted.

(16) The substrate on which the solder resist layers 70 are formed is immersed in etchant of sulfuric acid—hydrogen peroxide, cuprous chloride or ferrous chloride, scraping off the surface layers of the conductor circuits 158 and the vias 160 (see FIG. 31(A)).

(17) The substrate on which the solder resist layers 70 are formed is immersed in acid such as sulfuric acid or hydrochloric acid, thereby adjusting the surface potentials of the conductor circuits 158 and the vias 160 and scraping off the oxide films (see FIG. 31(B)).

(18) The substrate is immersed in a gold substitutional plating solution having the similar compositions to the first modification to form gold layers 174 having a thickness of 0.03 to 0.05 µm on the surfaces of the conductor circuits 158 and the vias 160 exposed from the respective openings 71U and 71D of the solder resist, thereby forming solder pads 73 (see FIG. 31(C)). In the third modification, gold cyanide is used for the gold substitutional plating solution. Metal layers are formed in solder formation portions and external terminal formation portions, respectively.

Gold Substitutional Plating Solution

| | |
|---|---|
| Potassium cyanide | 6 g/l |
| Tetrahydroborate | 40 ml/l |
| Temperature | 70° C. |
| Immersion time | 3 minutes |

(18) Thereafter, a solder paste made of eutectic metals of Sn/Pb, Sn/Sb, Sn/Ag, Sn/Ag/Cu or Sn/Cu is printed on each opening portion 71U on the surface of the substrate on which the IC chip is mounted. In addition, a solder paste made of eutectic metals of Sn/Pb, Sn/Sb, Sn/Ag, Sn/Ag/Cu or Sn/Cu is printed, as the conductive adhesive 75, in each opening portion 71D on the other surface thereof. Next, the conductive connection pins 98 are attached to an appropriate pin holding device and supported by the device, and the fixed portions 98A of the respective conductive connection pins 98 are abutted on the conductive adhesives 75 in the opening portions 71D. Reflow is then conducted, thereby forming the solder bumps 76 on the upper openings 71U, and fixing the conductive connection pins 98 to the conductive adhesives 75 through the lower openings 71D (see FIG. 32). The solders may be either the same or different. For example, the melting point of the conductive adhesive for the solder bumps is preferably higher than that of the conductive adhesive for the conductive connection pins. This can avoid trouble at the time of mounting the conductive connection pins.

In the third modification, since the noble metal constituting the gold layer 174 is soft gold, it is possible to form single-layer gold films 174 on the conductor circuits 158 and the vias 160 without making nickel intervene and diffusing the gold layers to copper. Namely, according to the prior art, hard gold which enables wire bonding to gold wires is continuously used as gold at the time of establishing connection by the conductive connection pins. Since the hard gold is diffused into the conductor circuits made of copper by electroless plating, films cannot be formed unless the nickel layers intervene. In the third modification, by contrast, it is possible to directly form films on the conductor circuits 158 made of copper and the vias 160. While gold is used herein, platinum or palladium can be used.

[Fourth Modification]

A printed wiring board 210 according to the fourth modification of the present invention will be described with reference to FIG. 33. In the second embodiment stated above, each solder pad 73 comprises of the tin layer 74 formed on the conductor circuit 158 and the via 160. In the fourth modification, by contrast, the solder pad 73 comprises of a silver layer 274 formed on the conductor circuit 158 and the via 160. In the fourth modification, noble metal is used to cover the conductor circuits 158 and the vias 160, thus ensuring the good corrosion resistance of the solder pads 73. In addition, since silver having the lowest resistance is used, it is possible to further improve the high frequency characteristic, as compared with the first embodiment and the third modification.

Manufacturing steps of the printed wiring board in the fourth modification will be described. Manufacturing steps (1) to (17) of this fourth modification are equal to those of the third modification described above with reference to FIGS. 27 to 31. Therefore, step (18) and the following will be described.

Figure 33:
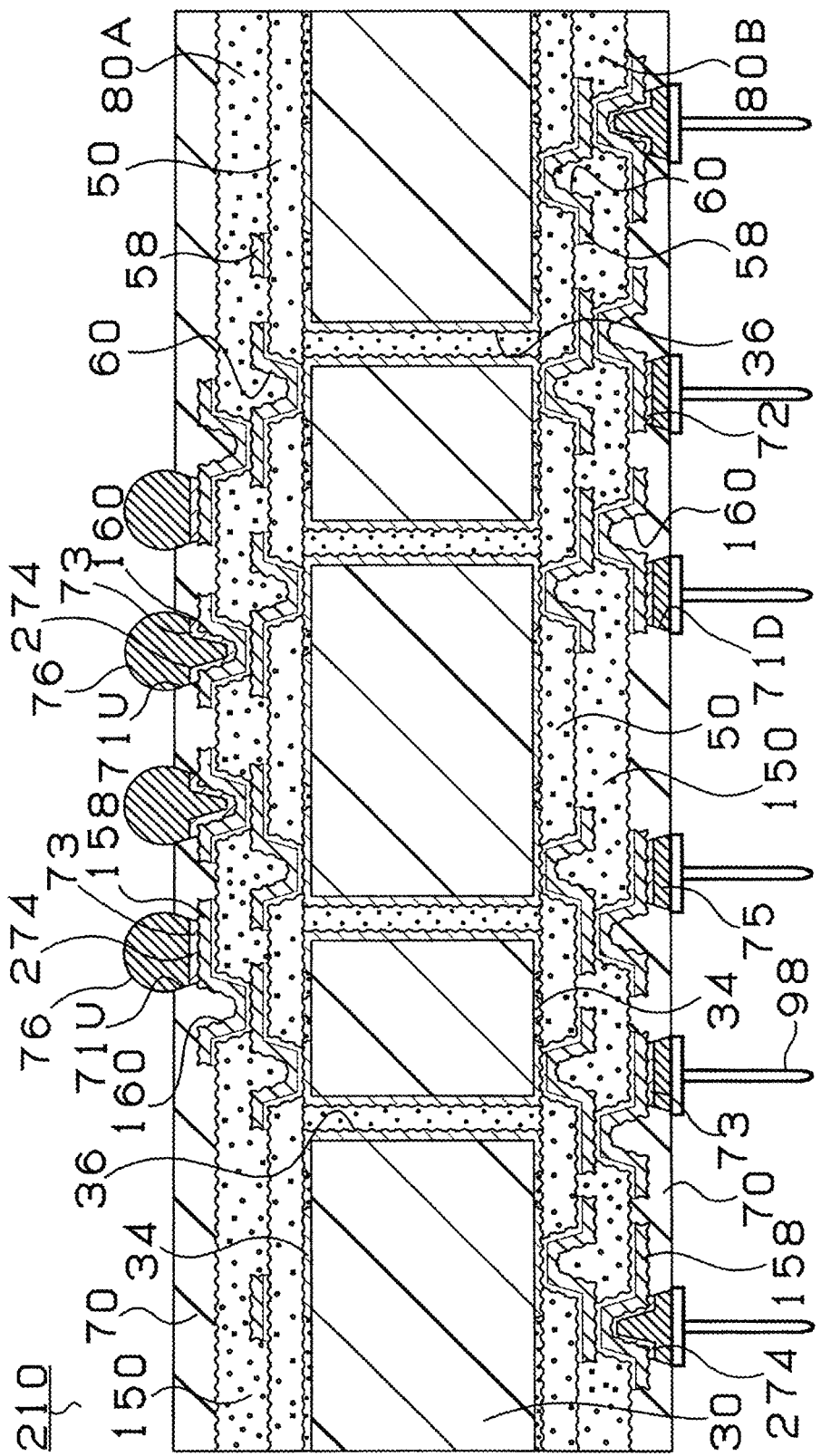
FIG. 33 is a cross-sectional view of a printed wiring board according to the fourth modification of the present invention.

(18) The substrate is immersed in a silver substitutional plating solution having the following compositions to form silver layers 274 having a thickness of 0.07 to 0.11 µm on the surfaces of the conductor circuits 158 and the vias 160 exposed from the respective openings 71U and 71D of the solder resists, thereby forming solder pads 73 (see FIG. 33). In the fourth modification, silver nitrate is used for the silver substitutional plating solution. The opening diameter is between 600 to 1000 µm. Silver layers are formed in solder formation portions and external terminal formation portions, respectively.

Silver Substitutional Plating Solution

| | |
|---|---|
| Silver nitrate | 8 g/l |
| Ammonium compound | 30 ml/l |
| Sodium nitrate · 5 hydrate | 60 ml/l |
| Temperature | 70° C. |
| Immersion time | 5 minutes |

(19) Thereafter, a treatment for washing away silver adhering to the surfaces of the solder resist layers 70 is conducted.

(20) A solder paste made of eutectic metals of Sn/Ag, Sn/Ag/Cu or Sn/Cu is printed on each opening portion 71U of the solder resist layers 70 on the surface of the substrate on which the IC chip is mounted. In addition, a solder paste made of eutectic metals of Sn/Ag or Sn/Ag/Cu is printed, as the conductive adhesive 75, in each lower opening portion 71D. Next, the conductive connection pins 98 are attached to an appropriate pin holding device and supported by the device, and the fixed portions 98A of the respective conductive connection pins 98 are abutted on the conductive adhesives 75 in the opening portions 71D. Reflow is then conducted at 200 to 250° C., thereby forming the solder bumps 76 on the upper openings 71, and fixing the conductive connection pins 98 to the conductive adhesives 75 through the lower openings 71D (see FIG. 33).

Further, in the fourth modification, the solder bumps 76 and the conductive adhesives 75 are made of eutectic metals of Sn/Ag, Sn/Ag/Cu or Sn/Cn and contain silver, thus ensuring high adhesion to the solder pads 73 each including the silver layer 274. The fourth modification is congenital to the solders which do not contain lead (Sn/Ag and Sn/Ag/Cu), so that these solders can be suitably used in this modification.

In the second embodiment, the third modification, and the fourth modification stated above, the metal layer of each solder pad is formed by substitutional plating. Alternatively, it can be formed by electroless plating with catalyst intervening. The electroless plating is less expensive. However, without the catalyst, non-reaction tends to occur. Besides, it is difficult to control film thickness.

As the second comparison, a gold layer (thickness of 0.3 µm) is formed on a nickel layer (thickness of 5 µm) as a metal pad for each of the exposed conductor layers almost similar to those in the second embodiment.

[Conductive Connection Pin Test]

The tensile strength of the conductive connection pins in the second embodiment, the third modification, the fourth modification, and the second comparison are measured before and after reliability tests, respectively. Dummy IC's are packaged and the voltage drop quantity of power supplies are determined. The results are compared as shown in FIG. 36 as a table. In addition, FIG. 35(A) shows the correlation between the thickness and strength for gold. At a thickness of about 0.03 μm, the strength nears 12.0 N/pin. If the thickness exceeds 3 μm, peeling occurs in the films and strength deterioration starts. The same trend is seen for the other metals (silver, tin, platinum and palladium).

The tensile strength is measured when directly pinching the tip end portion of each conductive connection pin, stretching the pin in a vertical direction to break the pin.

As a result, in the embodiment and the modifications, no problems occur to the tensile strength, operation test and the voltage drop quantity at the test, irrespective of the compositions of the solder. In addition, a voltage drop of 0.1(V) or more at which malfunction possibly occurs does not appear, so that it is determined that no malfunction occurs.

Further, the drop quantity of the tensile strength after the reliability test is 2 to 4%. Therefore, no problem occurs in respect of the strength.

In the second comparison, by contrast, the tensile strength is lower than that in the embodiment and the drop quantity after the reliability test is about 12%. This shows that there is a problem with the adhesion strength of the adhesion of a pin to a solder pad. The voltage drop quantity sometimes exceeds 0.1(V), thus often causing malfunction.

As described so far, according to the present invention, the single metal layer is provided on each conductor circuit and the solder pad is formed. Due to this, a signal propagation rate can be increased, as compared with the printed wiring board of the prior art on which the two metal layers are formed. In addition, due to lack of the nickel layers, manufacturing cost can be decreased and electric characteristics can be enhanced.

The invention claimed is:

1. A printed wiring board, comprising:
   an interlayer resin insulating layer provided on a substrate;
   a first via hole formed in the interlayer resin insulating layer and having a via conductor layer therein;
   a second via hole formed in the interlayer resin insulating layer and having a via conductor layer therein;
   a conductor circuit provided on the interlayer resin insulating layer;
   a solder resist layer provided on the conductor circuit, the via conductor layers and on the interlayer resin insulating layer, the solder resist layer having an opening which exposes only an exposed portion of the conductor circuit, and another opening which exposes an exposed portion of the via conductor;
   a single metal layer of tin provided on and in direct contact with said exposed portion of the conductor circuit, and a conductive adhesive provided on and in direct contact with the single metal layer and configured to adhere the single metal layer to an electrode of an integrated circuit to be connected to the printed wiring board; and
   another single metal layer of tin provided in direct contact with said exposed portion of the via conductor, and a conductive adhesive provided on and in direct contact with the another single metal layer and configured to adhere the single metal layer to another electrode of the integrated circuit to be connected to the printed wiring board.

2. The printed wiring board according to claim 1, wherein said single metal layer has a thickness of 0.01 to 3 μm.

3. The printed wiring board according to claim 2, further comprising a roughened layer formed on a surface of said conductor circuit.

4. The printed wiring board according to claim 2, wherein said conductive adhesive is eutectic metals consisting of one of Sn/Pb, Sn/Sb, Sn/Ag, and Sn/Ag/Cu.

5. The printed wiring board according to claim 2, wherein:
   said conductive adhesive is eutectic metals consisting of one of Sn/Pb, Sn/Sb, Sn/Ag, and Sn/Ag/Cu, and
   said metal layer comprises tin.

6. The printed wiring board according to claim 1, further comprising a roughened layer formed on a surface of said conductor circuit.

7. The printed wiring board according to claim 6, wherein said conductive adhesive is eutectic metals consisting of one of Sn/Pb, Sn/Sb, Sn/Ag, and Sn/Ag/Cu.

8. The printed wiring board according to claim 6, wherein:
   said conductive adhesive is eutectic metals consisting of one of Sn/Pb, Sn/Sb, Sn/Ag, and Sn/Ag/Cu, and
   said single metal layer comprises tin.

9. The printed wiring board according to claim 1, wherein said conductive adhesive is eutectic metals consisting of one of Sn/Pb, Sn/Sb, Sn/Ag, and Sn/Ag/Cu.

10. The printed wiring board according to claim 9, wherein:
    said conductive adhesive is eutectic metals consisting of one of Sn/Pb, Sn/Sb, Sn/Ag, and Sn/Ag/Cu, and
    said single metal layer comprises tin.

11. The printed wiring board according to claim 1, wherein said single metal layer has a thickness of 0.05 to 1 μm.

12. The printed wiring board according to claim 1, wherein said single metal layer has a thickness of 0.1 to 0.5 μm.

13. The printed wiring board according to claim 1, further comprising multiple exposed portions of the conductive circuit; and
    multiple conductive adhesive structures corresponding to the multiple exposed portions respectively, wherein the exposed portions and conductive adhesive structures are arranged in a ball grid array configuration corresponding to a configuration of electrodes of the integrated circuit.

14. The printed wiring board according to claim 13, wherein the multiple adhesive structures each comprise a solder bump.

* * * * *